(12) United States Patent
Harazaki

(10) Patent No.: US 7,735,053 B2
(45) Date of Patent: Jun. 8, 2010

(54) CORRECTION METHOD AND CORRECTION SYSTEM FOR DESIGN DATA OR MASK DATA, VALIDATION METHOD AND VALIDATION SYSTEM FOR DESIGN DATA OR MASK DATA, YIELD ESTIMATION METHOD FOR SEMICONDUCTOR INTEGRATED CIRCUIT, METHOD FOR IMPROVING DESIGN RULE, MASK PRODUCTION METHOD, AND SEMICONDUCTOR INTEGRATED CIRCUIT PRODUCTION METHOD

(75) Inventor: Katsuhiko Harazaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 404 days.

(21) Appl. No.: 11/819,397

(22) Filed: Jun. 27, 2007

(65) Prior Publication Data
US 2008/0003510 A1 Jan. 3, 2008

(30) Foreign Application Priority Data
Jun. 29, 2006 (JP) ............................. 2006-179489
Jun. 19, 2007 (JP) ............................. 2007-161906

(51) Int. Cl.
*G06F 17/50* (2006.01)
(52) U.S. Cl. ............................. 716/19; 716/20; 716/21
(58) Field of Classification Search .............. 716/19–21
See application file for complete search history.

(56) References Cited

U.S. PATENT DOCUMENTS

| | | | |
|---|---|---|---|
| 5,896,300 A | 4/1999 | Raghavan et al. | |
| 6,128,067 A * | 10/2000 | Hashimoto | 355/52 |
| 6,249,900 B1 | 6/2001 | Kotani et al. | |
| 6,286,126 B1 | 9/2001 | Raghavan et al. | |
| 6,403,477 B1 | 6/2002 | Tounai | |
| 6,617,083 B2 * | 9/2003 | Usui et al. | 430/5 |
| 2002/0042007 A1 | 4/2002 | Miyazaki et al. | |
| 2002/0100006 A1 | 7/2002 | Kosugi | |
| 2003/0115569 A1 | 6/2003 | Ikeuchi | |
| 2003/0149955 A1 | 8/2003 | Ohnuma | |
| 2004/0115541 A1 | 6/2004 | Yamaguchi et al. | |
| 2005/0066300 A1 | 3/2005 | Zach | |
| 2005/0089768 A1 | 4/2005 | Tanaka et al. | |

(Continued)

FOREIGN PATENT DOCUMENTS

JP 8-139379 A 5/1996

(Continued)

OTHER PUBLICATIONS

DFM-Beginning of Top-to-bottom Rethinking of the Cost of Semiconductors Nikkei Microdevices, Nikkei BP, May 2005 Issue, p. 25 to 41 (published on May 1, 2005).

(Continued)

*Primary Examiner*—Jack Chiang
*Assistant Examiner*—Brandon W Bowers
(74) *Attorney, Agent, or Firm*—Nixon & Vanderhye P.C.

(57) ABSTRACT

A validation/correction method is provided for design data or mask data by which a pattern which becomes critical in a process is extracted in advance so that the pattern can be corrected. Consequently, the process spec is achieved in a short period of time after OPC or process proximity effect correction (PPC).

20 Claims, 35 Drawing Sheets

U.S. PATENT DOCUMENTS

| | | |
|---|---|---|
| 2005/0089769 A1 | 4/2005 | Tanaka et al. |
| 2005/0134866 A1 | 6/2005 | Kyoh et al. |
| 2005/0153217 A1 | 7/2005 | Izuha et al. |
| 2005/0166172 A1* | 7/2005 | Kawamura et al. ............ 716/19 |
| 2005/0204327 A1 | 9/2005 | Mukai et al. |
| 2006/0031809 A1 | 2/2006 | Zach |
| 2007/0219736 A1* | 9/2007 | Okita .......................... 702/81 |
| 2008/0022255 A1 | 1/2008 | Zach |
| 2008/0072208 A1 | 3/2008 | Yamaguchi et al. |
| 2008/0086715 A1 | 4/2008 | Zach |

FOREIGN PATENT DOCUMENTS

| | | |
|---|---|---|
| JP | 9-64187 A | 3/1997 |
| JP | 10-207937 A | 8/1998 |
| JP | 11-126824 A | 5/1999 |
| JP | 11-274055 A | 10/1999 |
| JP | 2001-125251 A | 5/2001 |
| JP | 2002-118049 A | 4/2002 |
| JP | 2002-203907 A | 7/2002 |
| JP | 2002-215710 A | 8/2002 |
| JP | 2002-333700 A | 11/2002 |
| JP | 2003-57801 | 2/2003 |
| JP | 2003-162041 A | 6/2003 |
| JP | 2004-108820 A | 4/2004 |
| JP | 2004-157160 | 6/2004 |
| JP | 2004-302263 | 10/2004 |
| JP | 2004-317691 A | 11/2004 |
| JP | 2004-354919 | 12/2004 |
| JP | 2005-92212 A | 4/2005 |
| JP | 2005-115110 | 4/2005 |
| JP | 2005-121943 | 5/2005 |
| JP | 2005-134520 | 5/2005 |
| JP | 2005-181612 A | 7/2005 |
| JP | 2005-258080 A | 9/2005 |
| WO | 01/35718 A2 | 5/2001 |

OTHER PUBLICATIONS

T. Koike et al., "Semiconductor Element Design Simulator", Heisei Maruzen Co., Ltd. Aug. 1994, pp. 158-169 and 210-211.

J. Kim et al., "Model Based Full-chip Verification for 65nm Lithograph Process Development", SPIE BACUS Symposium, Yokohama, vol. 5853-42, Apr. 2005.

A. Sezginer et al., "Sequential PPC and process-window-aware mask layout synthesis", Proceedings of SPIE, vol. 6156,615613 (Mar. 13, 2006) (This corresponds to [A. Sezginer et al., "Process-window-aware-RET and OPC", SPIE Symposium, San Jose, vol. 6156-22, No. 615613 Feb. 2006] which is cited in Specification.

* cited by examiner

FIG. 5
PHOTO EVALUATION RESULT OF CRITICAL PATTERN
| PATTERN TYPE | H-TYPE | MICRO PROJECTION TYPE | CRANK-TYPE |
|---|---|---|---|
|  | 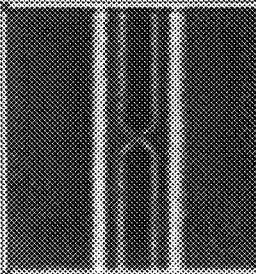 | 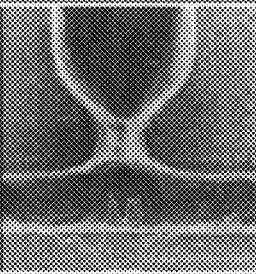 | 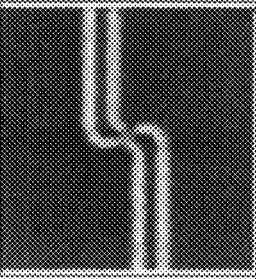 |
| RESIST BOTTOM W 100nm~ | 100nm (DRAWING VALUE) | 137nm (RESIST TOP ~62nm) | 110nm (DRAWING VALUE) |
| EVALUATION RESULT | NG | FILM DEPRESSION, NG | NG |

TYPE 10

TYPE 9

TYPE 8

TYPE 7

TYPE 6

TYPE 5

TYPE 4

TYPE 3

TYPE 2

TYPE 1

FIG. 10A
(a)
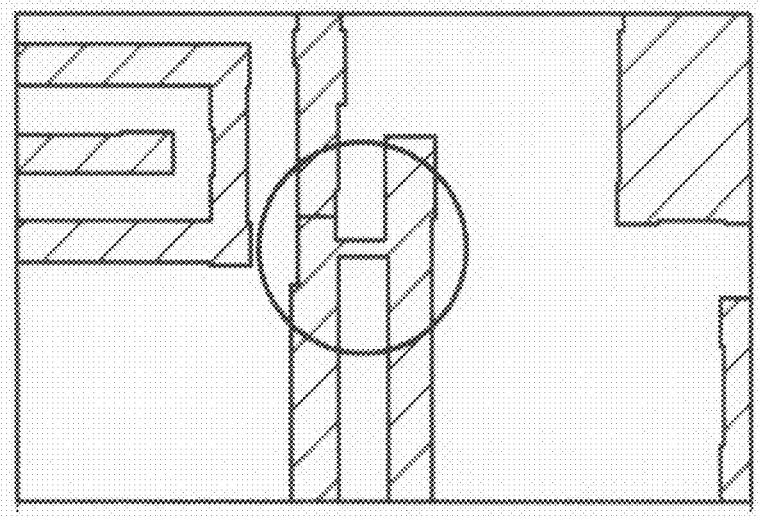
(b)
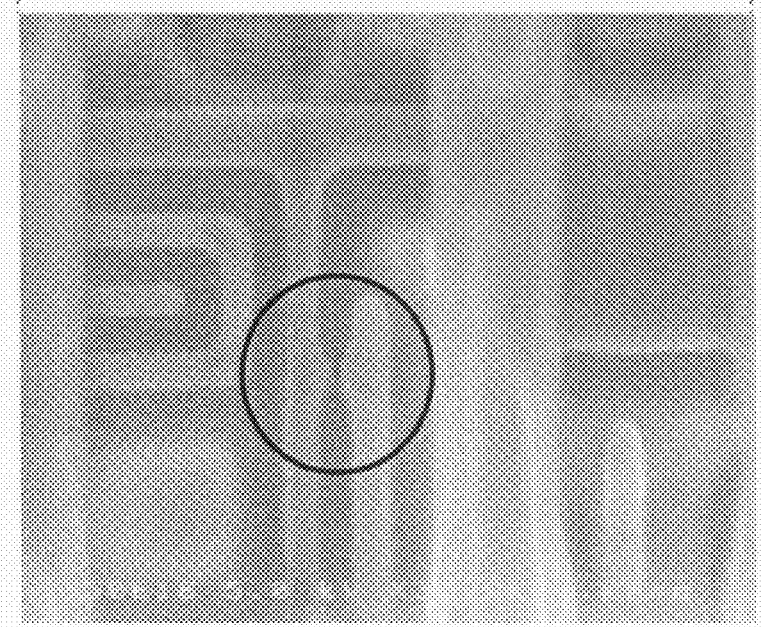

BEST FOCUS

Dose = +4.5% $w_1$ = 145nm
Best Dose = $w_1$ = 170nm
Dose = −4.5% $w_1$ = 197nm

FOCUS = +0.23μm

Dose = +4.5% $w_1$ = 152nm
Best Dose = $w_1$ = 178nm
Dose = −4.5% $w_1$ = 205nm

| W (SIZE AT 100%) | 54 | 62 | 80 | 100 | 150 | 200 | 300 |
|---|---|---|---|---|---|---|---|
| sim | 163 | 180 | 210 | 232 | 270 | 301 | 358 |

(UNIT = nm)

| L (SIZE AT 100%) | 182 | 200 | 210 | 220 | 230 | 240 | 250 |
|---|---|---|---|---|---|---|---|
| sim W=62 | 180 | 135 | 111 | 79 | 37 | 0 | 0 |
| sim W=100 | 232 | 206 | 192 | 181 | 169 | 158 | 148 |

(UNIT = nm)

FIG. 14
LINE WIDTH/LENGTH RULE
A PATTERN IN WHICH LINE WIDTH w ($w_1$, $w_2$, $w_3$, $w_4$, OR $w_5$) IS CONSTANT AND LENGTH OF STRAIGHT LINE SECTION IS l ($l_1$, $l_2$, $l_3$, $l_4$, OR $l_5$) SATISFIES:
L≧280nm − a × ES(lij)   or   W≧240nm − 2 × ES(wij)
(a)
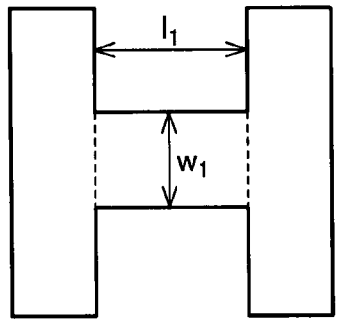
a=2
(b)
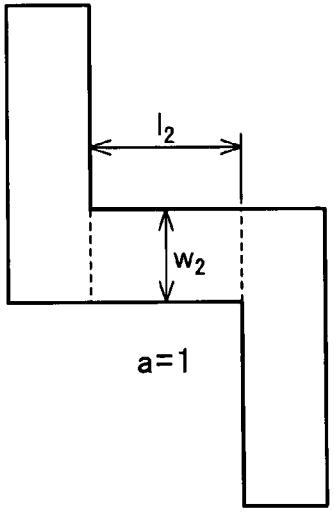
a=1
(c)
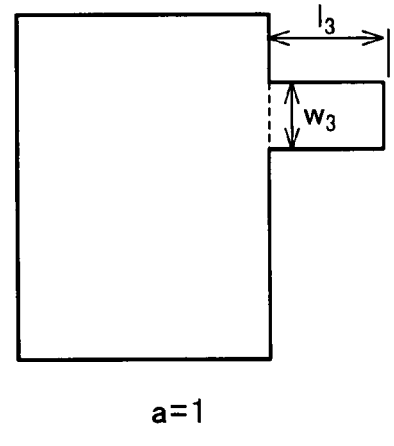
a=1
(d)
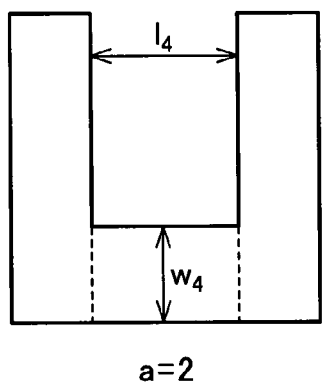
a=2
(e)
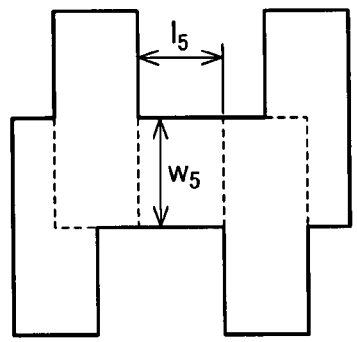
a=2

MICRO LEVEL-DIFFERENCE RULE

AT LEAST ONE OF THE TWO SIDES "Lside 1" AND "Lside 2" CONNECTED TO AN ARBITRARY APEX "Apex" SATISFIES:
$Lside1 \geq 180nm - ES(L_{sn})$ or $Lside2 \geq 180nm - ES(L_{sn})$ FIG. 16 (a)  CONCRETE EXAMPLE OF MICRO PROJECTION PATTERN
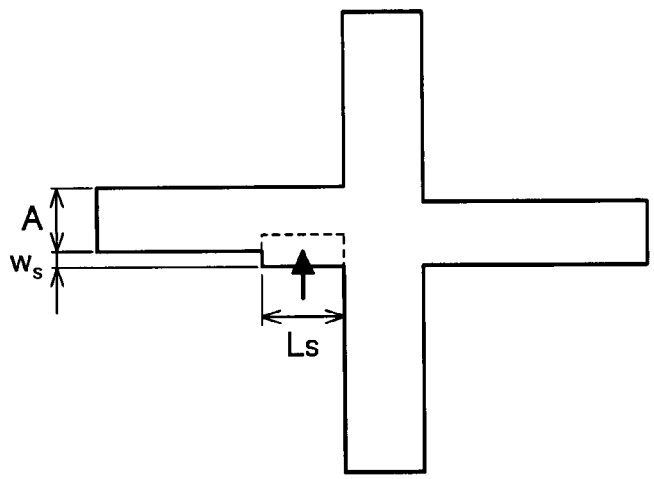
FIG. 16 (b)  CONCRETE EXAMPLE OF MICRO LEVEL-DIFFERENCE PATTERN
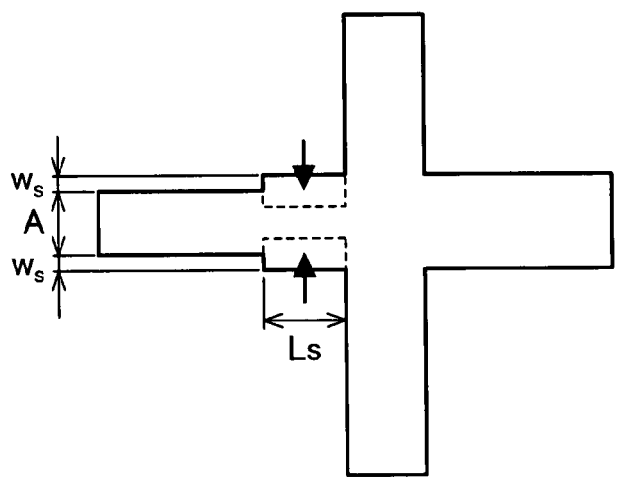
FIG. 16 (c)  CONCRETE EXAMPLE OF MICRO LEVEL-DIFFERENCE PATTERN
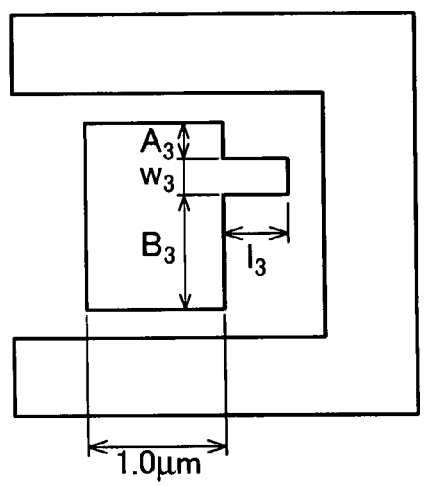

FIG. 17
DESIGN RULE
| NAME | DETAILS | PREDETERMINED VALUE |
|---|---|---|
| Wfm | MINIMUM LINE-WIDTH | 180nm |
| Wfmn | MINIMUM LINE-WIDTH OF CUT-OUT PORTION ON STRAIGHT LINE | 40nm |
A PATTERN IN WHICH LINE WIDTH Wfma IS CONSTANT AND LENGTH OF STRAIGHT LINE SECTION IS Wfmb SATISFIES:
Wfma ≧ 280nm − a* ES(Iij) or Wfmb ≧ 240nm − 2* ES(Wij)
(a) 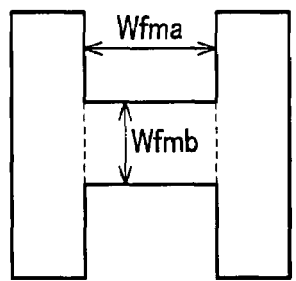
(b) 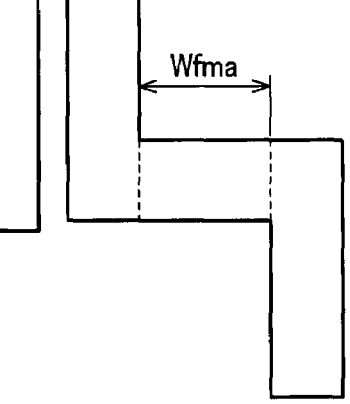
(c) 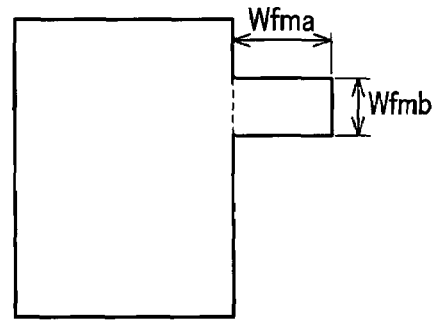
(d) 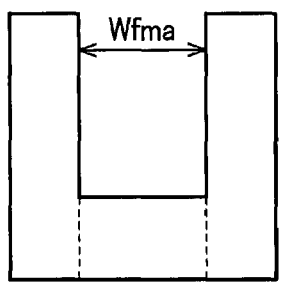
(e) 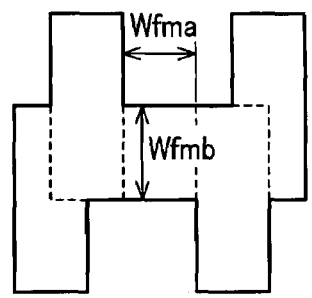

FIG. 23 (a)
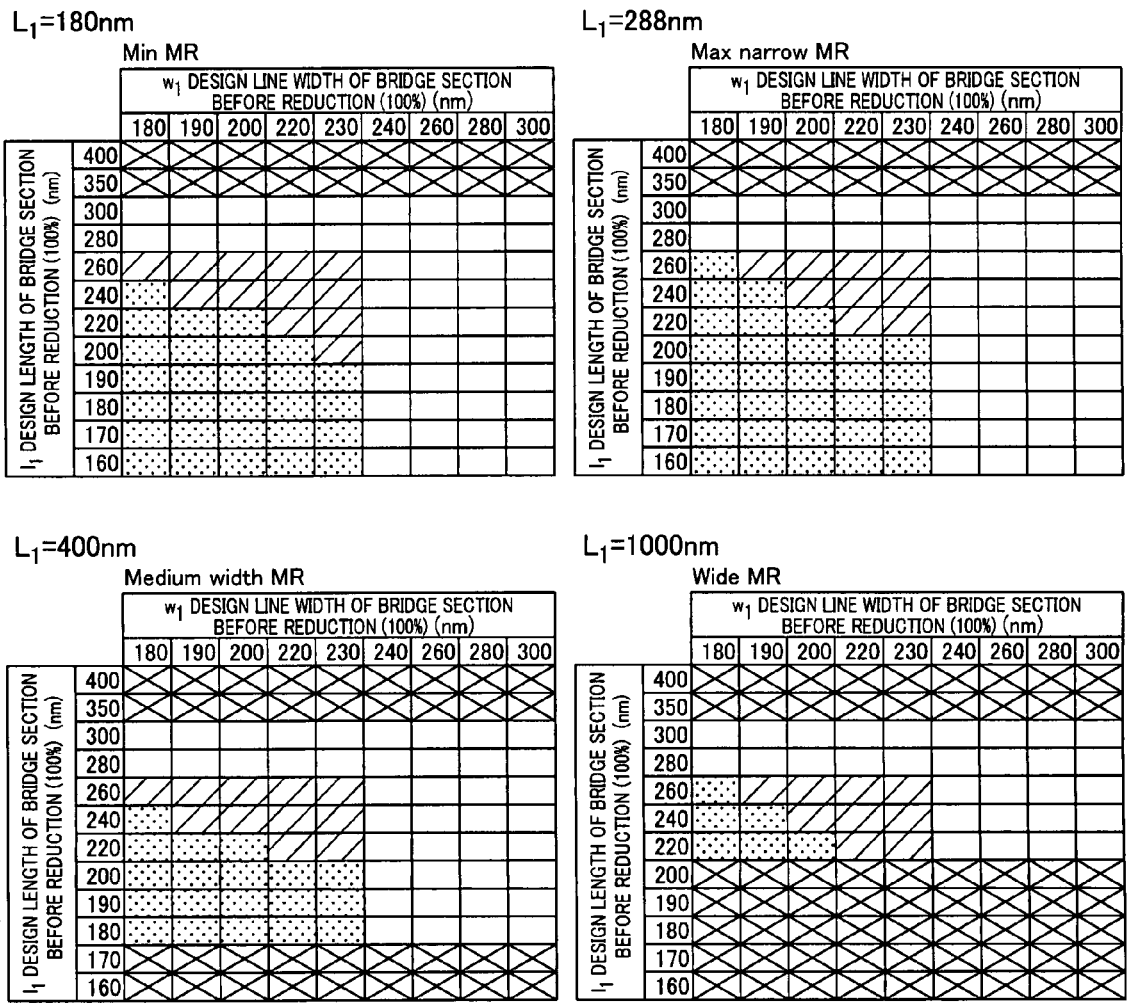
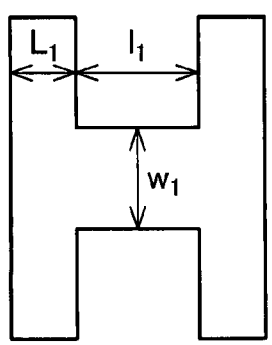
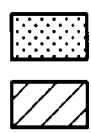 PHOTO EVALUATION = NG
SIMULATION RESULT = NG

BLOCK CORNER ROUNDING

CORRECTION METHOD AND CORRECTION SYSTEM FOR DESIGN DATA OR MASK DATA, VALIDATION METHOD AND VALIDATION SYSTEM FOR DESIGN DATA OR MASK DATA, YIELD ESTIMATION METHOD FOR SEMICONDUCTOR INTEGRATED CIRCUIT, METHOD FOR IMPROVING DESIGN RULE, MASK PRODUCTION METHOD, AND SEMICONDUCTOR INTEGRATED CIRCUIT PRODUCTION METHOD

This Nonprovisional application claims priority under 35 U.S.C. §119(a) on patent application Ser. No. 2006/179489 filed in Japan on Jun. 29, 2006, and No. 2007/161906 (filed in Japan on Jun. 19, 2007, the entire contents of which are hereby incorporated by reference.

FIELD OF THE TECHNOLOGY

The technology presented herein relates to a validation method for mask pattern data or design (layout data) used for lithography processes for manufacturing circuit patterns of ICs (integrated circuit), LSIs (large-scale integrated circuit), or liquid crystal displays etc., and to a correction method for mask pattern data or design data using the same, a yield estimation method for semiconductor integrated circuits (ICs or LSIs), and a method of improving design rule. The present technology also relates to a validation system for mask pattern data or design data and a correction system for mask pattern data using the same. The present technology further relates to a mask production method using the correction method for mask pattern data or design data, and a semiconductor integrated circuit production method using the mask. Note that, the lithography process designates a process of exposing a resist to radiation (visible light, ultraviolet light, X-ray, electron beam etc.) using a mask and developing the resist having been exposed, followed by etching of the circuit material using the developed resist as a mask. Apart from the lithography for carrying out visible light exposure of a visible light resist using a visible light mask, X-ray lithography for carrying out X-ray exposure; EUV lithography for carrying out soft (extreme) ultraviolet (EUV) exposure using a mask of identical size or in a reduction way; electron beam lithography for carrying out electron beam exposure; electron beam projection exposure lithography (EPL) not in a direct drawing but using a mask or cell projection is also applicable.

BACKGROUND

In recent years, integration of LSI has become more intensive, and the element sizes are being vastly reduced. In a lithography process directly related to element microfabrication, a photoresist is formed on a processing layer (semiconductor layer or a metal layer), and the photoresist is exposed via a mask followed by development, so that the photomask pattern is transferred onto the photoresist. The layer is then subjected to microfabrication through etching using as an etching mask the photoresist on which the pattern is transferred, before finally the photoresist is removed. In a recent lithography process for element microfabrication, the exposure wavelength is greater than the size of transfer pattern (photomask), and therefore there is a problem of faultiness of the pattern transfer linearity (accordance of the pattern before transfer and the pattern after transfer). This is called an optical proximity effect. The optical proximity effect is a phenomenon in which the 90° corner (corner section) rounds and the line end on the pattern transfer decreases due to diffraction of light caused by the exposure wavelength greater than the transfer pattern. Further, similarly, the optical proximity effect appears as a phenomenon in which the line width, which is supposed to be the same, varies depending on the density.

The optical proximity effect is, as it is obvious, mainly caused by a proximity effect of light; however, it is also affected by the resist process (pre-exposure bake, post-exposure bake (PEB), development) or by the underlayer (shape, structure, material etc. of the underlayer). The optical proximity effect may make the product circuit pattern to fall outside the spec (design size).

To prevent unwanted effects of optical proximity effect upon the exposure (may be called "photo", hereinafter), a mask used for exposure is generally subjected to a correction process in advance so that the predicted shifting (displacement) amount due to optical proximity effect is modified. This correction is called optical proximity effect correction (may be referred to as "OPC" hereinafter).

In recent years, a phenomenon called etching shift, which occurs in the OPC due to proximity effect of pattern in the etching process after exposure, has become a problem. Unlike the optical proximity effect, in the proximity effect in the etching process, the reaction of the circuit material to the etching changes depending on the space to the proximal pattern or the pattern density in the neighborhood. To accurately analyze the reaction, it is necessary to analyze radical reaction of etching including the shape of the neighborhood portion. A recent general practical method of finding the etching shift is not calculation of an accurate reaction formula, but a fitting calculation using an empiric formula (or a rule) on the basis of the space to the proximal pattern or the pattern density in the neighborhood. A correction of the etching proximity effect based on this fitting calculation (or a rule) is called an etching proximity effect correction (Etching-PC, hereinafter). The Process Proximity Effect Correction; (may be referred to as "PPC" hereinafter) including a proximity effect correction (Etching-PC) to the etching shift is now considered more important.

With the recent complication of process technologies, the circuit pattern set by the designer and the mask pattern used in the exposure process greatly differs. This prevents easy estimation of the shape of the resist pattern formed on a wafer based on the mask pattern. Therefore, it is necessary to check whether the mask pattern is appropriate (whether the mask pattern is capable of forming the desired circuit pattern) using a simulator (of lithography or etching).

For example, Patent Document 1 (Japanese Unexamined Patent Publication Tokukai 2005-121943) discloses a method of extracting the difference between (i) anticipated value pattern data generated through estimation of the photomask pattern at the time of exposure transfer onto a wafer and modification of the CAD pattern data, and (ii) the pattern data resulted from the simulation denoting a result of light intensity simulation to the CAD pattern data, and determines whether the difference is not more than a predetermined allowable value. In this way, the reasonability of the pattern image on a wafer is examined. Note that, the OPC data examination tool using this technology has been commercially available via some EDA (Electronic Design Automation) vendors.

Further, a non-patent Document 1 (J. Kim, L. Wang, et al. "Model-Based Full-chip Validation for 65 nm Lithography Process Development", SPIE BACUS Symposium, Yokohama, Vol. 5853-42, pp. 599-606, 2005/April) discloses a method of examining the reasonability of the pattern image on a wafer through estimation of the shape of photomask pattern at the time of transfer onto a wafer through lithography simulation, extracting the difference between the target CAD pattern data and the simulation result, and determining whether the difference is not more than a predetermined allowable value. The OPC data examination tool using this technology has been commercially available via some EDA vendors. The non-patent Document 2 (A. Sezginer, F. X. Zach, et al. "Process-window-aware-RET and OPC", SPIE Symposium, San Jose, Vol. 6156, No. 615613, recently completed volumes, 2006) is a specific example of PPC of this technology.

With reference to FIG. 4(a) and FIG. 4(b), the following explains a concrete example of a method of examining the reasonability of the OPC photomask (the photomask created by OPC) for forming a circuit pattern of a memory cell (SRAM), i.e., for examining whether the mask pattern is capable of forming a desired circuit pattern, by way of lithography simulation. First, the exposure pattern on a wafer is found by lithography simulation based on the OPC photomask pattern data of FIG. 4(a). FIG. 4(a) shows the exposure pattern on the wafer as a simulation result. Next, the distance between the edges of the exposure pattern on the wafer is checked and the two edges (in this example, see the part indicated by the broken line of FIG. 4(a)) with a distance (about 110 nm) significantly smaller than the designed value (170 nm) is determined as a part of short-circuit. The OPC photomask is modified to increase the distance between the edges determined as a part of short-circuit of the exposure pattern on the wafer to 166 nm. As a result, the distance between the edges determined as a part of short-circuit of the OPC photomask is increased from 110 nm to 118 nm. FIG. 4(b) shows an exposure pattern on the wafer (shown as a simulation result in the figure) found by the lithography simulation based on the modified OPC photomask, and the data thereof.

Examples of the method of producing photomask patterns using the OPC are disclosed in many Patent Documents, such as the Patent Document 2 (Japanese Unexamined Patent Publication Tokukai 2005-134520.

The method disclosed in Patent Document 2 first carries out proximity effect correction with respect to the design pattern data (photomask pattern data), and then extracts a part where the process margin decreases using the light intensity simulation (light intensity calculation under best focus, optimal exposure state, out of focus, improper exposure amount). In this way, the pattern is corrected to keep the margin of the part where the extract process margin decreases.

On the other hand, the Patent Document 3 (Japanese Unexamined Patent Publication Tokukai 2005-181636 prepares a desired pattern and a mask pattern corresponding to the desired pattern, and carries out proximity effect correction with respect to the mask pattern, and then sets evaluation points to the edges of the desired pattern, and calculates position errors from the evaluation points and the amount of statistics of the position errors for plural combinations of the process parameters in the variable range of process parameter value previously set. In this way, the mask pattern is corrected according to the amount of statistics.

In recent years, examples of typical production method for photomask pattern data using the OPC (or PPC) include a method of estimating the shift amount of proximity effect using a calculation formula or simulation, and a method of creating a process model for estimating a transfer pattern of the mask pattern in a predetermined process including exposure using the design data of the mask pattern as the input data. Further, in a method of producing photomask pattern data using OPC (or PPC), a designed test pattern is formed on the test mask, and the design data of the test pattern rearranged according to measurement result of length of the test pattern on the test mask is fitted to a result of length measurement of the test pattern on the test mask (Patent Document 4: Japanese Unexamined Patent Publication Tokukai 2004-157160). Since the fitting accuracy becomes higher in this fitting (experimental) model than the conventional theoretical model, the fitting (experimental) model is the main stream of the existing commercially-available tool (provided by EDA vendor).

Examples of recent PPC are disclosed in Patent Documents 3 and 4, Patent Document 5 (Japanese Unexamined Patent Publication Tokukai 2005-99765) and Patent Document 6 (Japanese Unexamined Patent Publication Tokukai 2003-57801).

The Patent Document 4 relates to a method of finding an estimation model of proximity effect of a highly-accurate process, such as a method of finding an unknown parameter using the test pattern made of the repetitive pattern group and the predetermined repetitive pattern group such as a memory cell. Further, the Patent Document 5 relates to a method of effectively carrying out measurement of SEM length and pattern correction by linking the steps (in parallel) by a computer. This method accurately finds addition correction amount (difference) to the optical proximity effect correction. With these methods, it is possible to greatly reduce huge work, burden and time for the conventional (correction) simulation in consideration of calculated many unknown parameters regarding mask reproduction, re-evaluation on the wafer, etching condition etc.

Note that, in LSI designing, application of restriction of critical pattern to the design rule to improve production reliability and process yield is broadly called a DFM (Design for Manufacturability). The necessity of the DFM tends to increase with the recent development of micro-sized (90 nm, 65 nm) LSI (non-patent Document 3: "DFM: beginning of entire revision of semiconductor cost" Nikkei Micro Device Magazine, Nikkei B P, May 2005, p. 25 to 41 (published on May 1, 2005, Page 36)).

The following explains problems of typical conventional technologies.

The biggest problem of the production and validation method of photomask pattern data using a general conventional PPC model is extraction and validation of PPC model. For the recent complication of LSIs as a result of the development of micro LSI elements, a demand of micro-size processing of circuit pattern has come to the front. However, decrease in exposure wavelength of an exposure device is becoming more difficult, and therefore increase in resolution by the decrease in exposure wavelength is not practical. The insufficient resolution has been solved by the super-resolution technology, an (immersion) exposure device, or mask design, but such methods have finally come to the limit in these years. Even with the circuit pattern according to the design rule, it is not so rare that the products include a pattern (critical pattern with a insufficient process margin) causing line-breakage or short-circuit when subjecting the target wiring pattern (layout pattern before modification) to a PPC process to create a photomask and carrying out exposure, development, and etching using the photomask.

FIG. 25 shows a flow of typical conventional PPC process (non-patent Document 2 etc.). As shown in FIG. 25, in the typical conventional PPC process, the mask data is created through etching correction and OPC process with respect to the design data of the circuit pattern. Next, the simulation validation is performed with respect to the mask data. If a problem such as line-breakage is found as a result of the simulation validation, the design data of the circuit pattern is modified, and the etching correction and OPC process is carried out again, or the mask data is corrected. The etching correction is performed with an Etching-PC model or an Etching-PC rule extracted in advance by using the model/rule extraction TEG pattern. Further, the OPC process is performed with an OPC model or an OPC rule extracted in advance by using the model/rule extraction TEG pattern.

FIGS. 26 to 30 show examples of model/rule extraction TEG pattern used for extraction of OPC model, OPC rule, Etching-PC model or Etching-PC rule in the typical conventional PPC process. Another example of mask pattern correction flow is a method of detecting a part where the process margin is reduced by simulation or the like after the PPC process, and then correcting the part, as disclosed in the Patent Document 2 (Japanese Unexamined Patent Publication Tokukai 2005-134520), in the Patent Document 3 (Japanese Unexamined Patent Publication Tokukai 2005-181636), or in the Patent Document 6 (Japanese Unexamined Patent Publication Tokukai 2003-57801).

The inventors of the present invention studied a circuit pattern (photomask pattern before correction) of a metal wire layer (hereinafter referred to as a "MR layer") of Cu or Al constituting a 130 nm flash memory (hereinafter referred to as a "flash") and found out that the specific pattern among the circuit pattern (layout pattern before correction) serves as a critical pattern (hereinafter referred to as "line-breakage risk pattern") which may cause line-breakage when subjecting the pattern to a simulation-based PPC process to create photomask and carrying out exposure, development, and etching using the photomask of said pattern. FIG. 3(a) to FIG. 3(e) show five concrete examples of line-breakage risk pattern in a MR layer of a 130 nm Flash. Note that, the MR layer is a wire layer (hereinafter referred to as "L/S layer" as appropriate) with a line and space circuit pattern.

The line-breakage risk pattern shown in FIG. 3(a) is a H-type crosslinking pattern at least constituted of a first rectangular section, and two first polygon sections (rectangular sections in this example) between which the first rectangular section is caught. The two first polygon sections are in contact with the respective two short-length sides of the first rectangular section. The two ends of the respective sides of the first polygon section in contact with the short-length sides of the first rectangular section each extend outward the short-length sides of the first rectangular section. The length l1 and the width w1 of the first rectangular section satisfy the following conditions.

$$l1 < 280 \text{ nm} - 2 \times ES(l1j)$$

$$w1 < 240 \text{ nm} - 2 \times ES(w1j)$$

In the foregoing conditions, $ES(l1j)$ and $ES(w1j)$ respectively indicate estimated etching shift amounts (amount of size variation due to the etching shift) of the length l1 and width w1 of the first rectangular section of the H-type crosslinking pattern. In this case, the values of $ES(l1j)$ and $ES(w1j)$ are found by back calculation (calculation of finding the length l1 and width w1 of the H-type crosslinking pattern which becomes critical in the etching based on the measurement result of the length l1 and width w1 of the H-type crosslinking pattern which are measured after etching). The etching shift amount depends on the etching process, particularly on the distance to the proximal pattern and the pattern density in the neighborhood. The values l1j and w1j are etching shift variables dependent on the space to the proximal pattern and the pattern density in the neighborhood. The $ES(l1j)$ and $ES(w1j)$ can be found by a rule based on variables l1j and w1j dependent on the space to the proximal pattern and the pattern density in the neighborhood. The rule is determined based on a pattern size of circuit material after the etching using an evaluation mask including the critical pattern. The pattern size of circuit material after the etching using an evaluation mask is specifically found by exposing/developing a resist using an evaluation mask, etching the circuit material using the resist, and measuring the pattern size of the circuit material after the etching. If the rule is applied, the $ES(l1j)$ and $ES(w1j)$ are several discontinuous constituents. Functions or models may be applied instead of the rule. FIG. 31 and FIG. 32 show concrete examples of the etching shift amount. FIG. 31 shows variation in etching shift amount depending on the space to the proximal pattern in a 130 nm process GP layer. The following shows an example of calculation formula (two-dimensional L/S pattern) of etching shift ES in the case of FIG. 31.

$$ES = C0 + C1 \times \text{Space}^{-2} + C2 \times \text{Space}^{-1} + C3 \times \text{Log}(\text{Space})$$

where C0, C1, C2 and C3 are constant values depending on the etching process. FIG. 32 shows an etching shift amount (residual error) dependent on the space of the L/S pattern (line-width after lithography). This is an example of a simple L/S pattern, but it is necessary to consider a long proximal pattern up to 3 or more μ meter in the etching correction, unlike the optical proximity correction (in which a proximal pattern of about 1 to 2 μm is considered).

The line-breakage risk pattern shown in FIG. 3(b) is an opened rectangular pattern at least constituted of a third rectangular section and two third polygon sections (rectangular sections in this example) between which the third rectangular section is caught. One side of the two third polygon sections are in contact with the respective two short-length sides of the third rectangular section. One end of the respective sides of the third polygon sections in contact with the short-length sides of the third rectangular section each extend outward the short-length sides of the third rectangular section. The ends extend outward are opposed without having the third rectangular section inbetween. The length l4 and the width w4 of the third rectangular section satisfy the following conditions.

$$l4 < 280 \text{ nm} - 2 \times ES(l4j)$$

$$w4 < 240 \text{ nm} - 2 \times ES(w4j)$$

In the foregoing conditions, $ES(l4j)$ and $ES(w4j)$ respectively indicate estimated etching shift amounts (amount of size variation due to the etching shift) of the length l4 and width w4 of the third rectangular section of the opened-rectangular crosslinking pattern. In this case, as with the values of $ES(l1j)$ and $ES(w1j)$, the values of $ES(l4j)$ and $ES(w4j)$ are found by back calculation (calculation of finding the length l4 and width w4 of the opened-rectangular crosslinking pattern which becomes a critical pattern by etching, based on the measurement result of the length l4 and width w4 of the opened-rectangular crosslinking pattern measured after etching). The etching shift amount depends on the etching process, particularly on the distance to the proximal pattern and the pattern density in the neighborhood. FIG. 31 and FIG. 32 show concrete examples of the etching shift amount.

The line-breakage risk pattern shown in FIG. 3(c) is a crank-type crosslinking pattern at least constituted of a second rectangular section and two second polygon sections (rectangular sections in this example) between which the second rectangular section is caught. One side of the two second polygon sections are in contact with the respective two short-length sides of the second rectangular section. One end of the respective sides of the second polygon sections in contact with the short-length sides of the second rectangular section each extend outward the short-length sides of the second rectangular section, to be opposite to each other with respect to the second rectangular section. The length l2 and the width w2 of the second rectangular section satisfy the following conditions.

$$l2 < 280 \text{ nm} - ES(l2j)$$

$$w2 < 240 \text{ nm} - 2 \times ES(w2j)$$

In the foregoing conditions, $ES(l2j)$ and $ES(w2j)$ respectively indicate estimated etching shift amounts (amount of size variation due to the etching shift) of the length l2 and width w2 of the second rectangular section of the crank-type crosslinking pattern as with the above case. In this case, as with the values of $ES(l1j)$ and $ES(w1j)$, the values of $ES(l2j)$ and $ES(w2j)$ are found by back calculation (calculation of finding the length l2 and width w2 of the crank-type crosslinking pattern which becomes a critical pattern by etching, based on the measurement result of the length l2 and width w2 of the crank-type crosslinking pattern measured after etching).

The line-breakage risk pattern shown in FIG. 3(d) is a crank-type crosslinking pattern at least constituted of a second rectangular section, two second polygon sections (rectangular sections in this example) between which the second rectangular section is caught and another section. One side of the two second polygon sections are in contact with the respective two short-length sides of the second rectangular section. One end of the respective sides of the second polygon sections in contact with the short-length sides of the second rectangular section each extend outward the short-length sides of the second rectangular section, to be opposite to each other with respect to the second rectangular section. The length l5 and the width w5 of the second rectangular section satisfy the following conditions.

$$l5 < 280 \text{ nm} - 2 \times ES(l5j)$$

$$w5 < 240 \text{ nm} - 2 \times ES(w5j)$$

In the foregoing conditions, $ES(l5j)$ and $ES(w5j)$ respectively indicate estimated etching shift amounts (amount of size variation due to the etching shift) of the length l5 and width w5 of the second rectangular section of the crank-type crosslinking pattern as with the above case. In this case, as with the values of $ES(l1j)$ and $ES(w1j)$, the values of $ES(l5j)$ and $ES(w5j)$ are found by back calculation (calculation of finding the length l5 and width w5 of the crank-type crosslinking pattern which becomes a critical pattern by etching, based on the measurement result of the length l5 and width w5 of the crank-type crosslinking pattern measured after etching).

The line-breakage risk pattern shown in FIG. 3(e) is a projection pattern at least constituted of a rectangular projection section and a polygon main body in contact with one of the short-length sides of the projection section. Two ends of the side of the polygon main body in contact with the short-length side of the projection section each extend outward the short-length side of the projection section. The length l3 and the width w3 of the third rectangular section satisfy the following conditions.

$$l3 < 280 \text{ nm} - ES(l3j)$$

$$w3 < 240 \text{ nm} - 2 \times ES(w3j)$$

In the foregoing conditions, $ES(l3j)$ $ES(w3j)$ respectively indicate estimated etching shift amounts (amount of size variation due to the etching shift) of the length l3 and width w3 of the projection pattern, as with the above case. As with the values of $ES(l1j)$ and $ES(w1j)$, the values of $ES(l3j)$ and $ES(w3j)$ are found by back calculation.

Generation of such critical patterns is caused by improper PPC processes of the conventional PPC model due to development of micro LSIs. This circumstance has raised necessity of modification of extraction of PPC model or an approach (help) from the designer.

However, those critical patterns cannot be detected by a check process based on the conventional light intensity simulation (with varied defocus values and exposure amounts). FIG. 5 and FIG. 6 show concrete examples.

FIG. 5 shows results of photo evaluation of photomasks including critical patterns, performed by the inventors of the present invention. These photomasks are used for a practical process, and has been modified by OPC correction. More specifically, FIG. 5 shows images (upper SEM photo) of the upper surfaces of positive type photoresist patterns captured by a scanning electron microscope (SEM). Each of the positive type photoresists has been subjected to exposure and development on a wafer using the photomask under an exposure amount=33.5 mJ/cm$^2$ and a defocus value=+0.15 µm. The narrow portion of the upper SEM photo is a portion with a risk of line-breakage. The photo evaluation determines, according to a SEM photo such as the one shown in FIG. 5, a positive type photoresist without a top (resist top) in the narrow portion (there is a risk of line-breakage in the etching process) as "NG", and determines a positive type photoresist with a top in the narrow portion (there is no risk of line-breakage in the etching process) as "GOOD". The target photomargin in this process (target exposure margin and focus margin) is a range in which the exposure margin (the width of exposure amount ensuring a good result of photo evaluation) is not less than ±3.3%, and the focus margin (the width of defocus value ensuring a good result of photo evaluation) is not less than ±0.18 µm. However, all patterns of photomask in FIG. 5 are evaluated as "NG". Generation of a positive type photoresist without a top in the narrow portion, which causes a risk of line-breakage in the etching process, is induced by depression in the narrow portion of the positive type photoresist. This derives from light leakage in the narrow portion due to its light intensity contrast less than the other parts.

FIG. 6 shows a light intensity simulation result of a mask including a critical pattern having been modified by OPC correction, corresponding to the positive resist pattern of FIG. 5. As shown in FIG. 6, the light intensity simulation result shows that the width of the narrow portion (width of the resist bottom (bottom section)) is 165 nm, that means there is no risk of line-breakage. Thus, in the mask pattern check by light intensity simulation, risk of line-breakage is not concerned in the etching process, and therefore the narrow portion is not detected as a critical pattern. Therefore, the mask pattern check only by the light intensity simulation causes a possibility of line-breakage at the stage of production of a trial circuit pattern model through exposure, development and etching by using the actual mask created according to the mask pattern. When the occurrence of line-breakage is found, a new mask pattern needs to be produced. This increases development cost and development period.

Further, with the development of micro-sized LSI, high accuracy of PPC model has become a large demand. In the conventional PPC model, a simulation model is created based on a light intensity calculation result obtained by lithography simulation with a limited threshold (variable threshold or fixed threshold) for avoiding short-circuit of simulation pattern and a limited threshold (variable threshold or fixed threshold) for avoiding line-breakage, and the various sizes (line width etc.) of the circuit pattern obtained by exposure, development, and etching of a resist using the mask are calculated according to the simulation model (variable threshold model or fixed threshold model). Further, in a conventional PPC model, a simulation model is created based on a light intensity calculation result obtained by lithography simulation, with a simplified estimation of effect of photoresist development and etching effect. Therefore, to obtain a highly accurate PPC model, the estimation of photoresist shape by way of exposure calculation and development calculation can be performed with higher accuracy. However, the process time of pattern correction increases, and a load of device performing pattern correction calculation increases.

Further, in the case of creating mask pattern data from the design data of a semiconductor circuit, complex data processes such as PPC or auxiliary pattern production are required because of recent development of micro semiconductor. Therefore, after the data processes, a pattern validation (check) process is required to assess adequacy of data results. There are various pattern validation methods. For example, the validation method after PPC may be performed by a method of checking the pattern data after PPC according to the PPC rule, or a method using an empirical model of checking the pattern resulted from exposure whether the pattern satisfies the target size. The pattern validation is becoming more important with the further development of micro semiconductor element. This has caused a demand for a validation technology with high accuracy.

The following explains the problems of Patent Documents of 2, 3, 5 and 6 which are the features to be addressed by the example embodiment presented herein.

FIG. 2 shows a flow chart of a mask pattern data creation process according to the Patent Document 2 (Japanese Unexamined Patent Publication Tokukai 2005-134520).

In the mask pattern data creation process of the Patent Document 2, the design pattern is modified first to satisfy the process margin (S111), and then is modified into a proximity effect correction pattern for realizing the design pattern modified in S111 (S112). Next, the process margin is examined to check whether it is not less than the reference value (S113). Then, any part with process margin out of the reference value is subjected to pattern correction (S114). After output of mask data, a mask is created (S115).

FIG. 1, FIG. 3, and Paragraphs [0017], [0019], [0021], and [0023] of the Patent Document 2 describe conversion of design data into a desired pattern ensuring a desired process margin in S111 before the optical proximity effect correction by changing the pattern of amount delta corresponding to the pattern width L and the pattern gap S, based on the conversion table (table of rules) of FIG. 3. Specifically, the paragraph [0021] of Patent Document 2 reads "the conversion amount delta . . . for maintaining a process margin can be determined by an exposure test using masks of varied parameters of a line width or a space width of the Lines & Space pattern, or by light intensity simulation".

More specifically, the Patent Document 2 describes that a correction rule for maintaining a process margin is determined by an exposure test using masks of varied parameters of a line width or a space width of the Lines & Space pattern, and the correction is carried out according to the correction rule before and after the optical proximity effect correction.

However, the method of Patent Document 2 carries out correction so as to maintain the process margin of the pattern after the optical proximity effect correction, that is, the method is not to detect and correct a pattern which becomes a critical pattern in the optical proximity effect correction. Therefore, in the method of the Patent Document 2, the area of a local margin degradation point of the design pattern in the optical proximity effect correction cannot be removed before the optical proximity effect correction. This is written in Paragraph [0025] of the Patent Document 2 as "At the stage after the proximity effect correction section S12, a local margin degradation point remains". Further, in the Patent Document 2, only a mask including Lines & Space pattern is disclosed as a mask for the exposure test, and there is no teaching of a mask including a pattern which becomes critical in the optical proximity effect correction, such as a H-type crosslinking pattern.

Further, paragraph [0024] of the Patent Document 2 reads "the desired pattern may be formed on a portion where the process margin decreases in a two-dimensional manner. For example, . . . in the case where the design pattern 105 is constituted of large-area rectangle and narrow-line patterns, the width 102 of the large-area pattern is a narrow line". However, a method of detecting a pattern which becomes critical in the optical proximity effect correction before performing the optical proximity effect correction is not found in this description.

Further, Paragraphs [0026] to [0029], and [0035] of the Patent Document 2 disclose pattern correction with respect to an extracted pattern whose process margin is equal to or less than the reference value after the optical proximity effect correction.

However, in the Patent Document 2, the extraction of the part (pattern) whose process margin is equal to or less than the reference value after the optical proximity effect correction is performed by comparison with the distribution form of light intensity obtained by a light intensity simulation. As described above, the conventional check process based on the light intensity simulation is not capable of detecting a pattern which becomes critical in the optical proximity effect correction (shown in FIG. 5 and FIG. 6). Therefore, detection and correction of a pattern which becomes critical in the optical proximity effect correction (shown in FIG. 5 and FIG. 6) is not possible even by a method of pattern extraction and pattern correction after the optical proximity effect correction disclosed in the Patent Document 2.

In conclusion, the OPC process in Patent Document 2 is inadequate, as it is not capable of detecting and correcting a pattern (FIG. 5 and FIG. 6) which becomes critical in the optical proximity effect correction. Therefore, if a lithography process is performed with a photomask which is formed based on the photomask pattern of the Patent Document 2 having been through the OPC process, the process spec (such as process margin) is not achieved in the entire area. Consequently, it becomes necessary to check whether the process spec is satisfied, and correct the layout as required after the photolithography process by way of photo evaluation (evaluation based on an image captured by an electron microscope). That is, it is necessary to correct the design data of photomask after the photolithography process, create a new photomask, and subjects the new mask to photo evaluation again. This brings a great waste of cost and a great delay of development. In view of this problem, there is a demand for a validation technology capable of detecting the critical pattern such as the ones shown in FIG. 5 and FIG. 6, so as to realize a highly-accurate OPC process with which the layout correction after the photolithography process is not necessary.

The Patent Documents 3, 5, and 6 describe existing OPC process flow or PPC process flow. For example, in Patent Document 3, the difference between the target pattern and the estimation (simulation) value is found using the mask pattern data after the OPC process, and the difference is used as an index of mask pattern correction. In Patent Document 5, an unknown parameter is found using a mask including a test pattern. Various test patterns produced from a base pattern or a repetitive pattern with varied biases and pitches are used. In Patent Document 6, the measured length by a SEM and a mask pattern coordinate are associated to find the difference of them, and the difference is used as an index of mask pattern correction. However, these methods carry out validation, extraction, and correction to resulting mask pattern data, that is, carry out validation, extraction, and correction of mask pattern data after creation of mask pattern data. Those methods thus do not allow mask pattern data correction before creation of mask pattern.

SUMMARY

The example embodiment presented herein is made in view of the foregoing conventional problems, and a feature is to provide correction method and correction system for mask pattern data, validation method and validation system for mask pattern data for ensuring the process spec (including the process margin) after a PPC process. With the assurance of the process spec, the present embodiment prevents wastes in cost and development period due to mask design data correction, mask reproduction, and an extra photo evaluation process after the lithography process. The present embodiment also provides a yield estimation method for semiconductor integrated circuit, a method of improving design rule, a mask production method, and a semiconductor integrated circuit production method using the correction method, the correction system, the validation method and the validation system.

A correction method for design data or mask data according to the present embodiment is a mask pattern data correction method, said method correcting design data or pattern data of a lithography mask so that the mask forms a desired size of circuit pattern through a microfabrication process such as lithography or etching using the mask, the method comprising the steps of: (i) carrying out proximity effect correction at least including etching proximity effect correction with respect to design data or mask data; (ii) a first measurement step for exposing a resist using evaluation mask including plural patterns varied in parameter value, a part of which is a critical pattern which becomes critical on process proximity effect correction, developing the resist exposed, and measuring a pattern size of the resist developed; (iii) a second measurement step for etching a circuit material using the resist having been developed, and measuring a pattern size of the circuit material after the etching; (iv) determining parameter numerical condition for preventing the design data or pattern data from being critical on process proximity effect correction, based on the pattern size of the resist and the circuit material measured in the first and second measurement steps; (v) extracting a pattern with a parameter not satisfying the foregoing numerical condition from the design data or the mask data as a critical pattern which becomes critical on process proximity effect correction; and (vi) correcting the design data or the mask data so that the critical pattern extracted have a parameter satisfying the foregoing numerical condition.

The foregoing method carries out in advance exposure and development of a resist using an evaluation mask including a critical pattern which becomes critical on process proximity effect correction, measures the pattern size of the resulting resist, determines numerical parameter condition (risk prevention (prohibiting) rule, such as a lower limit of line width or a lower limit of space) for preventing the pattern data from being critical on process proximity effect correction, based on the pattern size of the resist, as a reference of determining the presence of the pattern which becomes critical on process proximity effect correction, and extracts a pattern not satisfying (falling above) the numerical parameter condition as a critical pattern. Then, the design data or the mask data is corrected so that the parameter(s) of the critical pattern satisfy the foregoing numerical condition.

This method allows creation of the design data or the mask data not including a portion which becomes critical on process proximity effect correction. Therefore, the process spec (incl. process margin) can be attained after the photolithography process or etching process using a mask created based on the design data or the mask data. In the design data or the mask data corrected by the conventional imperfect PPC, there has been a problem of discordance between the pattern size measured after the photolithography process or etching process using a mask created based on the design data or the mask data and the process spec (incl. process margin). However, the foregoing method of the present embodiment solves such a problem, and does not require layout correction after the photolithography process or etching process using a mask created based on the mask pattern data, namely, correction of the design data, creation of a new photomask, and another photo evaluation for the new mask. This prevents wastes of cost and development time (this is also an advantage in terms of global environment conservation.)

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 5 is a drawing showing SEM measurement results (risk portions) of critical patterns.

FIG. 10A is a drawing showing a H-type crosslinking pattern example and a SEM measurement result (risk portion).

FIG. 14 is a drawing showing line width/length examples as concrete examples of DFM rule.

FIG. 16(a) to FIG. 16(c) show concrete examples of micro projection pattern and micro level-difference pattern.

FIG. 17 is a drawing showing an example of design rule addition (Logic process/MR layer).

FIG. 23 (b) is a drawing showing a concrete example of lower-limit restriction rule (actual measurement result) after OPC in the H-type crosslinking pattern and in the crank-type pattern.

DESCRIPTION OF THE EMBODIMENTS

Explanation of the Present Embodiment

Figure 1A:
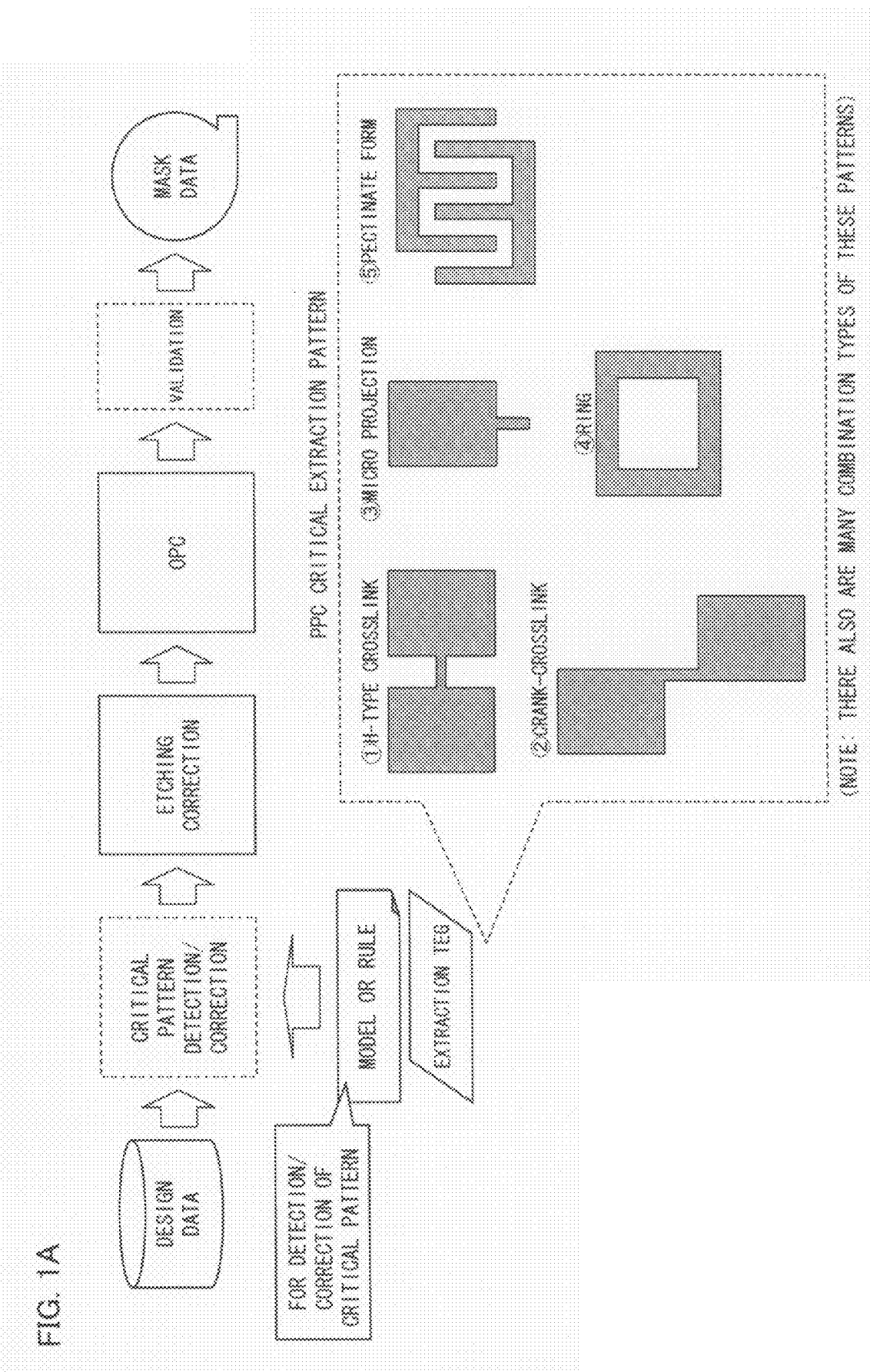
FIG. 1A is a drawing conceptually showing a mask pattern data correction method according to one embodiment.
Figure 1B:
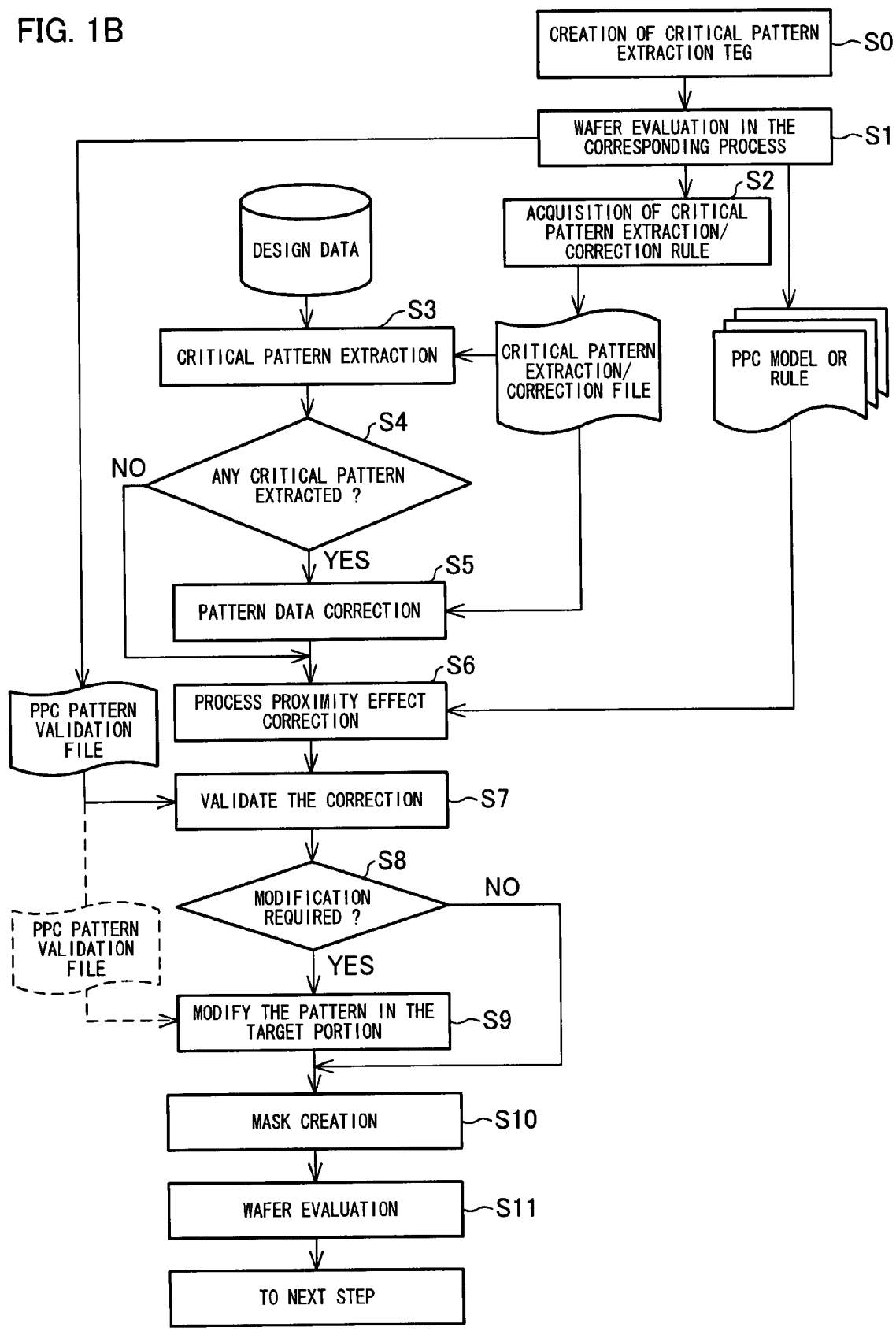
FIG. 1B is a flow chart showing mask pattern data validation and correction methods according to one embodiment.

FIG. 1A shows an example of PPC process flow according to an example embodiment. FIG. 1B shows the details. In this example of PPC process flow of FIG. 1A, a PPC critical pattern is extracted by an extraction TEG (PPC critical extraction pattern) so as to correct the layout. The layout correction is reflected to the design rule if possible. With this the layout does not need to be corrected in the designing thereafter. In this PPC process flow, it is not necessary to reproduce the design data according to a validation result. A short-circuit prevention pattern and a line-breakage prevention pattern are required as a PPC critical extraction pattern.

Note that, in the present specification, unless otherwise specified, "the process proximity effect correction" designates not only correction only with respect to shift in the etching process after the exposure (etching proximity effect correction), but also such as correction for correcting shift in the etching process after the exposure and size shift in a mask process in addition to correction with respect to shift in the exposure process. Further, in the present specification, the wording "(the design data or the mask data) becomes critical on process proximity effect correction" indicates (i) defects of circuit pattern such as short-circuit or line-breakage in an etching process of a circuit material (silicon, metal etc.) due to the mask used, after the mask is produced through process proximity effect correction of the design data or the mask data, creation of a mask using the design data or the mask data, exposure of resist using the mask, and development of the exposed resist, or (ii) parameters, which denote unlikeliness of defects such as a process margin (eg. allowable size error ensuring prevention of line-breakage or short-circuit), falling below predetermined numerical ranges (process spec).

Typical numerical conditions of parameter include a predetermined line width condition such as "a line width not less than the lower limit" and a predetermined space (gap between lines) condition such as "space not less than the lower limit". However, the numerical condition is not limited to those.

Note that, the critical pattern on the process proximity effect correction depends on a parameter of the pattern itself, and also depends on a parameter of exposure process such as an optical parameter (optical aberration or flare) or a parameter of the development process after the exposure such as a development speed of resist. The present invention focuses on a critical property due to a geometric shape of pattern. That is, a basic function of the present invention is extraction of a critical pattern according to an index of pattern size parameter.

A plurality of patterns of the evaluation mask have patterns which may become critical by degradation of process margin due to geometric shape of a pattern, and include plural patterns with different parameters. Typical critical patterns causing degradation of process margin due to (geometric shape of) a pattern include (a) H-type crosslinking pattern, (b) crank-type crosslinking pattern (described later), (c) projection pattern (described later), (d) ring pattern (described later), (e) pectinate line and space pattern, and combination pattern of at least two of these patterns (see FIG. 7(a) to FIG. 7(e)). Other critical pattern causing degradation of process margin due to (geometric shape of) a pattern may be a micro line and space (L & S) pattern, a dot pattern, or a micro gap pattern.

A validation method for the design data or the mask data according to the present embodiment is a validation method for design data or mask data which carries out validation as to whether design data or mask data includes a critical pattern, which becomes critical on process proximity effect correction, in a microfabrication process for carrying out process proximity effect correction at least including etching proximity effect correction with respect to design (layout) data or mask data of a lithography mask, said validation being performed before and after the process proximity effect correction, the method comprising the steps of: (i) a measurement step for exposing a resist using an evaluation mask including plural patterns varied in parameter value, a part of which is a critical pattern which becomes critical on process proximity effect correction, developing the resist exposed, and measuring a pattern size of the resist developed; (ii) determining parameter numerical condition for preventing the design data or the pattern data from being critical on process proximity effect correction, based on the pattern size of the resist and the circuit material measured in the measurement step; and (iii) extracting a pattern with a parameter not satisfying the foregoing numerical condition from the design data or the mask data as a critical pattern which becomes critical on process proximity effect correction.

This method allows detection of a portion which becomes critical on process proximity effect correction before carrying out a microfabrication process using an actual mask. Therefore, the problem of the defect portion which becomes critical on process proximity effect correction can be solved (eg. by modification of design rule or mask data correction) before carrying out a microfabrication process using an actual mask. Therefore, after the microfabrication process, the process spec (incl. process margin) cannot be attained due to insufficient PPC. Then, for layout correction, it is necessary to correct the design data, create a new photomask, and subjects the new mask to photo evaluation again. This brings great wastes of cost and development time. However, the foregoing method solves such a problem entirely. (this is also an advantage in terms of global environment conservation.)

In the validation method and correction method according to the present embodiment, extraction of critical pattern may be carried out either before the process proximity effect correction or after the process proximity effect correction. Further, in the correction method according to the present embodiment, the pattern correction with respect to the extracted critical pattern may be carried out either before the process proximity effect correction or after the process proximity effect correction (including the case of pattern correction during the process proximity effect correction).

In the case of carrying out the foregoing steps before the process proximity effect correction, the rule-based critical pattern extraction using a DRC tool and the pattern correction may be performed with simple mask pattern data or design data having not been through the process proximity effect correction. On this account, critical pattern extraction and pattern correction may be performed with a small load of process.

On the other hand, in the case of carrying out the foregoing step after the process proximity effect correction, high accuracy of the pattern resulted from the PPC correction is ensured (optimize the pattern). On this account, it is possible to obtain an effect of maximally improving the process margin. In consideration of cost of photomask, cost of photo evaluation, and required development time (at least about a month), the foregoing effects of cost reduction and period reduction ensure the same effect regardless of whether the foregoing steps are performed before or after the PPC process.

The evaluation mask used in the present embodiment includes a pattern which becomes critical when the mask is subjected to the process proximity effect correction, regardless of whether the extraction of the critical pattern is performed before or after the PPC process.

The validation method of the present embodiment carries out process evaluation (evaluation according to the pattern size of the resist measured in the step (i)), extraction of condition of a pattern which becomes critical on process proximity effect correction (rule; numerical parameter condition), and extraction of a defect portion (critical pattern) based on the condition. Note that, apart from the extraction of a defect portion (critical pattern), the extraction of defect portion may be performed by a combination of pattern matching and simulation-based CD margin check, or contrast check of light intensity gradient.

A yield estimation method for semiconductor integrated circuit according to the present embodiment is a method of estimating a yield of a semiconductor integrated circuit in a manufacturing method for a semiconductor integrated circuit by a microfabrication process including a proximity effect correction step for carrying out process proximity effect correction with respect to design data or pattern data of a lithography mask, the method comprising the steps of:(i) extracting a critical pattern using the validation method according to the present invention; and (ii) estimating a yield of a semiconductor integrated circuit based on at least one of: (a) whether or not a critical pattern is extracted, (b) density of the extracted critical pattern, (c) a degree of error of a parameter of the extracted critical pattern with respect to a boundary value of the foregoing parameter numerical condition.

The validation method according to the present embodiment allows extraction of a critical pattern which becomes critical on process proximity effect correction in a semiconductor integrated circuit such as a LSI, for example, a pattern which may cause line-breakage on process proximity effect correction, a pattern which may cause short-circuit on process proximity effect correction, or a pattern which may cause insufficient process margin due to geometric shape of the pattern on process proximity effect correction (for example, error of allowable size for ensuring prevention of line-breakage or short-circuit on process proximity effect correction).

In the manufacturing of a semiconductor integrated circuit, the final yield is determined depending on the electric characteristic of the resulting semiconductor integrated circuit (eg. electric characteristic of the transistor). The electric characteristic of the resulting semiconductor integrated circuit depends on the presence, the density, and the degree (degree of error of the parameter with respect to the boundary value of the foregoing parameter numerical condition, which denotes likeliness of line-breakage or short-circuit) of a critical pattern. That is, the yield of semiconductor integrated circuit production depends on the presence, the density, and the degree of a critical pattern.

The foregoing yield estimation method estimates the yield of a semiconductor integrated circuit based on: (a) whether or not a critical pattern is extracted, (b) density of the extracted critical pattern, and (c) a degree of error. In this way, it is possible to reconsider the design in consideration of the yield of a semiconductor integrated circuit, and the yield can be improved.

The yield estimation may be performed by checking at least one of the presence, the density and the degree of a critical pattern in a pattern including a circuit critical path extracted by LSI circuit simulation (incl. timing simulation) or the like.

More specifically, the foregoing method of estimating a yield of a semiconductor integrated circuit may further comprise the steps of: (iii) extracting a circuit critical path by circuit simulation including timing validation from design data of the semiconductor integrated circuit; and (iv) estimating a yield of the semiconductor integrated circuit based on at least one of: (a) whether or not a critical pattern is extracted, (b) density of the extracted critical pattern, (c) a degree of error of a parameter of the extracted critical pattern with respect to a boundary value of the foregoing parameter numerical condition, for a mask pattern corresponding to an arbitrary mask pattern including a part or an entire of a critical path having been extracted. With this method, it is possible to exclude a mask pattern corresponding to a layout layer not including a critical path from the group of patterns to be analyzed. In this way, efficiency and accuracy of the yield estimation can be further improved.

Note that, "design data or mask data which may cause line-breakage on process proximity effect correction" indicates a possibility of line-breakage in an etching process of a circuit material due to the mask used, after the mask is produced through process proximity effect correction of design data or mask data, creation of a mask using the design data or the mask data, exposure of resist using the mask, and development of the exposed resist. On the other hand, "design data or mask data which may cause short-circuit on process proximity effect correction" indicates a possibility of short-circuit in an etching process of a circuit material due to the mask used, after the mask is produced through process proximity effect correction of design data or mask data, creation of a mask using the design data or the mask data, exposure of resist using the mask, and development of the exposed resist.

By evaluating the photo/etching characteristic (process margin or modification degree) of the critical pattern by using the extraction TEG according to the present invention, extracting these patterns in an actual LSI, and estimating the degree of influence to the yield by full-chip simulation, it is possible to evaluate the yield. The yield of LSI is determined by considering various factors. In this example, influences of size accuracy and variation in the microfabrication, and margin (process margin) with respect to a process-dependent factor to the yield are estimated. They are dependent on the critical pattern (worst rate controlling). Therefore by finding a correlation between the estimation using a full-chip simulation (incl: TCAD) and the actual measurement, it becomes possible to estimate the yield based on the correlation.

For example, it is possible to actually create a LSI including a critical pattern, and find the yield of LSI production based on the electric characteristic of the transistor section of the LSI.

A method of improving design rule according to the present embodiment is a method of improving a design rule in a microfabrication process which includes the steps of laying out a pattern of a semiconductor integrated circuit pattern data according to a design rule; and carrying out process proximity effect correction with respect to the design (layout) data or the mask data of a semiconductor integrated circuit having been laid out, the method comprising the steps of: (i) extracting a critical pattern using the validation method according to the present invention; and (ii) when a critical pattern is extracted, including a rule "satisfy the numerical parameter condition" into the design rule.

The critical pattern extracted by the validation method according to the present embodiment (a critical pattern in which the process margin decreases at least depending on the pattern) may be fed back to the design by addition or modification of design rule. That is, with the extraction of the critical pattern, the design rule can be improved. With this method, the design rule may be improved, and DFM (Design for Manufacturability) is realized.

To enable such a feedback to the design by addition or modification of design rule, the design rule is formed as a data item (data structure) with a spec allowing expression which can be defined in a geometric manner. The data of the design rule is structured (or have a certain spec) to be able to be updated by adding a new design rule to the design rule thus defined, or by modifying a part of the design rule. The rule added in the improvement method may be a rule regarding a geometric shape such as patterns (1) to (4) (described later), for example. This rule regarding the shape can be actually added to the existing design rule.

In the case of using the critical pattern extracted by the method of the present embodiment for design rule improvement or for ensuring DFM, the evaluation extraction TEG pattern is preferably structured with a spec compatible with DRC, LVS (Layout versus Skema) of the design. The "the spec compatible with DRC, LVS of the design" in this case indicates an extraction TEG pattern based on the design rule adopted in the designing process, and if there are a plurality of layers, the DRC and LVS may be applied to the extraction TEG pattern similarly to the LSI design data even for an superimposed rule because of the base according to the rule adopted in the designing process. More specifically, the extraction TEG pattern is constituted of parts (blocks) which can be used for designing without modification. Note that, the LVS is generally processed with DRC after the design layout is completed before the PPC process. The DRC and LVS are carried out after the designing before the Tape Out.

Note that, the design rule of the production process of an integrated circuit (the first half process) is defined in consideration of the parameter regarding the processing in the step (such as a minimum process size of the pattern) and determination as to whether the electric characteristic of the resulting integrated circuit (chip) meets the spec.

A correction method for design data or mask data according to the present embodiment is preferably arranged so that the evaluation mask includes, as the critical pattern, at least one of: (i) a H-type crosslinking pattern at least constituted of a first rectangular section, and two first polygon sections between which the first rectangular section is caught, the two first polygon sections respectively being in contact with two short-length sides of the first rectangular section, two ends of the respective sides of the first polygon section in contact with the short-length sides of the first rectangular section each extending outward the short-length sides of the first rectangular section; (ii) a crank-type rectangular pattern at least constituted of a second rectangular section and two second polygon sections between which the second rectangular section is caught, one side of the two second polygon sections being in contact with respective two short-length sides of the second rectangular section, one end of respective sides of the second polygon sections in contact with the short-length sides of the second rectangular section each extending outward the short-length sides of the second rectangular section, to be opposite to each other with respect to the second rectangular section; (iii) a projection pattern at least constituted of a rectangular projection section and a polygon main body in contact with one of short-length sides of the projection section, two ends of side of the polygon main body in contact with the short-length side of the projection section each extending outward the short-length side of the projection section; (iv) a ring pattern having a rectangular opening; and (v) a pectinate pattern constituted of a pair of opposed pectinate sections in which two comb-teeth of one of the pectinate sections therebetween have a comb-tooth of the other pectinate section.

The patterns (1) to (3) cannot be corrected sufficiently by the conventional process proximity effect correction (particularly simulation-based process proximity effect correction), and is highly likely to cause line-breakage on the process proximity effect correction. In the foregoing method, the numerical parameter condition is determined using an evaluation mask including at least one of the patterns (1) to (3) which is very likely to cause line-breakage on the process proximity effect correction. In this manner, a critical pattern which causes line-breakage on the process proximity effect correction (or a critical pattern which is very likely to cause line-breakage on the process proximity effect correction) can be more securely extracted based on the numerical parameter condition. Further, the critical pattern which causes line-breakage on the process proximity effect correction (or a critical pattern which is very likely to cause line-breakage on the process proximity effect correction) can be more securely corrected.

In this method, the evaluation mask (PPC extraction TEG mask) is created by adding at least one of the critical patterns (1) to (3) to the conventional PPC model extraction TEG pattern, for example.

Similarly, the ring pattern (4) and the pectinate pattern (5) also cannot be corrected sufficiently by the conventional process proximity effect correction (particularly simulation-based process proximity effect correction), and are highly likely to cause short-circuit on the process proximity effect correction. In the foregoing method, the numerical parameter condition is determined using an evaluation mask including the ring pattern (4) and the pectinate pattern (5) which are very likely to cause short-circuit on the process proximity effect correction. In this manner, a critical pattern which causes short-circuit on the process proximity effect correction (or a critical pattern which is very likely to cause short-circuit on the process proximity effect correction) can be more securely extracted based on the numerical parameter condition. Further, the critical pattern which causes short-circuit on the process proximity effect correction (or a critical pattern which is very likely to cause short-circuit on the process proximity effect correction) can be more securely corrected.

Note that, the five types of patterns cannot be detected as critical patterns by the method in which extraction and PPC of the critical pattern are performed based on a predetermined parameter threshold (threshold model) for determining a critical pattern, which threshold is found (extracted) using the conventional PPC model extraction TEG patterns (the line and space (L/S) pattern disclosed in the Patent Document 5, a repetitive pattern such as a cell pattern, or the model parameter extraction TEG pattern in the Patent Document 7 (Japanese Unexamined Patent Publication Tokukai 2004-302263)) with varied parameters of line density, linearity, proximity degree of the respective line terminals etc. This is because the parameter threshold, such as the lower limit of a line width, the lower limit of space etc. changes depending on the pattern shape, and the parameter threshold for the 5 types of critical pattern differ from the parameter threshold of the conventional PPC model extraction TEG pattern. Therefore, the 5 types of critical pattern or the complex pattern including these patterns cannot be checked (extracted) by the threshold model (the value adjusted according to the resist bottom size) which has been conventionally used as a PPC model.

To perform detection of the five types of critical pattern, the foregoing method determines numerical parameter condition (rule) using an extraction TEG mask including at least one of the five types of critical pattern, and extracts a critical pattern based on the numerical condition. Note that, extraction of critical pattern is performed for a correction operation for preventing line-breakage, short-circuit etc.

The numerical parameter condition (rule) for extracting the critical pattern may be used as a rule of rule-base (pattern matching) on the PPC correction, or may be combined with a PPC model by using a variable threshold model or the like.

A half ring pattern shown in FIG. 14(b) may also be used as the ring pattern (4). Further, the pectinate pattern is a narrow space pattern (have a risk of short-circuit) with teeth combined in a complex manner.

The evaluation mask preferably includes, as critical patterns, all of the H-type crosslinking pattern, the crank-type crosslinking pattern, the projection pattern, and the ring pattern.

In the H-type crosslinking pattern, the size W1 of the first polygon section along the width direction of the first rectangular section (crosslinked portion) is not particularly limited as long as it is greater than the width w1 of the first rectangular section. The size W1 however preferably satisfies the following formula (except for the off-grid case), $$W1 - w1 \geq 2 \times \text{Min } G$$

where Min G indicates a minimum unit (minimum grid) in the layout designing.

The "off-grid case" indicates a case where the apex of the polygon constituting the pattern does not reside on the lattice point in a grid of the smallest size unit of the layout designing. In such a case, the foregoing evaluation (calculation) is carried out after the apex of the polygon is moved to the most proximal lattice point so that the apex resides on the lattice point. This is applied also to other formulas with the condition "except for the off-grid case".

In the H-type crosslinking pattern, the first rectangular section preferably has a micro size. More specifically, the length l1 and width w1 of the first rectangular section preferably satisfy the following formula, $$l1 < lH = \text{Min Space} + 2 \times \Delta PPC$$

$$w1 < wH = k1\lambda/NA + 2 \times \Delta PPC$$

where lH and wH are fixed values determined by exposure condition, process condition, and process proximity effect correction condition, and Min Space denotes an allowable minimum space value in the design rule, $\Delta$ PPC denotes a minimum correction unit for the target portion of mask pattern correction (corner section etc.) in the process proximity effect correction, $\lambda$ indicates exposure wavelength, NA indicates numerical aperture of the optical system of the exposure device, and k1 denotes process factor.

The term of $k1\lambda/NA$ in the formula indicates wiring width. This term is the "Rayleigh formula" well known by a person in the art, and denotes resolving power of the exposure device. Further, the process factor k1 is a factor which decreases as the pattern size decreases, that is, a smaller value thereof indicates greater difficulty of processing. The term $\Delta PPC$ is added to the foregoing formula in consideration of the minimum correction size in the process proximity effect correction. $\Delta PPC$ is a value ranges from the minimum line width to ⅓ of the minimum width. For example, if the mask pattern to be corrected is a mask pattern for forming the first flash MR layer having a minimum line width of 130 nm level, l1 is not less than 280 nm−2×ES(l1j), or w1 is not less than 240 nm−2× ES(w1j), as shown in FIG. 14.

In the crank-type crosslinking pattern, the size W2 of the second polygon section along the width direction of the second rectangular section (crosslinked portion) is not particularly limited as long as it is greater than the width w2 of the second rectangular section. The size W2 however preferably satisfies the following formula (except for the off-grid case), $$W2 - w2 \geq \text{Min } G$$

where Min G indicates a minimum unit (minimum grid) in the layout designing.

In the crank-type crosslinking pattern, the second rectangular section preferably has a micro size. More specifically, the length l2 and width w2 of the second rectangular section preferably satisfy the following formula, $l2 < lC = \text{Min Space} + 2 \times \Delta PPC$ $w2 < wC = k1\lambda/NA + 2 \times \Delta PPC$ where, lH and wH are fixed values determined by exposure condition, process condition, and process proximity effect correction condition, and Min Space denotes an allowable minimum space value in the design rule, Δ PPC denotes a minimum correction unit for the target portion of photomask pattern correction (corner section etc.) in the process proximity effect correction, λ indicates exposure wavelength, NA indicates numerical aperture of the optical system of the exposure device, and k1 denotes process factor. For example, the photomask pattern to be corrected is a mask pattern for forming the first flash MR layer having a minimum line width of 130 nm level.

In the projection pattern, the size W3 of the main body section along the width direction of the projection section is not particularly limited as long as it is greater than the width w3 of the projection section. The size W3 however preferably satisfies the following formula (except for the off-grid case), $W3 - w3 \geq 2 \times \text{Min } G$ where Min G indicates a minimum unit (minimum grid) in the layout designing.

In the projection pattern, the projection section preferably has a micro size. More specifically, the length l3 and width w3 of the projection section preferably satisfy the following formula, $l3 < lP = \text{Min Space} + 2 \times \Delta PPC$ $w3 < wP = k1\lambda/NA + 2 \times \Delta PPC$ where lP and wP are fixed values determined by exposure condition, process condition, and process proximity effect correction condition, and Min Space denotes an allowable minimum space value in the design rule, Δ PPC denotes a minimum correction unit for the target portion of mask pattern correction (corner section etc.) in the process proximity effect correction, λ indicates exposure wavelength, NA indicates numerical aperture of the optical system of the exposure device, and k1 denotes process factor.

For example, if the mask pattern to be corrected is a mask pattern for forming the first flash MR layer having a minimum line width of 130 nm level, l3 is not less than 280 nm−ES(l3j), or w3 is not less than 240 nm−2×ES(w3j), as shown in FIG. 14.

In the ring pattern, it is preferable that the width (line width) of the ring portion is narrow. More specifically, it is preferable that each of the width of the portion extending along the first direction of the ring portion and the width of the portion extending along the second direction of the ring portion orthogonal to the first direction is constant, and the values l4 and w4 (l4 expresses the longer one of the width of the portion extending along the first direction of the ring portion and the width of the portion extending along the second direction of the ring portion orthogonal to the first direction and w4 expresses the shorter one of the width of the portion extending along the first direction of the ring portion and the width of the portion extending along the second direction of the ring portion orthogonal to the first direction) satisfy the following formula, $l4 < lR = \text{Min Space} + 2 \times \Delta PPC$ $w4 < wR = k1\lambda/NA + 1 \times \Delta PPC$ where lR and wR are fixed values determined by exposure condition, process condition, and process proximity effect correction condition, and Min Space denotes an allowable minimum space value in the design rule, Δ PPC denotes a minimum correction unit for the target portion of mask pattern correction (corner section etc.) in the process proximity effect correction, λ indicates exposure wavelength, NA indicates numerical aperture of the optical system of the exposure device, and k1 denotes process factor.

However, wR in the formula is applied in the case of a single ring pattern (single rectangular pattern) or a combination pattern of a ring pattern and the pattern (1), (2) or (3). In the case of a pattern constituted of continuous plural ring patterns, wR satisfies the following formula.

$wR = k1\lambda/NA + 2 \times \Delta PPC$

For example, the photomask pattern to be corrected is a mask pattern for forming the first flash MR layer having a minimum line width of 130 nm level. Note that, in the foregoing ring pattern, L4 which expresses a size of the opening along the long width and W4 which expresses a size of the opening along the short width are not limited.

Further, the evaluation TEG may include, as the critical pattern, other patterns such as an opened-rectangular (U-shape) pattern or a cross pattern. Also for the opened-rectangular (U-shape) pattern or the cross pattern, it is preferable that each of the width of the portion extending along the first direction of the ring portion and the width of the portion extending along the second direction of the portion orthogonal to the first direction is constant, and the values l4 and w4 (l4 expresses the longer one of the width of the portion extending along the first direction of the portion and the width of the portion extending along the second direction of the portion orthogonal to the first direction and w4 expresses the shorter one of the width of the portion extending along the first direction of the portion and the width of the portion extending along the second direction of the portion orthogonal to the first direction) satisfy the following formula, $l4 < lR = \text{Min Space} + 2 \times \Delta PPC$ $w4 < wR = k1\lambda/NA + 1 \times \Delta PPC$ where lR and wR are fixed values determined by exposure condition, process condition, and process proximity effect correction condition, and Min Space denotes an allowable minimum space value in the design rule, Δ PPC denotes a minimum correction unit for the target portion of mask pattern correction (corner section etc.) in the process proximity effect correction, λ indicates exposure wavelength, NA indicates numerical aperture of the optical system of the exposure device, and k1 denotes process factor.

The correction method for design data or mask data according to the present embodiment is preferably arranged so that the evaluation mask includes at least one kind of a pattern selected from a group consisting of: (1) a plurality of H-shape crosslinking patterns; (2) a plurality of crank-type crosslinking patterns; (3) a plurality of projection pattern; and (4) a plurality of ring patterns, in each of the H-shape crosslinking patterns, at least one of values of L1, W1, l1, and w1 is varied within a range including a boundary value so that at least one of boundary values of L1, W1, l1, and w1 can be found as the numerical parameter condition, where L1 expresses a size of the first polygon section along a longitudinal direction of the first rectangular section, W1 expresses a size of the first polygon section along a width of the first rectangular section, l1 expresses a length of the first rectangular section, and w1 expresses a width of the first rectangular section, in each of the crank-type crosslinking patterns, at least one of values of L2, W2, l2, and w2 is varied in a range including a boundary value so that at least one of boundary values of L2, W2, l2, and w2 can be found as the numerical parameter condition, where L2 expresses a size of the second polygon section along a longitudinal direction of the second rectangular section, W2 expresses a size of the second polygon section along a width of the second rectangular section, l2 expresses a length of the second rectangular section, and w2 expresses a width of the second rectangular section, in each of the projection patterns, at least one of values of L3, W3, l3, and w3 is varied in a range including a boundary value so that at least one of boundary values of L3, W3, l3, and w3 can be found as the numerical parameter condition, where L3 expresses a size of a main body of the projection section along the longitudinal direction, W3 expresses a size of the main body along a width of the projection section, l3 expresses a length of the projection section, and w3 expresses a width of the projection section, and in each of the ring patterns, each of a width of a portion extending along a first direction of the ring portion and a width of a portion extending along a second direction of the ring portion orthogonal to the first direction is constant, and at least one of values of L4, W4, l4, and w4 is varied in a range including a boundary value so that at least one of boundary values of L4, W4, l4, and w4 can be found as the numerical parameter condition, where a long width l4 expresses the longer one of the width of the portion extending along the first direction of the ring portion and the width of the portion extending along the second direction of the ring portion orthogonal to the first direction, a short width w4 expresses the shorter one of the width of the portion extending along the first direction of the ring portion and the width of the portion extending along the second direction of the ring portion orthogonal to the first direction, L4 expresses a size of the opening along the long width, and W4 expresses a size of the opening along the short width.

The direct target value to be found in the foregoing method is the lower limits (boundary values) of l1 to l4 or w1 to w4, but these values may be dependent on the values of L1 to L4 or W1 to W4. More specifically, the values of L1 to L4 or W1 to W4 may be set in some cases with no consideration of the lower limits of l1 to l4 or w1 to w4; however, in other cases, the values of L1 to L4 or W1 to W4 need to be determined in consideration of the lower limits, in which case the relationships among the values of L1 to l4 or w1 to W4 and the lower limits of l1 to l4 or w1 to w4 are expressed by relational expressions. Varying L1 or W1 in finding the boundary values of L1 or W1 can be effective.

The desired numerical parameter condition (DFM rule) to be set is required to prevent, in the H-type crosslinking pattern, particular line thinning of the crosslinked portion (l, w) on the PPC process of the mask pattern, which brings the risk of line-breakage (critical). The desired numerical parameter condition (DFM rule) to be found is, for the H-type crosslinking pattern, at least one of the boundary values of L1, W1, l1 and w1. The boundary value corresponds to a lower limit of at least one numerical ranges of L1, W1, l1, and w1 which can avoid the risk of line-breakage in consideration of process variation or margin. At least one of the lower limits of L1, W1, l1, and w1 can be found according to the condition of line-breakage in the step of determining parameter condition. Note that, the foregoing boundary value is supposed to be slightly greater than the lower limit of the design rule; that is, even when the boundary value cannot be found, it can be estimated roughly by the lower limit of the design rule.

Further, the wording "varying within the range including the boundary value" indicates setting of plural different values including a value smaller than the boundary value (lower limit of the numerical range) and a value greater than the boundary value (upper limit of the numerical range).

In this method, by determining the numerical condition by accurately finding a change of at least one of L1, W1, l1, and w1 in the vicinity of the boundary value, the pattern validation and pattern correction can be carried out with high accuracy. This provides a certain advantage in realizing a practical DFM.

The extraction of critical patterns of (1) to (4) in the critical pattern extraction step may be performed as follows, for example.

More specifically, the extraction of critical patterns (1) and (2) is performed as follows. First, micro rectangular (or polygonal) polygons whose length is equal to or less than the length L and whose width is equal to or less than the width W is extracted by a CAD tool. Then, all micro rectangular polygons among them in which the two opposed sides are in contact with larger polygons while the other two sides are not in contact with the larger polygons are extracted. Further, the extraction of critical pattern (3) is performed as follows. First, micro rectangular (or polygonal) polygons whose length is equal to or less than the length L and whose width is equal to or less than the width W is extracted by a CAD tool. Then, all micro rectangular polygons among them in which only one side of those is in contact with a larger polygon while other three are not are extracted. Note that, the extraction of the ring pattern (4) and the pectinate pattern (5) may be performed in a similar manner as that for the patterns (1) to (3), which can be easily thought by a person in the art. The explanation thereof is therefore omitted here.

Note that, extraction of polygon can be performed by synthesis or by (geometrically) resizing the layout using an existing CAD (DRC) tool. The series of (geometric) steps may be (generally) performed by a single CAD tool. Extraction of micro projections equal to or less than the length L and the width W using a CAD tool or the like is a common conventional technology. However, the prevention of line thinning by limiting the H-type or crank-type (geometric) patterns according to the characteristic after the PPC conversion in this example is not performed in the conventional PPC process.

In the foregoing correction method according to the present embodiment, the crosslinked portion may be increased in width or modified based on the process variation or the margin condition. With this arrangement, a sufficient process margin is ensured, unlike the conventional PPC correction which merely extracts a projection.

Note that, in the case of a polygon, such as a hexagon, "width" corresponds to a line width of the crosslinked portion (narrowest part). This is because the problem of the polygon is line-breakage, which depends on the length and the width (l and w) of this part.

In the case of using at least one of the patterns (1) to (5), the correction method for design data or mask data according to the present invention is preferably arranged so that the parameter includes a line width and a space, and the numerical parameter condition at least one of: the line width numerical condition "line width is not less than the lower limit of line width and the space numerical condition "space is not less than the lower limit of space", and the plurality of patterns of the evaluation mask includes at least one of a pattern group constituted of patterns of varied line-widths in a numerical range including the lower limit of the line-width and a pattern group constituted of patterns of varied spaces in a numerical range including the lower limit of the space.

In the foregoing method, the evaluation mask has a spec allowing calculation of the lower limit of the line width, and the lower limit of the space in the mask process (line width processing). In this method, the evaluation mask has a structure ensuring calculation of the lower limit on the photo process of these patterns or the lower limit after the etching, for example, the lower limit of the crosslinked portion (it indicates the portion with inadequate process accuracy of the mask in this case) which becomes critical in the H-type pattern or in the crank-type pattern. More specifically, the evaluation mask preferably has a spec with which the lower limits (guarantee limit) of L, W, l, and w can be estimated, for example, a spec in which the combinations of the L, W, l, w are varied with magnitude differences, and a plurality of identical patterns are provided in many portions in the same plane, which allows the variation evaluation of the mask process. Note that, the patterns (1) to (5) have specs for finding the lower limit for the photo process on the wafer.

Note that, in the present invention, the plurality of pattern in the evaluation mask may have a structure (the details of the structure are omitted) for finding other critical (risky) pattern rules.

Further, in the present embodiment, the critical patterns (1) to (5) may have a spec useful for validation of mask processing accuracy. More specifically, validation of mask processing accuracy may be performed by using the critical patterns (1) to (5). That is, the critical pattern expresses the worst case of the processing pattern. With this, by measuring a size error of the critical pattern (an error of the desired size), it is possible to find the maximum value (worst value) of the size error. In this way, the mask processing accuracy can be validated based on the magnitude of the worst value.

The correction method for design data or mask data according to the present embodiment may be arranged so that, at or after the step (1), the design data or the mask data having been through the process proximity effect correction is corrected so as to satisfy at least one of: numerical line-width condition such that "a line-width is not less than a lower limit of the line-width" and numerical space condition such that "a space is not less than a lower limit of the space".

The correction in the correction step may be carried out with respect to a portion where the process margin decreases, extracted by calculation formula or simulation.

The correction method for design data or mask data according to the present embodiment may be arranged so that, before the step (1), the design data or the mask data having been through the process proximity effect correction is corrected so as to satisfy at least one of: numerical line-width condition such that "a line-width is not less than a lower limit of the line-width" and numerical space condition such that "a space is not less than a lower limit of the space".

A mask production method according to the present embodiment comprising the steps of: (i) correcting design data or lithography mask data according to the correction method according to the present embodiment; and (ii) creating a lithography mask according to the design data or the mask data having been corrected.

A semiconductor integrated circuit production method according to the present embodiment comprising the steps of: (i) forming a circuit material layer for constructing a circuit; (ii) forming a resist on the circuit material layer; (iii) exposing the resist using the mask; (iv) developing the resist exposed; and (v) etching the circuit material layer using a mask resulted from development of the resist, wherein the exposure is carried out with a mask produced by the mask production method according to the present embodiment.

A correction system for design data or mask data according to the present embodiment is a system for correcting design (layout) data or data of a lithography mask so that the lithography mask forms a desired size of circuit pattern through a microfabrication process, the system comprising: a proximity effect correction section for carrying out proximity effect correction with respect to the design data or the lithography mask data; an exposure device for exposing a resist using a evaluation mask and developing the resist exposed; a first measurement device for measuring a pattern size of the resist developed; a second measurement device for measuring a pattern size of a circuit material having been etched using the resist developed; a parameter numerical condition determining section for determining parameter numerical condition based on the pattern sizes of the resist and the circuit material measured by the first and second measurement devices so as to prevent the design data or the mask data from being critical on process proximity effect correction; a critical pattern extraction section for extracting a pattern with a parameter not satisfying the foregoing numerical condition from the design data or the lithography mask data as a critical pattern which becomes critical on process proximity effect correction; and a critical pattern correction section for correcting the design data or the mask data so that the critical pattern extracted have a parameter satisfying the foregoing numerical condition, wherein the evaluation mask is created in advance according to evaluation mask data including plural patterns varied in parameter value, a part of which is a critical pattern which becomes critical on process proximity effect correction.

The correction system for design data or mask data according to the present embodiment preferably further comprises a correction portion output section for adding, to design data or lithography mask data, information of a portion corrected by the critical pattern correction section and outputting resulting lithography mask pattern data to a display device.

This structure saves the record of the correction portion as an information item after the correction is done, and exhibits the record to the user, thereby allowing the user to confirm the correction portion. More specifically, with this arrangement, the information of the portion corrected by the critical pattern correction section (using a rule or simulation), such as the portion corrected so that the line width becomes equal to or greater than the lower limit, or the portion corrected so that the space becomes equal to or greater than the lower limit, is added to the design data or mask data before the mask pattern data is outputted to the display device. On this account, it is possible to display the portion corrected by the critical pattern correction section as an image of a distinctive color when the image of the mask pattern data is displayed in the display device. This allows the user to receive a warning "there is a portion needs to be corrected", and thereby enables the user to manually confirm the correction portion or to carry out validation.

Further, in the case where the design data or the mask data is polygon data including a plurality of layers, the correction portion output section may add other polygon data item indicating the correction portion to the design data or the mask data as an additional layer to the existing layer (a layer distinguished from the existing layer). On this account, the polygon data is displayed in the display device with the layers clearly distinguished, and the user can find the correction portion at a glance.

Figure 20:
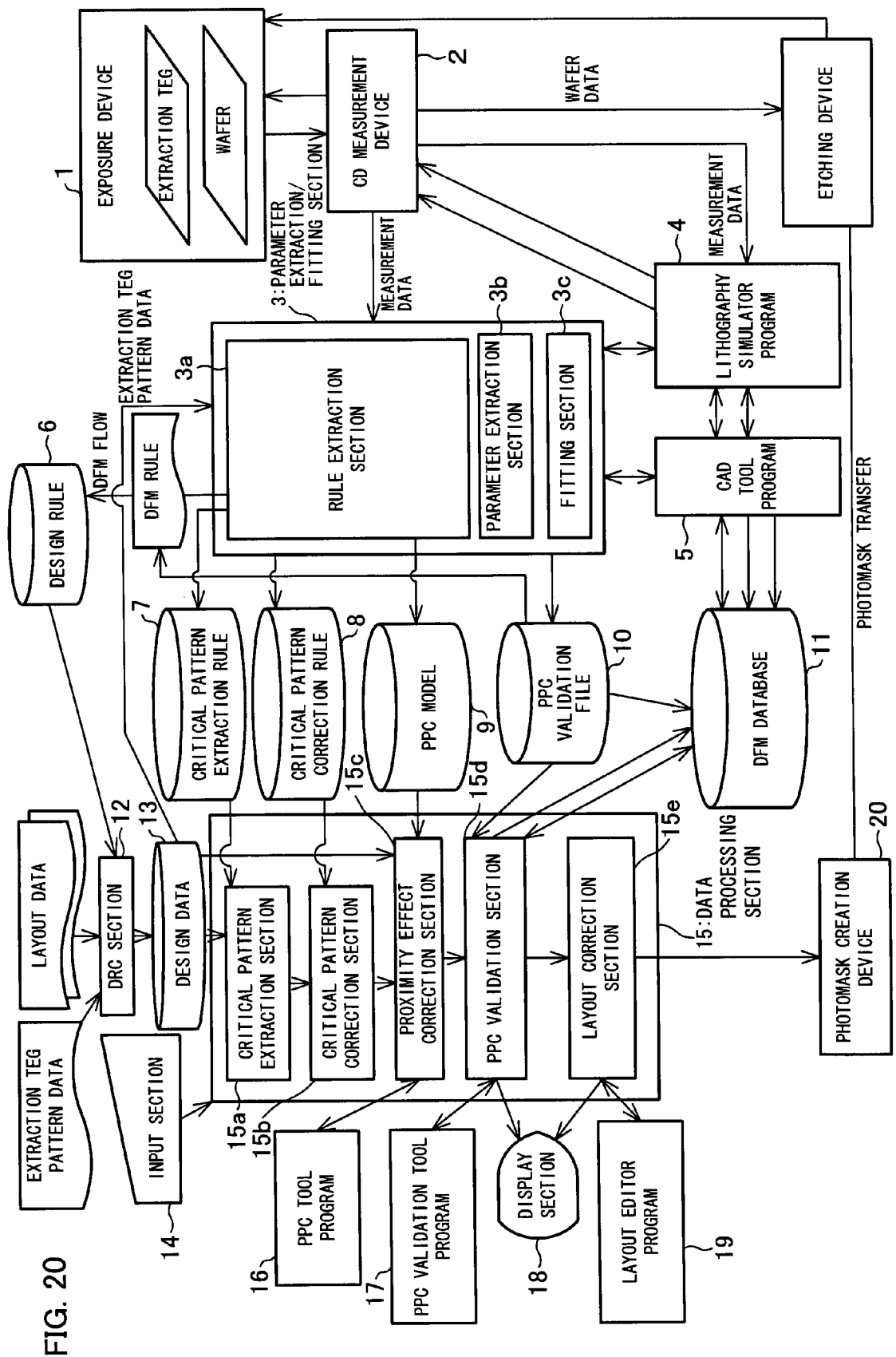
FIG. 20 is a block diagram showing a structure of a photomask pattern correction system according to one embodiment.

The left half of FIG. 20 shows an example of the flow of a display operation of the correction portion as a result of the foregoing correction portion output operation. In this example, the correction portion output section adds a third layer for expressing a polygon (correction portion indicating polygon) indicating the correction portion to a first layer expressing a polygon of a mask pattern before the correction and a second layer expressing a polygon of a mask pattern after the correction (these 3 layer are displayed in different colors, for example).

A validation system for design data or mask data according to the present embodiment is a system for carrying out validation as to whether design data or lithography mask data includes a critical pattern which becomes critical on process proximity effect correction, in a microfabrication process including a proximity effect correction step for carrying out process proximity effect correction with respect to the design (layout) data or the lithography mask data at least including etching proximity effect correction, the validation being carried out before or after the proximity effect correction step, the system comprising: a proximity effect correction section for carrying out proximity effect correction with respect to design data or lithography mask data; an exposure device for exposing a resist using a evaluation mask and developing the resist exposed; a first measurement device for measuring a pattern size of the resist developed; a second measurement device for measuring a pattern size of a circuit material having been etched using the resist developed; a parameter numerical condition determining section for determining parameter numerical condition based on the pattern sizes of the resist and the circuit material measured by the first and second measurement devices so as to prevent the design data or mask data from being critical on process proximity effect correction; and a critical pattern extraction section for extracting a pattern with a parameter not satisfying the foregoing numerical condition from the design data or lithography mask data as a critical pattern which becomes critical on process proximity effect correction, wherein the evaluation mask is created in advance according to evaluation mask data including plural patterns varied in parameter value, a part of which is a critical pattern which becomes critical on process proximity effect correction.

The foregoing system may be a single piece of tangible device (semiconductor device), or may be a plurality of devices connected via a network to carry out the operation in association (through data exchange). Further, the system may be constituted of software and hardware (computer) which carry out an operation in association. In this case, both a single software item or plural associated software items may be used as the software for causing a computer to function as the respective means of the system.

A correction method for design data or mask data according to the present embodiment is a mask pattern data correction method comprising the steps of: (i) a first measurement step for carrying out an exposure experiment for exposing and developing a resist using an evaluation mask, and measuring a shape of the resist developed; (ii) a second measurement step for etching a circuit material using the resist developed and measuring a pattern size of the circuit material after the etching; (iii) a first estimation step for estimating a shape of the resist developed according to data of the evaluation mask by a calculation formula or by simulation; (iv) a second estimation step for estimating a shape of the circuit material etched according to data of the evaluation mask by a calculation formula or by simulation; (v) a fitting step for changing a parameter of the calculation formula or a parameter for the simulation based on comparison between the shapes of the resist and the circuit material measured by the first and second measurement steps and the shapes of the resist and the circuit material calculated in the first and second estimation steps so as to fit the calculation formula or the simulation to measurement results of the first and second measurement steps; and (vi) a proximity effect correction step for carrying out another estimation of a shape of the resist and a shape of the circuit material according to the calculation formula or the simulation having been modified in the step (v) and carrying out process proximity effect correction of mask data based on the shape of the resist and the shape of the circuit material estimated in said another estimation, wherein the evaluation mask includes a pattern which is assumed to be critical on the process proximity effect correction based on the shape of the resist and the shape of the circuit material having been estimated in the steps (iii) and (iv).

With the foregoing method, unlike the process proximity effect correction of the conventional empirical fitting model, the evaluation mask includes a pattern which is assumed to be critical on the conventional process proximity effect correction. On this account, estimation by the foregoing calculation formula or simulation (lithography, etching/simulation etc.) may be fitted to the measurement result more accurately than the method of the conventional empirical fitting model. Therefore, the process proximity effect correction may be carried out more securely and accurately than the process proximity effect correction of the conventional empirical fitting model.

Note that, the pattern which is assumed to be critical on the process proximity effect correction based on the resist shape estimating in the foregoing estimation step is a pattern having a specific shape which is assumed to be critical on a common conventional process proximity effect correction. Specifically, the pattern is (1) the H-type crosslinking pattern, (2) the crank-type crosslinking pattern, (3) the projection pattern, (4) the ring pattern, or (5) the pectinate pattern. Such a pattern is not used in the process proximity effect correction according to the conventional empirical fitting model.

As described, the present embodiment thus provides correction method and correction system for design data or mask data, validation method and validation system for design data or mask data for ensuring the process spec (including the process margin) after a PPC process. With the assurance of the process spec, the present invention prevents wastes in cost and development period due to mask design data correction, mask reproduction, and an extra process evaluation after the microfabrication process. The present embodiment also provides a yield estimation method for semiconductor integrated circuit, a method of improving design rule, a mask production method, and a semiconductor integrated circuit production method using the correction method, the correction system, the validation method and the validation system.

Outline of the Method of the Present Embodiment

First of all, the following explains outline of design data or mask data validation method and correction method and a method of improving design rule according to the present embodiment.

The validation method for design data or mask data according to the present embodiment is a method of correcting pattern data of a lithography mask so that the mask forms a desired size of circuit pattern through a microfabrication process. The mask pattern data validation method according to the present invention comprising the steps of (i) carrying out proximity effect correction with respect to design data or mask data; a first measurement step for exposing a resist using evaluation mask data including plural patterns varied in parameter value, a part of which is a critical pattern which becomes critical on process proximity effect correction, developing the exposed resist, and measuring the pattern size of the developed resist; (ii) a second measurement step for etching a circuit material using the developed resist, and measuring the pattern size of the circuit material after the etching; (iii) determining parameter numerical condition for preventing the design data or the mask data from being critical on process proximity effect correction, based on the pattern size of the resist and the circuit material measured in the first and second measurement steps; and (iv) extracting a pattern with a parameter satisfying the foregoing numerical condition from the design data or the mask data as a critical pattern which becomes critical on process proximity effect correction.

In a preferred embodiment of the validation method, the evaluation mask used for parameter condition determining step (correction rule, model extraction TEG) includes a plurality of critical patterns with which the process margin becomes the smallest, in addition to a pattern density dependency evaluation pattern used for conventional PPC model extraction TEG or a size linearity evaluation pattern. The plurality of critical patterns with which the process margin becomes the smallest at least includes a H-type crosslinking pattern, a crank-type crosslinking pattern, a ring pattern, and a projection pattern. In the correction rule extraction, the correction rules (eg. lower limit of line-width and space lower limit) or the constraint models of these patterns are extracted based on wafer evaluation results of these patterns, and restriction in the PPC process is determined.

This method enables extraction of a portion (pattern) becomes critical on process proximity effect correction which was not found by conventional simulation validation or simulation-based critical portion check.

In the correction method of design data or mask data according to the present invention, the process proximity effect correction with respect to the design data or the mask data is carried out as follows. After a portion which becomes critical on process proximity effect correction (critical pattern) is extracted in a similar manner to the described validation method, the layout according to already-designed design data (layout data) or mask data is corrected by removing a critical pattern. With this operation, it is possible to obtain design data or mask data not including a portion which becomes critical on process proximity effect correction.

In a method of improving design rule according to the present embodiment, extraction result of critical insecure portion is reflected to the design rule applied in the designing of (LSI) circuit pattern after the first (LSI) mask creation using the correction method and before the second (LSI) mask creation, and the design rule is thus corrected. With this operation, a mask pattern including a critical pattern for the process proximity effect correction is not used in designing. More specifically, design parameters are restricted using the design rule as a design basic so as to exclude the portion which becomes critical on process proximity effect correction. In this way it is possible to avoid in the next designing (layout) of a mask pattern as a circuit pattern including a portion which becomes critical on process proximity effect correction (a mask pattern before the process proximity effect correction). On this account, it is not necessary in the next designing to carry out mask pattern correction with respect to the portion which becomes critical on process proximity effect correction once the mask pattern is designed.

Note that, if extraction of critical portion is possible at the stage of process TEG or circuit TEG before the LSI designing, the design rule can be reconsidered, and the first LSI mask data can be reflected. If the process condition and the characteristic target are clarified at the stage of process TEG or circuit TEG, the critical pattern due to the shape can be found in advance by checking all the variations of pattern.

On this account, it is possible to greatly reduce development cost and development period of PPC mask data creation, validation, mask creation, and photo evaluation process.

Further, according to the present embodiment, in the PPC process during the mask pattern correction for setting the resist pattern on the wafer to a desired size in the process of producing mask pattern data for use in manufacturing of a semiconductor element and a liquid crystal element, the rule (numerical condition of parameter; DFM rule) for extracting the critical pattern is determined using a TEG mask including a critical pattern which becomes critical (the process margin in a photo or etching process becomes small) in the PPC process. The critical pattern is then extracted based on the rule.

It is preferable to use a mask including a pattern for extracting at least the four kinds of numerical pattern size (parameter) condition for the H-type crosslinking pattern, the crank-type crosslinking pattern, the ring pattern, and the micro projection pattern as the TEG mask, and the smallest line width and the smallest space are found as a rule (numerical condition of parameter) for extracting a critical pattern.

Further, in the correction method according to the present embodiment, a rule or a model (numerical condition of parameter) for extracting the critical pattern is reflected to the PPC process. For example, the PPC process is carried out with reference to the values of the smallest line width and the smallest space.

On this account, it becomes possible to extract and correct an insecure portion (insecure portion with a critical process margin) which is not able to be detected by the conventional simulation-based validation method. On this account, reproduction of mask and change in layout due to inadequate detection by the conventional simulation validation, which missed out such an insecure portion, are not necessary. This reduces the development cost and the development period.

The method of improving design rule according to the present embodiment reflects the rule (numerical condition of parameter) for extracting a critical pattern to the design rule. On this account, it is possible to greatly reduce the development cost and development period of microfabrication process. Further, the rule (numerical condition of parameter) for extracting a critical pattern can be directly reflected to the next mask data creation.

One Embodiment of the Method

With reference to FIG. 1B, the following explains a mask pattern creation method according to one embodiment.

First, before the user extracts a correction rule (or a model), critical pattern extraction TEG (Test Element Group) mask pattern data is prepared (S0). The TEG mask pattern data includes a pattern which becomes critical on process proximity effect correction (critical pattern) and a pattern which does not become critical on process proximity effect correction. In FIG. 7(a) to FIG. 7(e), and FIG. 8, an example of TEG mask pattern (extraction TEG OPC critical pattern) is shown. Note that, the step S0 also carries out DRC and LVS regarding TEG pattern.

The TEG mask pattern data is a pattern causing risk of line-breakage or short-circuit on the process proximity effect correction. Further, as the pattern which becomes critical on process proximity effect correction and the pattern which does not become critical on process proximity effect correction, the critical pattern extraction TEG mask includes a pattern which cannot be corrected sufficiently by the conventional process proximity effect correction (PPC) (hereinafter referred to as a critical pattern), such as H-type crosslinking pattern, crank-type crosslinking pattern, projection pattern, ring pattern, or a pectinate line and space pattern (short check pattern). The TEG mask pattern data is general-purpose pattern data. More specifically, the TEG mask pattern data is applicable to various kinds of mask pattern data.

In FIG. 7(a) to FIG. 7(e), a concrete example of the pattern which becomes critical on process proximity effect correction included in the PPC model extraction TEG mask is shown. FIG. 7(a) shows a H-type crosslinking pattern, FIG. 7(b) shows a crank-type crosslinking pattern, FIG. 7(c) shows a micro projection pattern, FIG. 7(d) shows a ring pattern, and FIG. 7(e) shows a pectinate line and space pattern (short check pattern).

Preferably, the TEG mask at least includes a H-type crosslinking pattern, a crank-type crosslinking pattern, a projection pattern, and a ring pattern.

Note that, as shown in FIG. 7(a) and FIG. 14(a), the H-type crosslinking pattern at least constituted of a first rectangular section, and two first polygon sections between which the first rectangular section is caught. The two first polygon sections are in contact with the respective two short-length sides of the first rectangular section. The two ends of the respective sides of the first polygon section in contact with the short-length sides of the first rectangular section each extend outward the short-length sides of the first rectangular section. Further, as shown in FIG. 7(b) and FIG. 14(c), the crank-type rectangular pattern at least constituted of a second rectangular section, two second polygon sections (rectangular sections in this example) between which the second rectangular section is caught and another section. One side of the two second polygon sections are in contact with the respective two short-length sides of the second rectangular section. One end of the respective sides of the second polygon sections in contact with the short-length sides of the second rectangular section each extend outward the short-length sides of the second rectangular section, to be opposite to each other with respect to the second rectangular section. Further, as shown in FIG. 7(c) and FIG. 14(e), the projection pattern at least constituted of a rectangular projection section and a polygon main body in contact with one of the short-length sides of the projection section. Two ends of the side of the polygon main body in contact with the short-length side of the projection section each extend outward the short-length side of the projection section. As shown in FIG. 7(d), the ring pattern is a pattern having a rectangular opening.

As a critical shape pattern, the TEG mask includes the first and second critical shape pattern groups. The first critical shape pattern group consists of a plurality of patterns, each of which includes a critical shape (such as a H-type crosslinking pattern, a crank-type crosslinking pattern, or a micro projection pattern) easily causing line-breakage. The plurality of patterns are varied only in line width, and may cause line-breakage on process proximity effect correction when their line widths are excessively narrow. Further, the second critical shape pattern group consists of a plurality of patterns, each of which includes a critical shape (such as a ring pattern, a pectinate line and a space pattern) easily causing short-circuit. The plurality of patterns are varied only in space, and may cause short-circuit on process proximity effect correction when their spaces are excessively small.

Next, wafer evaluation is performed with an extraction TEG (S1), extraction of critical pattern extraction rule (or a model) and correction rule (or a model) is performed based on the wafer evaluation result (S2), and extraction of critical pattern is performed based on the critical pattern extraction rule using a DRC tool (S3). In this case, the steps S1 and S2 are basically carried out once, and the rule extracted in the step S2 is used for the various LSIs. Note that, the rule extraction method in the step S2 will be explained later as an example of a H-type crosslinking pattern with reference to FIG. 23 (a). Further, the DFM rule related to the step S3 will be explained later in FIG. 14, FIG. 15, and FIG. 16(a) to FIG. 16(c).

First of all, in the steps S1 and S2, a mask is actually created in accordance with the TEG mask pattern data, and wafer evaluation of this mask is performed under a required process (S1). More specifically, with a TEG mask including the first critical shape pattern group and the second critical shape pattern group, a resist formed on a wafer (substrate) is exposed under exposure condition of the said process. The resist is then developed under the required development condition, and a circuit material is etched using the developed resist. Next, with a scanning electron microscope (SEM), the user captures an image of a plurality of resist patterns obtained by the exposure and development and a plurality of etched circuit material patterns, and checks occurrence of line-breakage of the resist in the first critical shape pattern, and occurrence of short-circuit of the resist in the second critical shape pattern (wafer evaluation).

The TEG mask used for creation of correction rule preferably includes at least one of (1) a plurality of H-shape crosslinking patterns; (2) a plurality of crank-type crosslinking patterns; (3) a plurality of projection pattern; and (4) a plurality of ring patterns. In each of the H-shape crosslinking patterns, at least one of values of $L1$, $W1$, $l1$, and $w1$ is varied within a range including a boundary value so that at least one of boundary values of $L1$, $W1$, $l1$, and $w1$ can be found as the numerical parameter condition. $L1$ expresses a size of the first polygon section along the longitudinal direction of the first rectangular section, $W1$ expresses a size of the first polygon section along the width of the first rectangular section, $l1$ expresses a length of the first rectangular section, and $w1$ expresses a width of the first rectangular section. In each of the crank-type crosslinking patterns, at least one of the values of $L2$, $W2$, $l2$, and $w2$ is varied in a range including a boundary value so that at least one of boundary values of $L2$, $W2$, $l2$, and $w2$ can be found as the numerical parameter condition. $L2$ expresses a size of the second polygon section along the longitudinal direction of the second rectangular section, $W2$ expresses a size of the second polygon section along a width of the second rectangular section, $l2$ expresses a length of the second rectangular section, and $w2$ expresses a width of the second rectangular section. In each of the projection patterns, at least one of the values of $L3$, $W3$, $l3$, and $w3$ is varied in a range including a boundary value so that at least one of boundary values of $L3$, $W3$, $l3$, and $w3$ can be found as the numerical parameter condition. $L3$ expresses a size of the main body along the longitudinal direction of the projection section, $W3$ expresses a size of the main body along the width of the projection section, $l3$ expresses a length of the projection section, and $w3$ expresses a width of the projection section. In each of the ring patterns, each of the width of the portion extending along the first direction of the ring portion and the width of the portion extending along the second direction of the ring portion orthogonal to the first direction is constant, and at least one of the values of $L4$, $W4$, $l4$, and $w4$ is varied in a range including a boundary value so that at least one of boundary values of $L4$, $W4$, $l4$, and $w4$ can be found as the numerical parameter condition. A long width $l4$ expresses the longer one of the width of the portion extending along the first direction of the ring portion and the width of the portion extending along the second direction of the ring portion orthogonal to the first direction. A short width $w4$ expresses the shorter one of the width of the portion extending along the first direction of the ring portion and the width of the portion extending along the second direction of the ring portion orthogonal to the first direction. L4 expresses a size of the opening along the long width. W4 expresses a size of the opening along the short width. More preferably, the TEG mask includes all of (1) to (4).

As shown in FIG. 16(c), the TEG mask may be a mask including a plurality of micro projection patterns with varied values of A3, B3, l3, and w3 in which a size of the main body along the longitudinal direction of the projection section is 1.0 μm, where A3 and B3 express a size of the main body along the width of the projection section, l3 expresses a length of the projection section, and w3 expresses a width of the projection section.

An examples of the TEG mask may be a mask resulted from PPC process of the mask shown in FIG. 7(a) to FIG. 7(e) in which the size parameters are varied. FIG. 9(a) to FIG. 9(j) show ten patterns extracted from actual LSI patterns having been through the PPC process. These patterns belong to the ring pattern group of (4) above. More specifically, the critical patterns included in this mask are mixed types of the (4) ring pattern, and either of the (1) H-type crosslinking pattern or the (2) crank-type pattern. The mask in this example includes a plurality of patterns (n patterns) with varied values of L, W, l, and w on the type basis (10×n in total). It should be noted that this is a concrete example. Each pattern size value ((L. W, l, w) is regulated by the process accuracy and the design rule. Since the constant number to be found is a boundary value of line-breakage or short-circuit, it automatically is a value in the vicinity of the lower limit of the design rule and the minimum value of the line or the space. Therefore, the TEG pattern is created with varied pattern sizes in a range around the foregoing value and includes the minimum value.

Next, the user or the system determines a critical pattern extraction rule according to the check result of S1 (wafer evaluation result) (S2). The critical pattern extraction rule is numerical parameter condition which causes a pattern to be critical when the pattern is subjected to process proximity effect correction. In this example, the critical pattern extraction rule includes numerical line-width condition such that "the line-width is not less than the lower limit" with which line-breakage may occur on process proximity effect correction, and numerical space condition such that "the space is not less than the lower limit" with which short-circuit may occur on process proximity effect correction.

For the H-type crosslinking pattern of FIG. 7(a), the critical pattern extraction rule is set such that "the length l1 and the width w1 of the first rectangular section satisfy the following inequality".

$$l1 < 280 \text{ nm} - 2 \times ES(l1j)$$

$$w1 < 240 \text{ nm} - 2 \times ES(w1j)$$

ES(l1j) and ES(w1j) respectively indicate estimated etching shift amounts (amount of size variation due to the etching shift) of the length l1 and the width w1 of the first rectangular section of the H-type crosslinking pattern. As described above, ES(l1j) and ES(w1j) are found by back calculation. l1j and w1j are variables of etching shift dependant on the space to the proximal pattern and the pattern density in the neighborhood.

ES(l1j) and ES(w1j) can be found by a rule. If a rule is applied, the ES(l1j) and ES(w1j) are several discontinuous constituents. Functions or models may be applied instead of the rule.

Further, for the opened rectangular pattern shown in FIG. 7(d), the critical pattern extraction rule is set such that "the length l4 and the width w4 of the third rectangular section satisfy the following inequality".

$$l4 < 280 \text{ nm} - 2 \times ES(l4j)$$

$$w4 < 240 \text{ nm} - 2 \times ES(w4j)$$

The opened rectangular pattern is a line-breakage risk pattern at least constituted of a third rectangular section and two third polygon sections (rectangular sections in this example) between which the third rectangular section is caught. One side of the two third polygon sections are in contact with the respective two short-length sides of the third rectangular section. One end of the respective sides of the third polygon sections in contact with the short-length sides of the third rectangular section each extend outward the short-length sides of the third rectangular section. The ends extend outward are opposed without having the third rectangular section inbetween.

As shown in FIG. 7(b), for the crank-type crosslinking pattern, the critical pattern extraction rule is set such that "the length l2 and the width w2 of the second rectangular section satisfy the following inequality".

$$l2 < 280 \text{ nm} - ES(l2j)$$

$$w2 < 240 \text{ nm} - 2 \times ES(w2j)$$

Further, as shown in FIG. 7(c), for the projection pattern, the critical pattern extraction rule is set such that "the length l3 and the width w3 of the third rectangular section satisfy the following inequality".

$$l3 < 280 \text{ nm} - ES(l3j)$$

$$w3 < 240 \text{ nm} - 2 \times ES(w3j)$$

Further, the user or the system determines a critical pattern extraction rule according to the check result of S1 (wafer evaluation result) (S2). In this step, the user or the system first determines, for each shape of the first critical shape pattern, a minimum line width "Wmin" with which line-breakage of the first critical shape pattern is prevented after process proximity effect correction according to the check result of S1 (wafer evaluation result). More specifically, the minimum line width "Wmin" to be found is not a single number but a group of plural rules which number is equal to the number of all possible combinations of the shape of the first critical shape pattern and the corresponding minimum line widths "Wmin". The minimum line width "Wmin" is found for each shape of the first critical shape pattern. For example, it is found as "Wminh" in the H-type crosslinking section, and found as "Wminc" (different from "Wminh") in the crank-type. Further, the user or the system determines, for each shape of the second critical shape pattern, a minimum space "Smin" with which short-circuit of the second critical shape pattern is prevented after process proximity effect correction according to the check result of S1 (wafer evaluation result). Also in this case, the minimum space "Smin" to be found is not a single number but a group of rules which number is equal to the number of all possible combinations of the shape of the second critical shape pattern and the corresponding minimum space "Smin". The minimum space "Smin" is found for each of the second critical shape pattern. For example, it is found as "Sminr" in the ring section, and found as "Smins" (different from "Sminr") in the short-check-type pattern portion. Next, the user or the system creates a first correction rule (correction rule for preventing line-breakage) based on the minimum line width "Wmin" (rule) found for each shape of the first critical shape pattern, and also creates a second correction rule (correction rule for preventing short-circuit) based on the minimum space "Smin" (rule) found for each type of the second critical shape pattern. The first and second correction rules are stored in a correction rule storage section. The first correction rule is not a single number but a group of plural rules of "the line width of the first critical shape pattern of the mask is not less than the minimum line width "Wmin"" which number is equal to the number of the shapes. For example, the first correction rule includes, regarding the H-type crosslinking pattern (H-type crosslinking section), a correction rule "the minimum line width is not less than Wminh in the H-type crosslinking pattern portion of the mask when L is equal to or less than α", and, regarding the crank-type crosslinking pattern, a correction rule "the minimum line width is not less than Wminc in the crank-type crosslinking pattern portion of the mask when L is equal to or less than α". The second correction rule is not a single number but a group of plural rules of "the space of the second critical shape pattern of the mask is not less than the minimum space Smin" for each of the critical shape pattern, which number is equal to the number of the shapes of the second critical pattern. For example, the second correction rule includes, regarding the ring pattern, a correction rule "the minimum space is not less than Sminr in the ring pattern portion of the mask when Ls is equal to or less than β", and, regarding the short-check-type pattern, a correction rule "the minimum space is not less than Smins in the short-check-type pattern portion of the mask when Ls is equal to or less than β".

The following explains a method of the step S2 for extracting the first correction rule and the second correction rule according to the measurement result of PPC model extraction TEG.

Typically, the TEG pattern having respective parameter sizes of the critical pattern (L, W, l, and w in this case) are first subjected to wafer evaluation, and the respective parameters satisfying the process spec (including the process margin) are associated with wafer evaluation results. For example, this may be realized as a rule which is constituted of functions or tables. In this manner, the first correction rule and the second correction rule are created (calculated) as correction formulas of specific values.

For example, the created first correction rule (equation rule) is a rule for specifying the line width and length, which is set such that, assuming of a 130 nm flash MR layer, "a pattern in which the line width W (w1, w2, w3, w4, or w5; see FIG. 3(a) to FIG. 3(e)) is constant, and the length of the straight line section (l1, l2, l3, l4, or l5; see FIG. 3(a) to FIG. 3(e)) is L satisfies L≧280 nm−a×ES (lij) (i is an integer ranging from 1 to 5; a=2 in the case where i=1, i=4, or i=5, a=1 in the case where i=2, or i=3) or W≧240 nm−2×ES (wij)" (see FIG. 14). Note that, the line width/length rule is more commonly expressed as:

$L \geq \alpha - a \times ES(lij)$ or $W \geq \beta - b \times ES(wij)$ where α and β are process inherent values. α and β may be found by using a table showing a relationship between a combination of L and W and wafer evaluation result (Good or NG).

This line width/length rule may be added to the design rule as a DFM rule shown in the table of FIG. 17. ES (lij) and ES (wij) denote etching shift amounts, l1j and w1j are variables of etching shift dependant on the space to the proximal pattern and the pattern density in the neighborhood. i denotes a type out of (a) to (e). j denotes a rule or a model dependant on the proximal pattern and the pattern density in the neighborhood.

Figure 15:
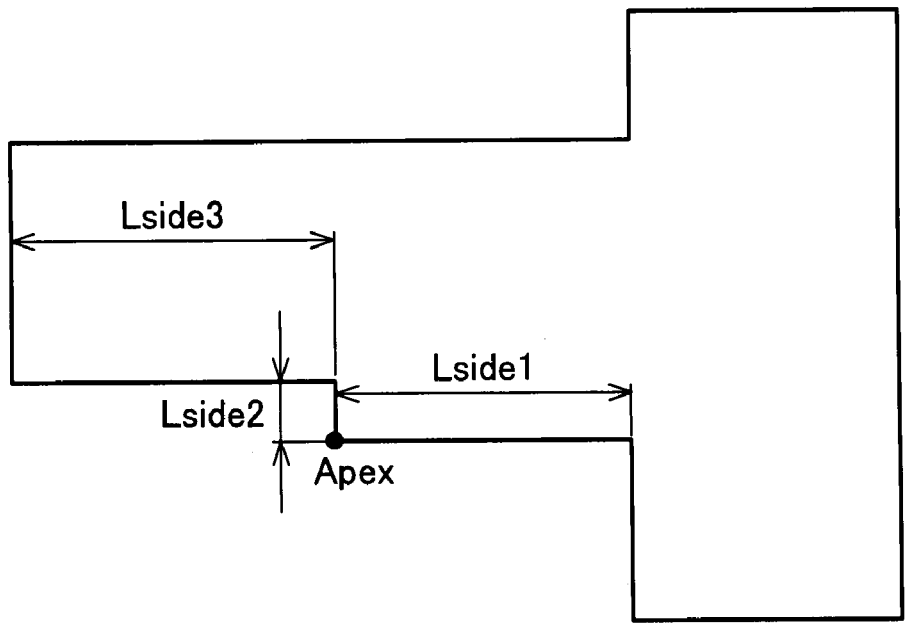
FIG. 15 is a drawing showing a micro level-difference rule as a concrete example of DFM rule.

In the case of the 130 nm flash MR layer, the created first correction rule (equation rule) may be a micro level-difference rule such that "at least one of the two sides connected to an arbitrary apex is not less than 180 nm−ES (Lsn)" (see FIG. 15). Note that, this micro level-difference rule is more commonly expressed as:

$Lside1 \geq \gamma - ES(lsn)$ or $Lside2 \geq \sigma - ES(lsn)$ where γ and σ are values dependent on the process or PPC, or relative values to Lside 3.

ES (Lsn) denotes an etching shift amount of the length L side 1 and L side 2 connected to an arbitrary apex. As with ES (l1j) and ES (w1j), ES (Lsn) is found by back calculation. Lsn is a variable of etching shift dependant on the space to the proximal pattern and the pattern density in the neighborhood.

In FIG. 17, ES(L1ij) and ES(L2ij) denote etching shift amounts, and i denotes a type out of (a) to (e). l1j and w1j are variables dependent on the space to the proximal pattern and the pattern density in the neighborhood. j denotes a rule or a model dependant on the proximal pattern and the pattern density in the neighborhood.

Each of the micro level-difference patterns shown in FIGS. 16(a) and (b) is a pattern in which a straight-line portion with a constant line width A is coupled with a polygon whose size along the width of the straight-line portion is longer than the straight-line portion. One or both ends of an elementary part (an end coupled with the rectangular section) of the straight-line portion is provided with a rectangular section (level-difference section) having a length LS (a length corresponding to the longitudinal direction of the straight-line portion) and a width WS (a width corresponding to the width direction of the straight-line portion; level-difference value). A degree of depression (the degree of reduction in width of the level-difference section shown in FIGS. 16(a) and 16(b)) on PPC process of a TEG, including a plurality of micro level-difference patterns with varied values of LS, WS, and A, each of which has the foregoing structure, is evaluated. In this way, a condition with a non-critical result can be extracted as a micro level-difference rule. The way of varying LS, WS, and A may be such that LS is varied with a 5 nm interval in a range of 20 to 200 nm, WS is varied with a 5 nm interval in a range of 5 to 50 nm, A is set to 180 nm, and S (space not shown) is set to 500 nm. The micro level-difference rule may be added to a design rule as a DFM rule.

Further, the created second correction rule may be a simple rule such as a rule "the line width of the amendment portion is limited to 90 nm or greater (in view of mask processing accuracy)".

Further, the extraction method of the second correction rule "the space of the critical pattern of the mask is set to be larger than the minimum space" according to the measurement result of the PPC model extraction TEG mask including a ring pattern, a short-check-type pattern or the like is similar to the extraction method of the first correction rule. The second correction rule creates a relational expression based on a condition whether short-circuit occurs with the process spec (including process margin)".

As to specific correction rules, such as a line width rule "the line width of the amendment portion is limited to 90 nm or greater in a H-type crosslinking pattern", a line width/length rule "a pattern in which the line width W is constant, and the length of the straight line section is L satisfies L≧280 nm−a× ES(lij) (i is an integer ranging from 1 to 5; a=2 in the case where i=1, i=4, or i=5, a=1 in the case where i=2, or i=3) or W≧240 nm−2×ES(wij)" (see FIG. 14), or a micro level-difference rule "at least one of the two sides connected to an arbitrary apex is not less than 180 nm−ES(Lsn)" (see FIG. 15), the extraction methods are not specifically explained. The following however explains outline of the methods. In a general PPC process, the mask pattern data after the PPC process is found from the layout design data (circuit pattern data). However, in this example, the size of the PPC pattern is calculated first, and the design pattern (size) for obtaining the size of the PPC pattern is found by back calculation. The calculation method of design pattern is basically the same both in the case of rule-base correction and in the case of simulation-base correction.

In the step S2, the parameter of simulation is modified so as to fit the simulation result to the measurement result based on a comparison between the measurement result of PPC model extraction TEG mask and the simulation result of the PPC model extraction TEG mask pattern data (fitting process). Then, in the process proximity effect correction of the later-described step S6, the simulation is carried out with the modified parameter.

Note that, the correction rule extraction through the steps S0 to S2 is basically required only once for each process applied.

Next, a critical pattern is extracted (S3). More specifically, based on the critical pattern extraction rule obtained by the wafer evaluation of the TEG mask (S2, S3), the portion of the pattern (critical pattern) in which line-breakage or short-circuit is likely to occur in a portion corresponding to the wire portion of the resist when the resist is subjected to exposure and development using a mask having been through the later-described PPC correction (S6) is extracted from the actual LSI design data as uncorrected mask pattern data. DRC and LVS with respect to the LSI design data are carried out immediately before the step S3 or at the time of extraction.

The portion of critical pattern is a region (critical region) in which line-breakage or short-circuit occurs on the PPC correction (critical region). At this time, back calculation is performed based on the PPC model or rule extracted from the TEG wafer result.

Figure 24:
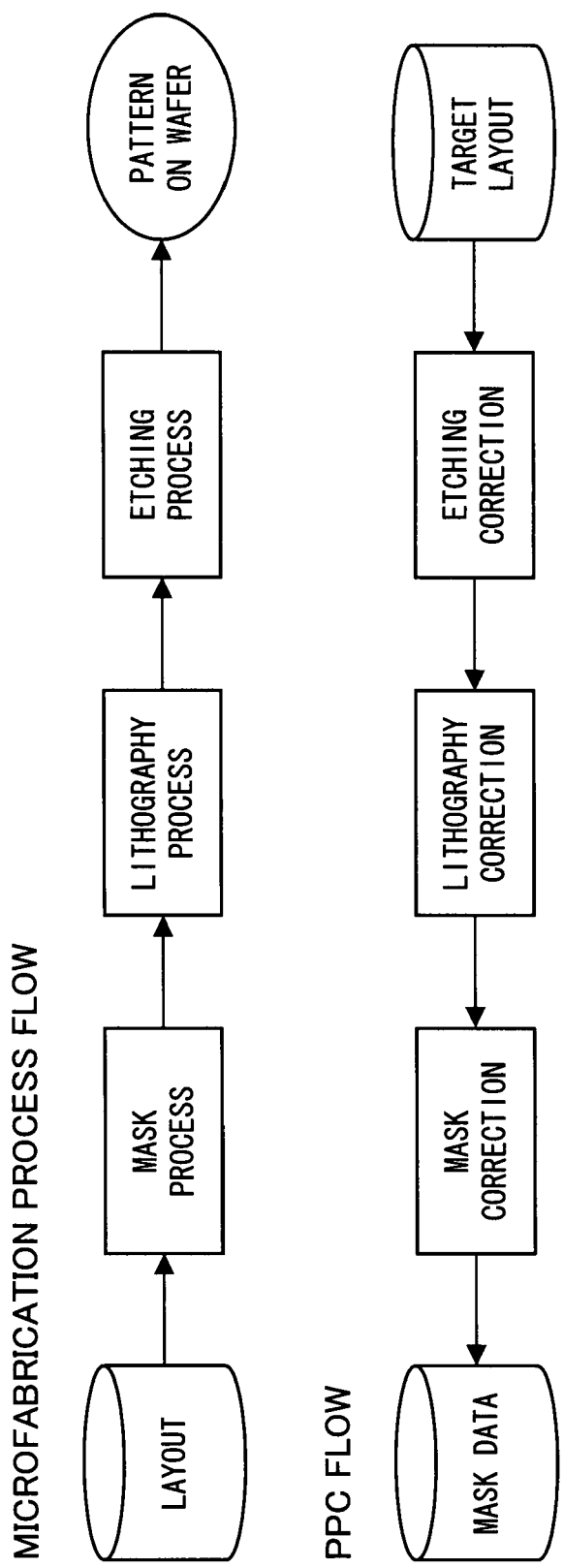
FIG. 24 is a drawing showing an operation flow of process proximity effect correction.
Figure 25:
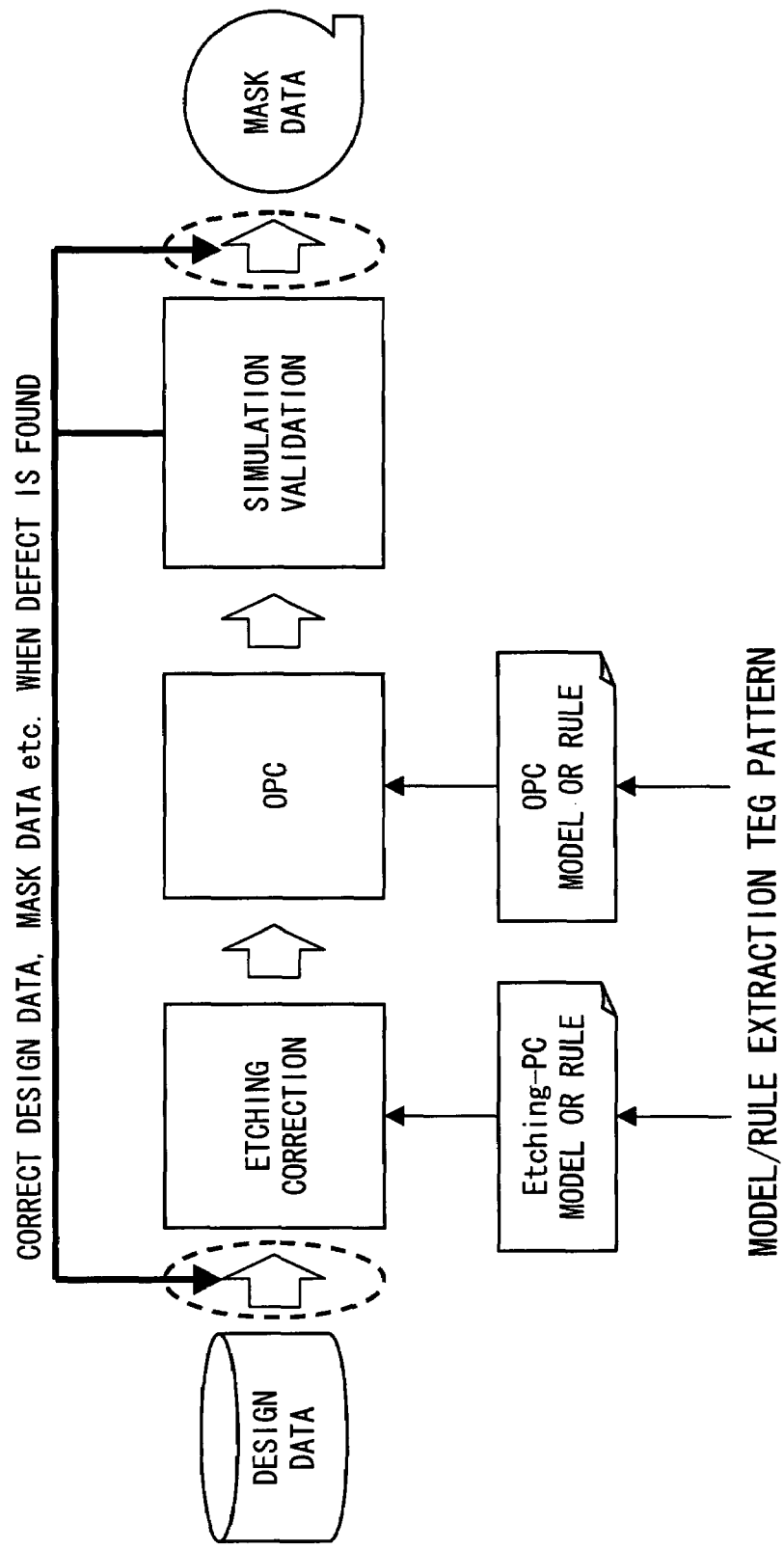
FIG. 25 is a drawing showing a flow of typical conventional PPC process.
Figure 26:
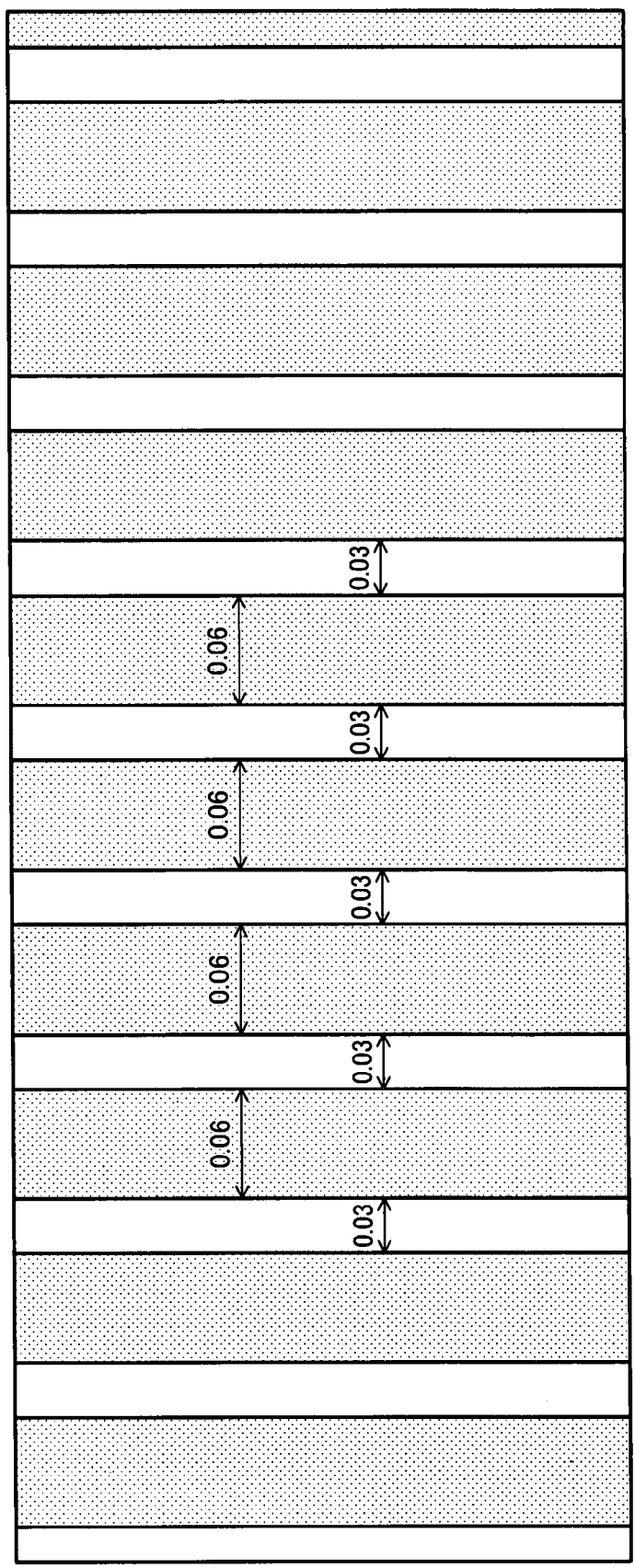
FIG. 26 is a drawing showing another example of model/rule extraction TEG pattern used in a conventional PPC process.
Figure 27:
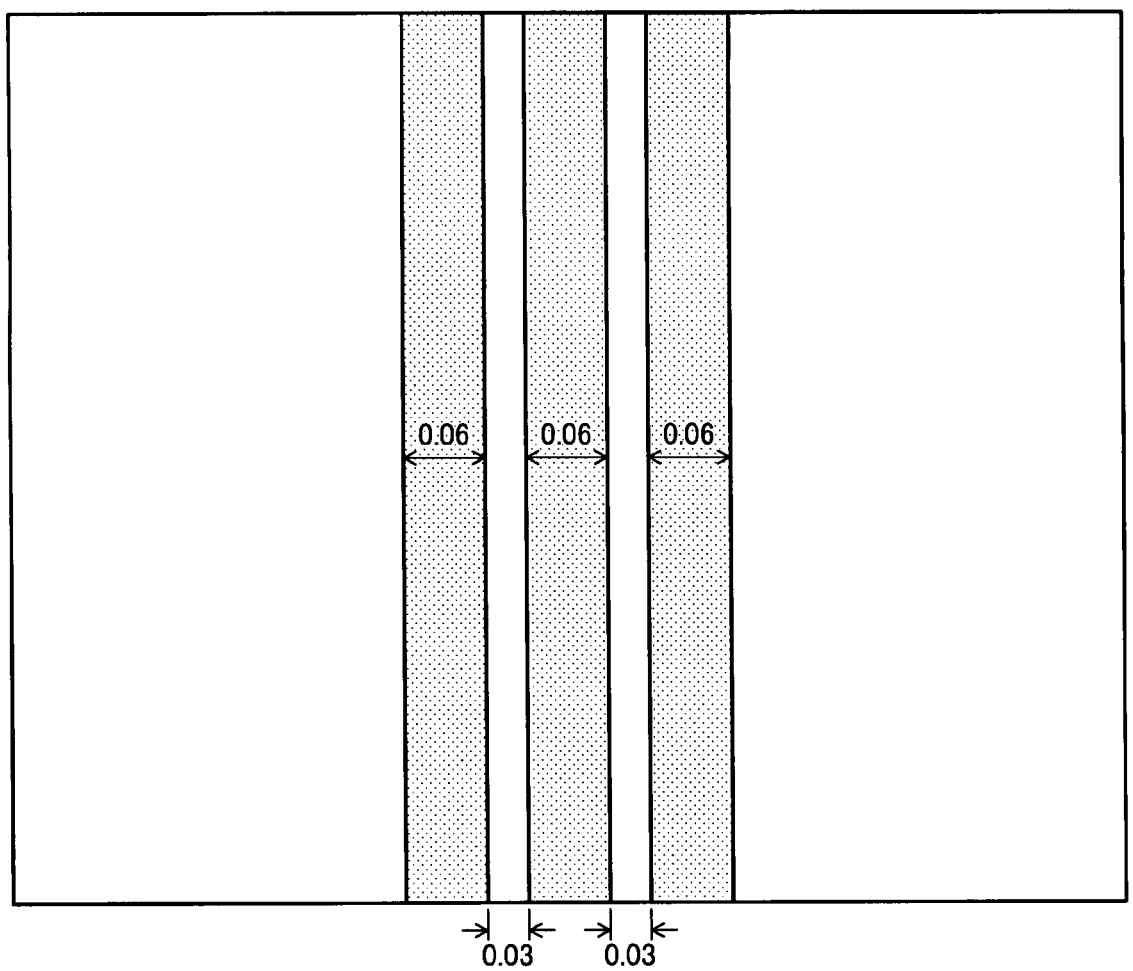
FIG. 27 is a drawing showing still another example of model/rule extraction TEG pattern used in a conventional PPC process.
Figure 28:
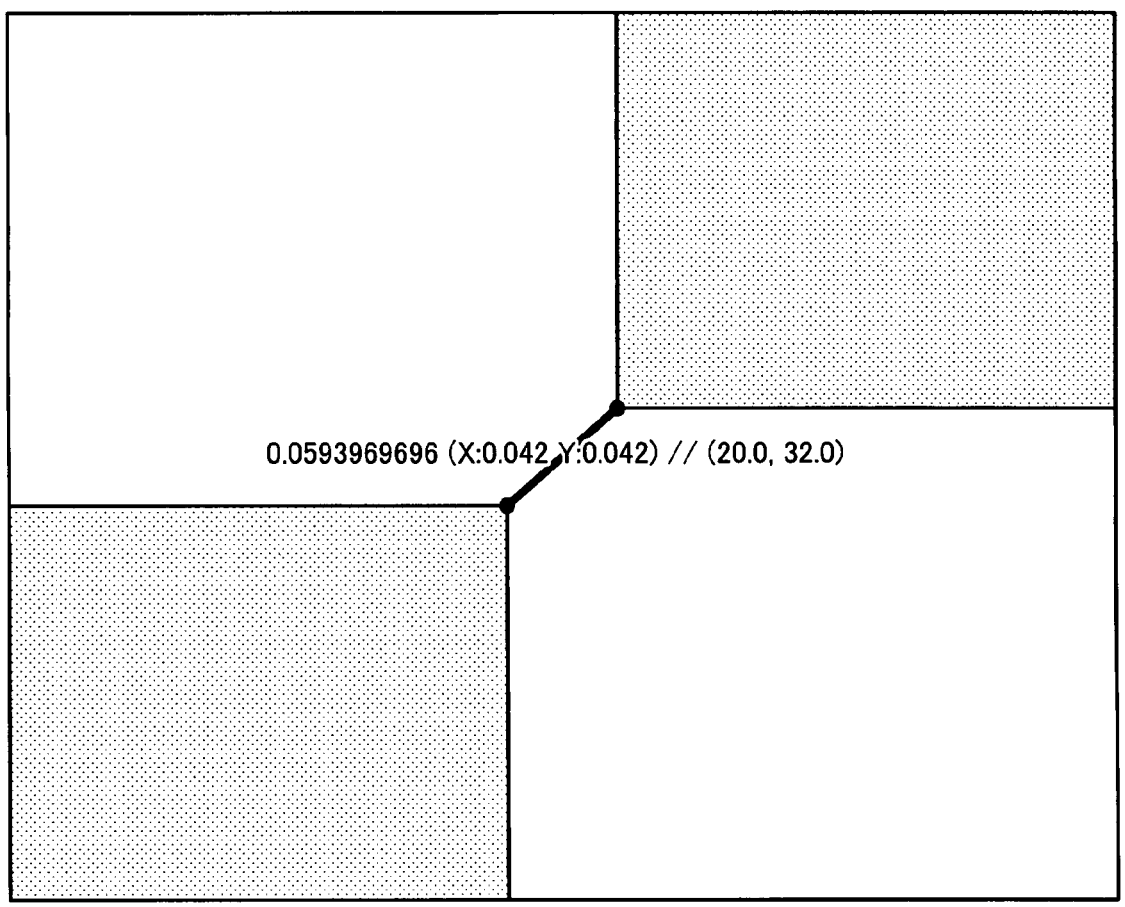
FIG. 28 is a drawing showing yet another example of model/rule extraction TEG pattern used in a conventional PPC process.
Figure 29:
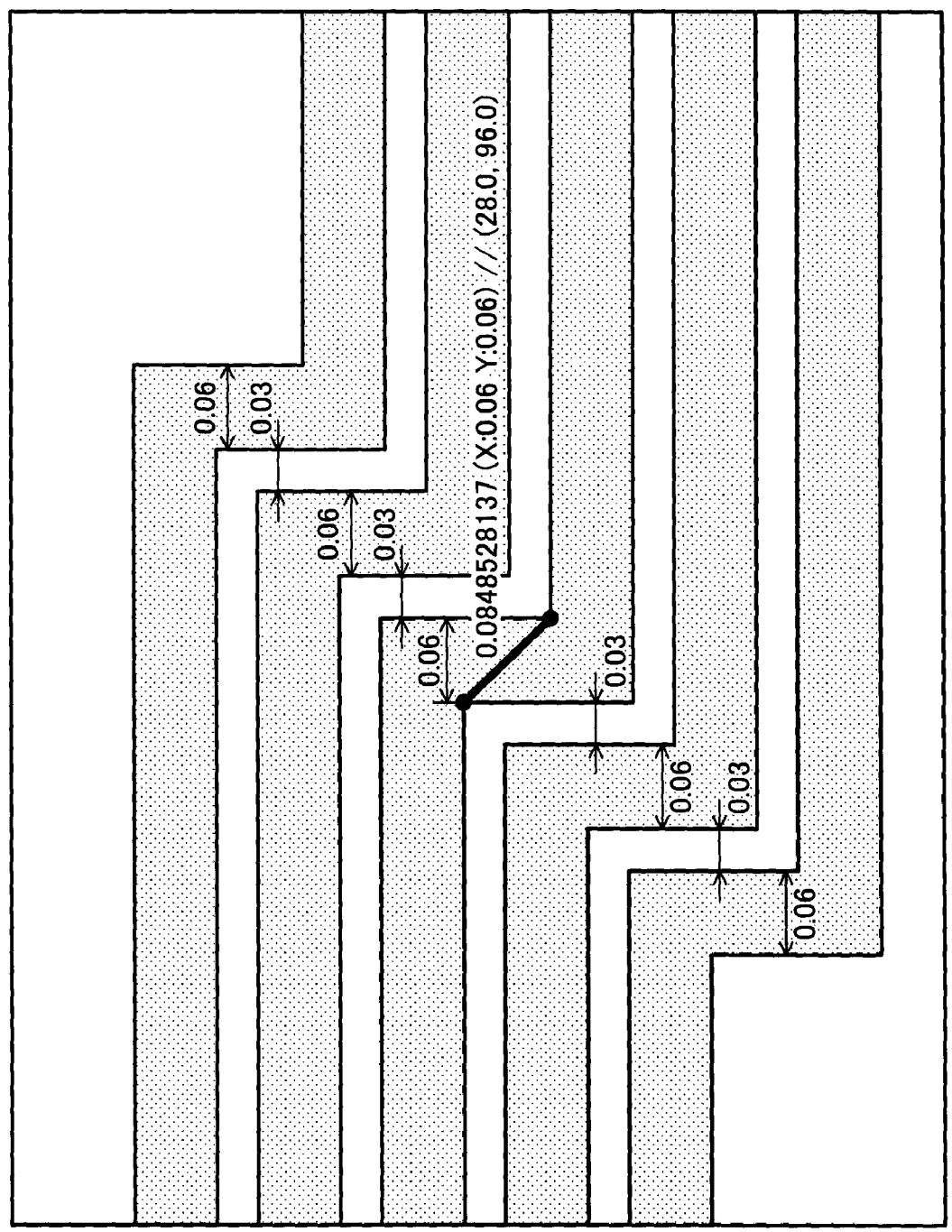
FIG. 29 is a drawing showing still another example of model/rule extraction TEG pattern used in a conventional PPC process.
Figure 30:
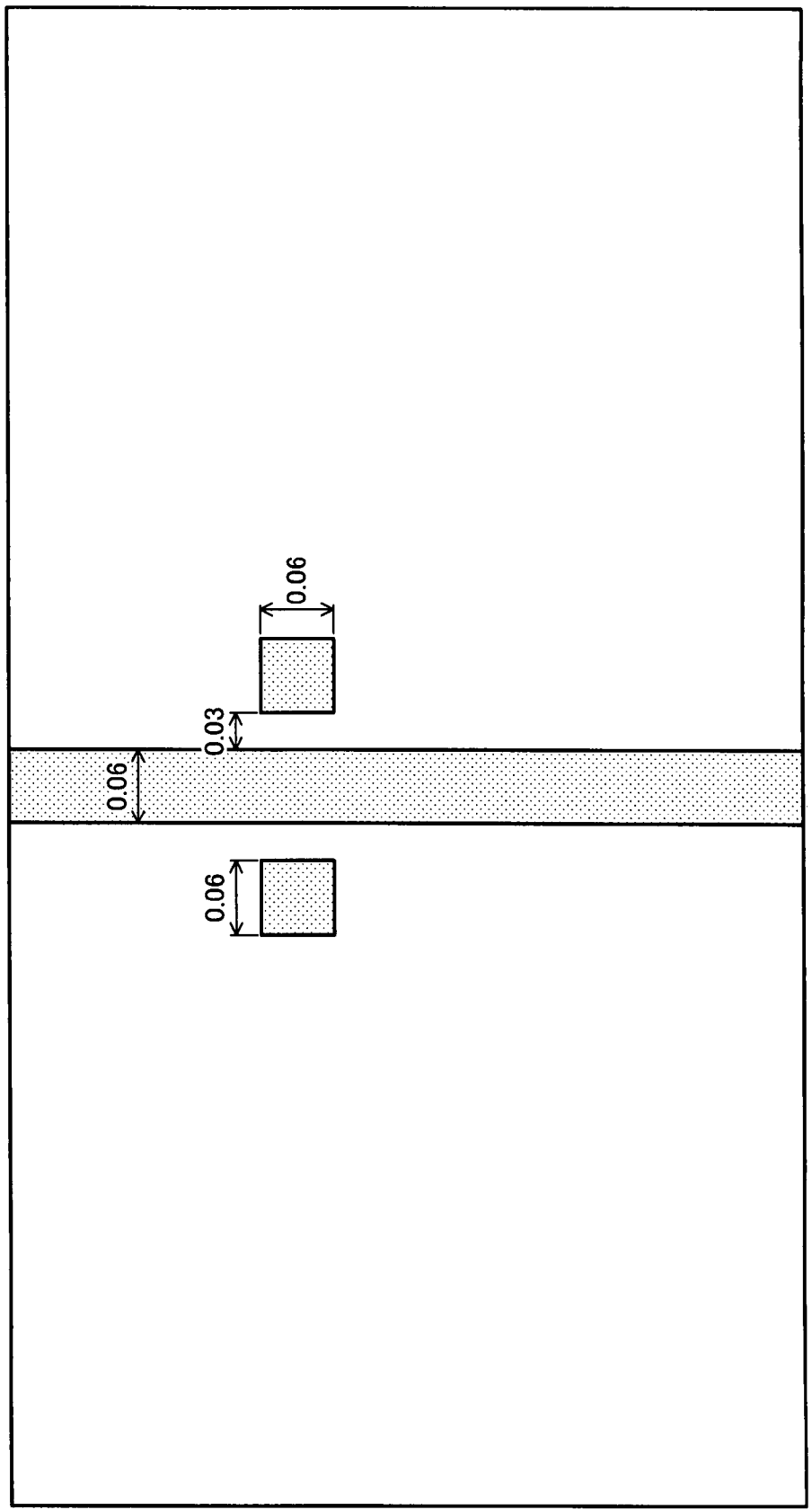
FIG. 30 is a drawing showing yet another example of model/rule extraction TEG pattern used in a conventional PPC process.
Figure 31:
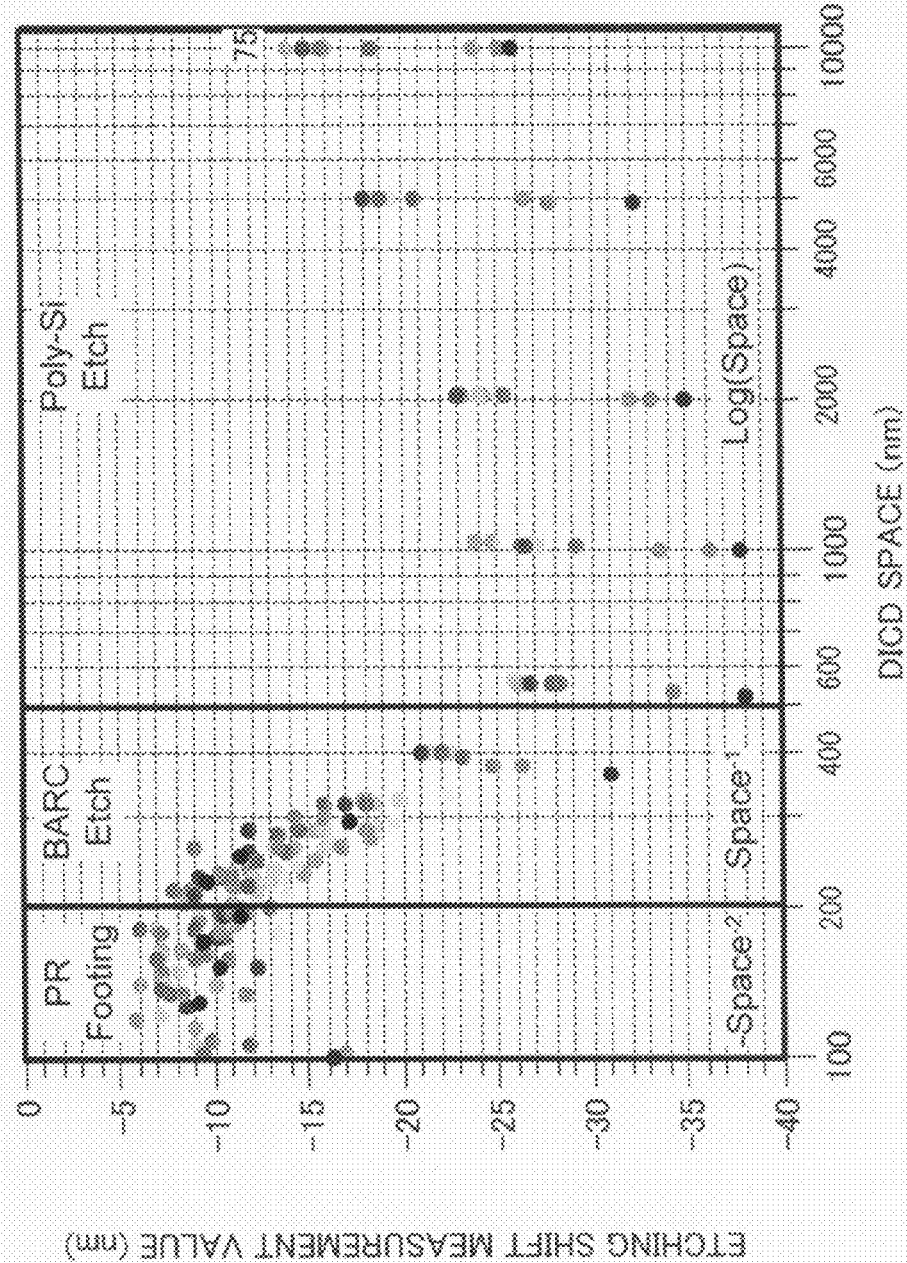
FIG. 31 is a drawing showing a change in etching shift amount dependent on the space to the proximal pattern in a 130 nm process GP layer.
Figure 32:
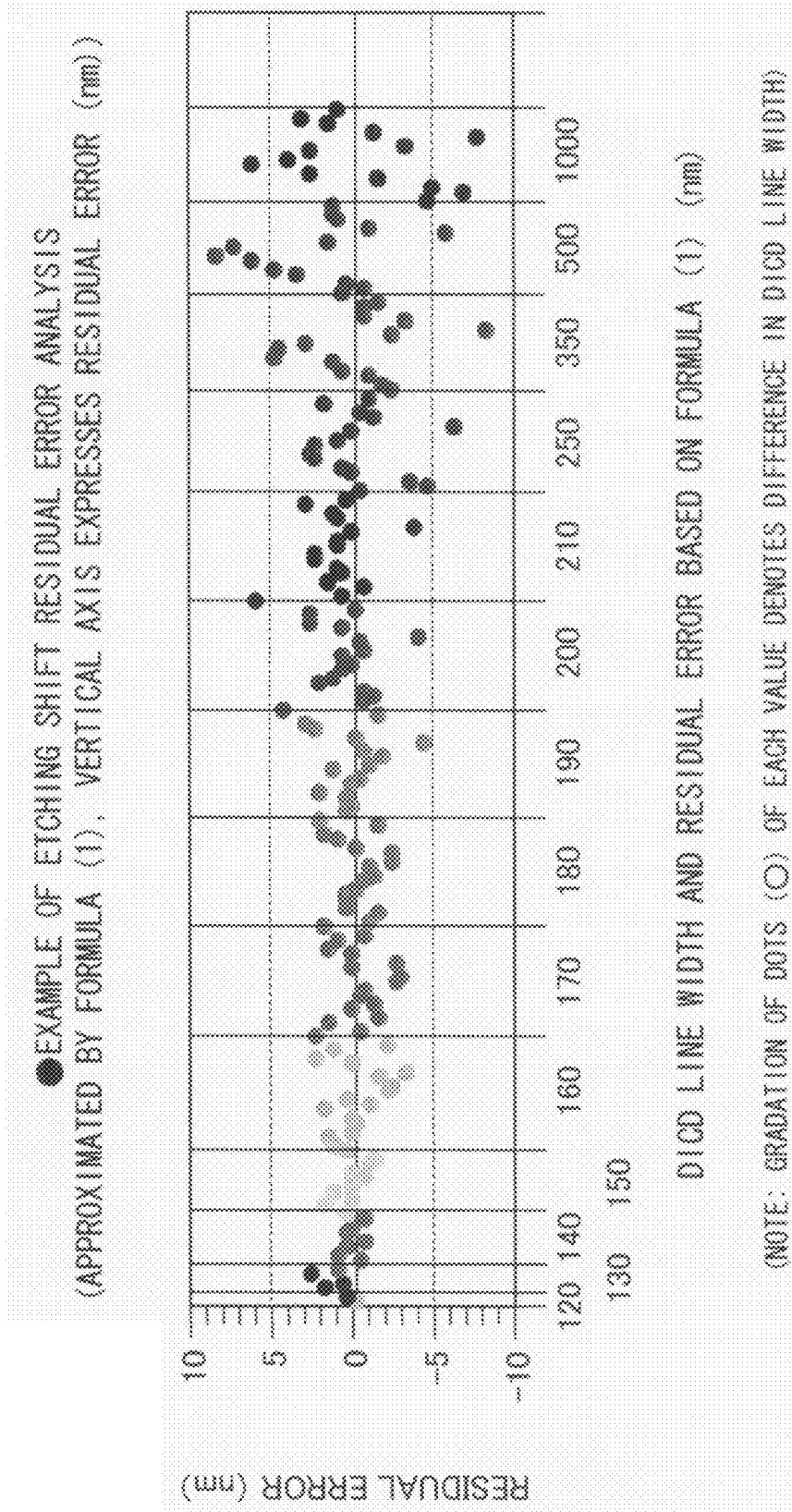
FIG. 32 shows a correspondence between the value of the line width and a measured value (O: graded dots) of the L/S pattern shown in FIG. 31. In this figure, the vertical axis expresses a residual error (nm) approximated by Formula (1).

FIG. 24 shows a concrete example of PPC pattern calculation formula (non-patent Document 2 (a PPC flow of A. Sezginer, F. X. Zach, et al. "Process-window-aware-RET and OPC", SPIE Symposium, San Jose, Vol. 6156, No. 615613, recently completed volumes, 2006). In the existing PPC, the etching shift amount is first found by back calculation, and a PPC pattern is found as a OPC pattern target based on the design layout data through calculation of optical projection image (on a wafer) using the etching shift amount as a OPC pattern target. Since the details of calculation formula is described in the non-patent Document 2, the explanation is omitted here.

In the step S3, the size of PPC pattern is first defined, and the design pattern (size) for obtaining the size of PPC pattern is then found by back calculation. The method of calculating the design pattern is basically the same both in the case of rule-base correction and in the case of simulation-base correction.

Note that, the step S3 is the same as the step of extracting a region requiring the conventional process proximity effect correction (eg. the step of extracting a critical region requiring the process proximity effect correction of Patent Document 8 (Japanese Unexamined Patent Publication Tokukai 2004-354919)). In the present invention, a pattern likely to be critical after the PPC process as shown in FIG. 14, FIG. 15, and FIG. 16(a) to FIG. 16(c) is detected (checked) in advance, and is corrected if necessary. With this method, the problem of line-breakage or short-circuit after the PPC process, after the mask creation, after the photo process, or after the etching can be eliminated.

The extraction of the critical pattern in the step S3 can be carried out at full-chip level using a CAD tool ((DRC: Design Rule Check) tool) or the like. More specifically, in the case of extracting a H-type crosslinking pattern or a crank-type crosslinking pattern, the extraction is performed by first extracting all micro rectangular polygons in which the long-side length L satisfies 280 nm−2×ES (l1$j$) and the short-side length W satisfies 240 nm−2×ES (w1$j$), and then detecting all micro rectangular polygons among them in which the two opposed sides are in contact with larger polygons while the other two sides are not in contact with the larger polygons. However, in the case of a micro projection, a rectangular in which only one side of those is in contact with a larger polygon while other three are not is detected (see FIG. 14). This detection/extraction is carried out from the mask pattern data of the entire chip using a CAD tool or the like.

Similarly, the micro level-difference rule is found by extracting micro rectangles in which arbitrary sides are not more than 180 nm−ES(Lsn) and then, among the detected micro rectangles, detecting rectangles in which an arbitrary side is not more than 180 nm−ES(Lsn) and the two adjacent sides are in contact with larger polygons while the other two sides are not in contact with the larger polygons (see FIG. 15).

This is a basic pattern, but there are many combinations and modifications of this pattern in the actual LSI. FIG. 9(a) to FIG. 9(j) show layout pattern examples.

Next, judgment is carried out as to whether the LSI design data contains a critical pattern depending on the extraction result of a critical pattern in the step S3 (S4).

If the step S4 finds that the LSI design data contains a critical pattern, the critical pattern in the LSI design data is corrected according to a correction rule determined in the step S3.

Next, the LSI design data, which is an uncorrected mask pattern data, is subjected to process proximity effect correction, and mask pattern data (after the process proximity effect correction) is created (S6). The process proximity effect correction in S6 is preferably performed by a method of determining parameters of simulation or calculation formula used for process proximity effect correction based on the wafer evaluation of a TEG mask including a pattern which is assumed to be critical after the process proximity effect correction using the later-described empirical fitting model, and carrying out process proximity effect correction using simulation or calculation formula with the parameters. With this method, process proximity effect correction can be performed with high accuracy. On this account, the steps S2 to S5 may be omitted.

Next, the first validation is performed by checking correction size accuracy (checking whether the error of the target value is within the range of spec) with respect to the mask pattern data after the process proximity effect correction, which is obtained in S6 (S7). A publicly-known validation method can be used for this validation. There are two kinds of publicly-known validation method. One method is called CAD validation which determines the presence of defect portion (shortage or extra, micro line or slit) in comparison (finding the difference) with the data before the PPC process. Another method is called simulation validation which carries out simulation at full-chip level, calculates the resist pattern, and checks an error of the target size, defocus, or size variation (margin) under variation of exposure amount.

This may also be performed effectively by detecting a pattern, which is assumed to be critical on the PPC process according to the first critical pattern extraction rule (for preventing line-breakage) extracted by the foregoing TEG, from the PPC pattern having been through the process proximity effect correction, and checking the presence of a portion which becomes critical on the PPC process. More specifically, in the case of a PPC pattern having been through the process proximity effect correction, for example, in the case of a H-type crosslinking pattern or a micro projection pattern, any polygon not more than wHUL in width and not less than lHUL in length is extracted. Among the extracted polygons, a first critical pattern (for preventing line-breakage) is detected. The first critical pattern has a structure such that the two opposed sides are in contact with other larger polygons while the other two sides are not in contact with the larger polygons, or such that only one side of those is in contact with another larger polygon while other three are not. This step is the same also for a crank pattern or other patterns.

Further, this may also be performed effectively by detecting a pattern, which is assumed to be critical on the PPC process according to the second critical pattern extraction rule (the second critical pattern for preventing short-circuit) extracted by the foregoing TEG, from the PPC pattern having been through the process proximity effect correction, and checking the presence of a portion which becomes critical on the PPC process.

In this case, the block for carrying out the step of S7 may be structured such that some kind of indication (flag, polygon etc.) of a defect portion detected by the publicly-known method or extracted according to the critical pattern extraction rule based on the wafer evaluation of the TEG mask is added to the mask pattern data after the process proximity effect correction, which is transmitted to the block performing the step S8, the block performing the step S9, or to the display device as another layer of design stream data. This is to efficiently perform the steps of the next determination process (S8) and correction process (S9). However, if the determination standard, the correction procedure, and the rule are appropriately set, automatic operation by a CAD tool or the like is possible.

For the defect portion detected by the CAD validation or the simulation validation in the foregoing validation process (S7), second validation is generally carried out at the same time of extraction so as to check whether the process margin is equal to or more than the reference value. Necessity of correction is determined according to the result of the first validation (S7) and the result of this second validation. More specifically, the necessity of correction is determined depending on whether the error is within the spec or the process margin is equal to or greater than the reference value. Note that, the validation (correction validation) is divided into the first validation and the second validation in this example for the sake of convenience. The first validation and the second validation may be carried out at the same time, or sequentially in a desired order.

According to this determination result, the next pattern correction process (S9) is carried out.

Next, pattern data correction is carried out (S9) with respect to the defect portion where correction is regarded necessary according to the determination result of the foregoing determination step (S8). Various methods may be applied to the pattern correction depending on the validation method of the PPC data validation process (S7).

For example, in the case of carrying out validation by CAD validation or simulation validation in the PPC data validation process (S7), the pattern correction can be carried out according to the CAD validation result and the simulation validation result of the PPC data validation process (S7). In this case, if a pattern whose process margin is not satisfying the spec is found by the simulation validation, the pattern pitch is increased or an auxiliary pattern is added to improve the process margin, thereby satisfying the spec.

Further, in the case of carrying out validation in the PPC data validation process (S7) according to the first critical pattern extraction rule (causing line-breakage) or the second critical pattern (causing short-circuit) extracted by the foregoing TEG, the correction is carried out with respect to a portion (critical pattern) satisfying the first critical pattern extraction rule (causing line-breakage) of the pattern data after the PPC process by satisfying the first correction rule initially found in the extraction TEG (S2). Further, a portion satisfying the condition of the second critical pattern (causing short-circuit) is corrected by satisfying the second correction rule initially found in the extraction TEG (S2).

Next, the user creates a mask according to the pattern data (S10).

Finally, the user carries out a wafer evaluation. More specifically, the user exposes a resist formed on the entire plane of the wafer by an exposure device using the created mask, and develops the exposed resist. The user captures an image of resist pattern obtained by development using a scanning electron microscope, and checks whether the resist pattern satisfies the process spec (including the process margin) with reference to the captured image.

The method of the present embodiment produces a mask processed by an appropriate and sufficient PPC process, and therefore the process spec (including the process margin) is achieved at the stage of wafer evaluation (S11). The wafer evaluation (S11) is performed to confirm the effect given by the present invention, more specifically, to check whether the process spec is satisfied. Therefore, the final wafer evaluation (S11) may be omitted.

Note that, in the foregoing method, the step S3 and later steps (extraction and correction based on the critical pattern extraction file, and subsequent PPC) need to be carried out for each LSI and each layer. Further, the design rule may be improved (DFM) based on the critical pattern extraction file. In this case, the critical pattern is excluded from the design rule in improvement of design rule, and the steps S3 to S5 are not necessary.

Though the present embodiment explained a method which requires critical pattern extraction (S4) and correction (S5) according to critical pattern extraction rule based on the photo evaluation result before the process proximity effect correction (S6). However, as described, the extraction and correction of critical pattern according to a critical pattern extraction rule based on photo evaluation result may be carried out after the process proximity effect correction. Therefore, the extraction and correction of critical pattern according to a critical pattern extraction rule based on wafer evaluation result may be carried out after the process proximity effect correction.

With reference to Figures, the following explains a concrete example of a mask pattern creation method according to the foregoing embodiment. Note that, the following explains an example using a positive type photoresist. However, the method of the present embodiment can be carried out by the same manner using a negative type photoresist.

As a concrete example of mask pattern creation method according to the foregoing embodiment, this example shows a concrete example of PPC process (model base) in a 130 nm process of creating a flash MR layer (a process of forming a circuit pattern 130 nm in minimum line width.

(Conventional PPC Model Extraction TEG Mask Pattern)

Figure 8:
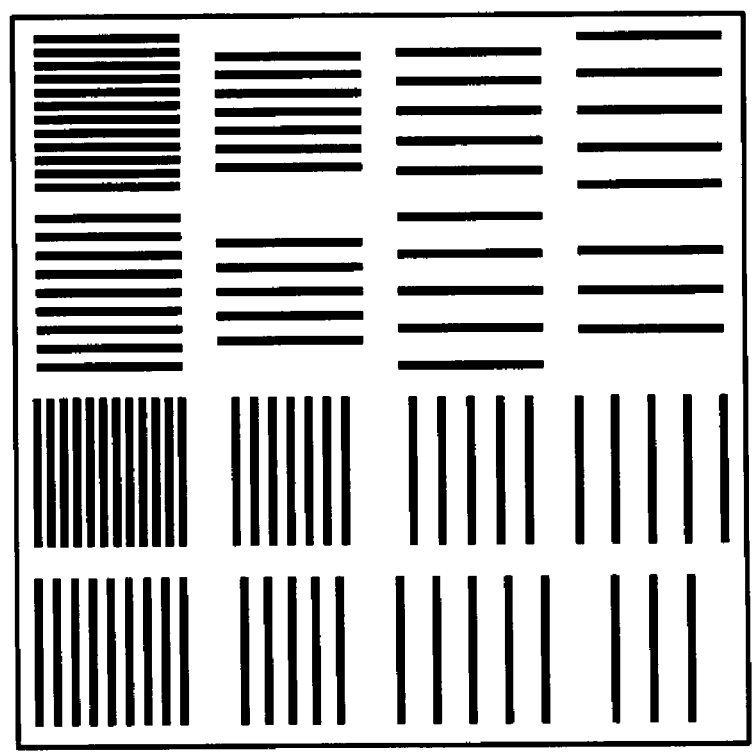
FIG. 8 is a drawing showing a concrete example of PPC model extraction TEG pattern (conventional method).
Figure 22:
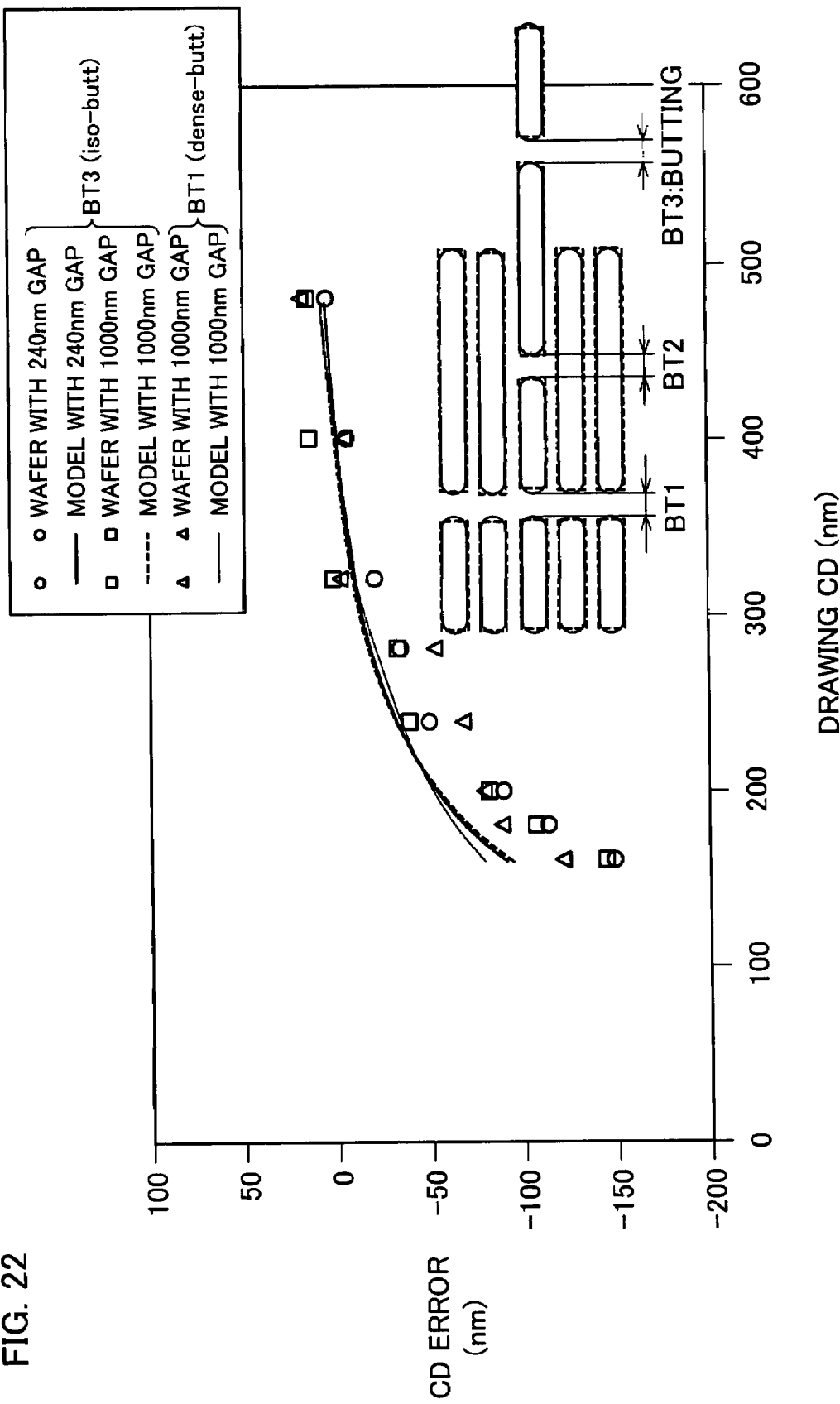
FIG. 22 is a drawing showing a concrete example (L/S density) of line-terminal butting pattern.

FIG. 8 shows a concrete example of a conventional PPC model extraction TEG mask pattern. This is used for L/S (line and space) type layer (L/S pattern wire layer), and is constituted of a density dependency evaluation pattern, a line width linearity evaluation pattern, a line-terminal butting pattern etc. The line-terminal butting pattern is a plurality of patterns with gaps in which a single or plural line ends of one of the patterns is opposed to a single or plural line ends of another pattern with a gap therebetween. FIG. 22 shows a concrete example of line-terminal butting pattern.

Note that, the present invention is basically used for a L/S-type layer. The present invention is applicable to a gate such as an active later or a GP (Gate Poly) layer, or a diffusion layer, in addition to a metal wire layer of Cu or Al.

Figure 9:
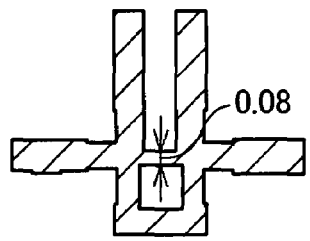
FIG. 9(a) to FIG. 9(j) show concrete examples (the present examples) of a PPC critical pattern with an insufficient process margin
Figure 9:
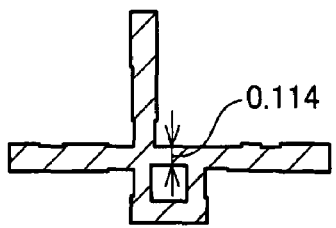
Figure 9:
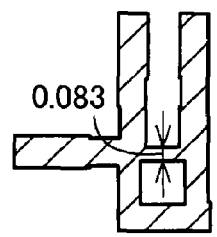
Figure 9:
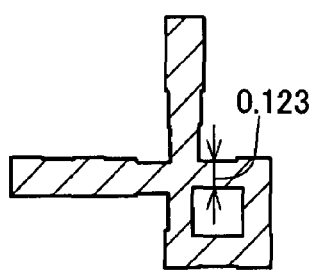
Figure 9:
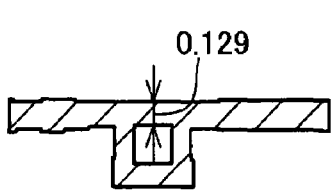
Figure 9:
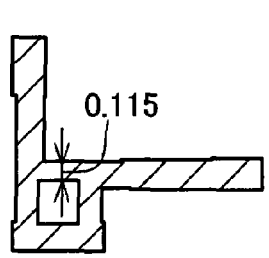
Figure 9:
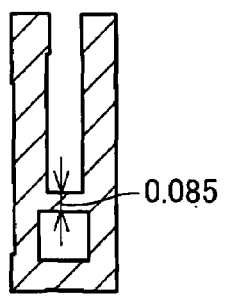
Figure 9:
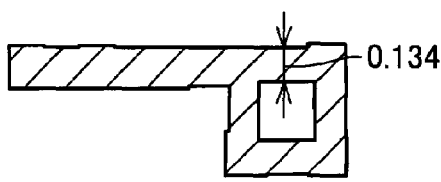
Figure 9:
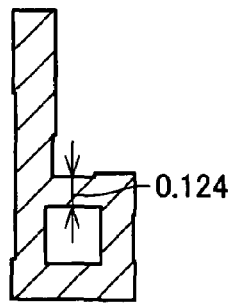
Figure 9:
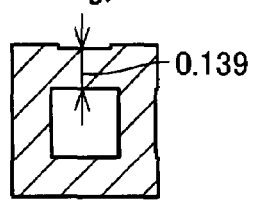

In the step of preparing the TEG mask pattern data in this example (step S0), a critical pattern (a pattern which becomes critical in the processing step) is added to the conventional TEG mask pattern data so as to create TEG mask pattern data including a critical pattern. The critical pattern is a type of pattern having an insufficient process margin. For this reason, the way of processing greatly affects the yield of device. More specifically, the critical pattern requires severe check for line-breakage/short-circuit. FIG. 9(*a*) to FIG. 9(*j*) show concrete examples of critical pattern (OPC critical pattern in this case).

Further, FIGS. 9(*a*), (*c*) and (*g*) show various H-type crosslinking patterns with crosslinking sections ranges from 0.08 to 0.085 μm in line width. Further, FIG. 9(*j*) shows a ring pattern whose line width is 0.139 μm. Note that, the values of FIG. 9(*a*) to FIG. 9(*j*) are obtained by extraction from a LSI layer.

A H-type photomask (denoted by a circle) in FIG. 10A(*a*) is one of the examples of critical pattern. The solid white portion of FIG. 10A(a) indicates an opening of the photomask. In the H-type crosslinking pattern shown in FIG. 10A (*a*), the light intensity of the crosslinked portion is lower than the other parts, and therefore the crosslinked portion of the exposed and developed resist tends to become narrower. FIG. 10A(b) is an image obtained by capturing an image of a circuit material by a scanning electron microscope (SEM), which circuit material has been etched with a photoresist which was formed on a wafer using a photomask including a H-type crosslinking pattern and was exposed and developed thereafter. In this case, the film is depressed in the crosslinked portion of the H-type crosslinking pattern in the exposed and developed photoresist, and therefore, though this is rare, a partial line-breakage is seen after the etching in some cases (see the example of FIG. 10A(b)).

Figure 10B:
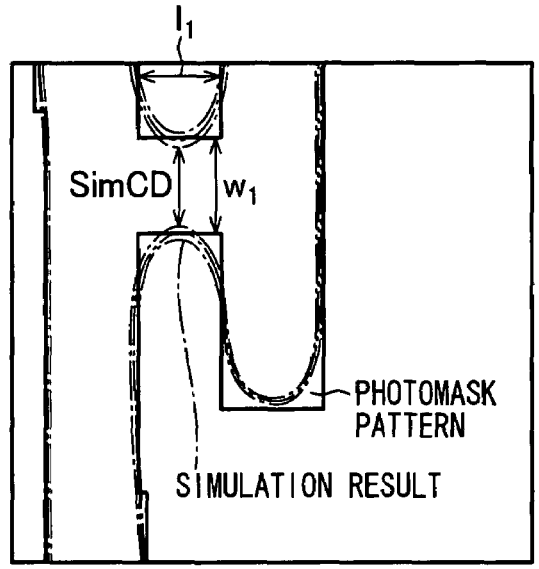
FIG. 10B(a) and FIG. 10B(b) show simulation results of H-type crosslinking pattern.
Figure 10B:
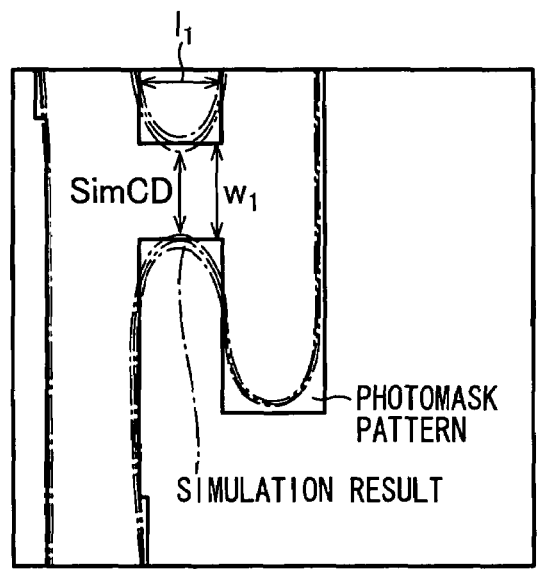

FIGS. 10B(a) and FIG. 10B(b) show results of conventional light intensity simulation with respect to a H-type crosslinking pattern shown in FIG. 10A(a). FIG. 10B(a) is a result on a best-focus state and FIG. 10B(b) shows a result on +0.23 μm defocused condition. The three lines respectively show, in order of outward to inward to the center line of the opening pattern of the photomask, an exposure amount (dose) greater by 4.5% than the optimal exposure amount, the optimal exposure amount, and an exposure amount (dose) smaller by 4.5% than the optimal exposure amount. Between the best-focus state and the +0.23 μm defocused condition, there is no significant variation in exposure process margin (Exposure Latitude; "EL" hereinafter) with which the simulation result falls within the exposure spec. Further, in comparison between a state under a large exposure amount and a state under a small exposure amount, there is no significant variation in depth of focus ("DOF" hereinafter) which can maintain the simulation result within the exposure spec (photospec). The depth of focus shows a width of defocus which can maintain the CD (critical dimension; micro line width) spec (μm is usually used as a unit). The exposure process margin shows an error width (a ratio to the optimal exposure amount generally denoted by ± %) of exposure amount which can maintain the CD spec.

The size of crosslinked portion of the H-type crosslinking pattern predicted by some kind of simulation such as conventional light intensity simulation (or a threshold model) tends to have a wider value than the actual size (corresponding to the resist top size) so as to match the resist bottom size. Though line-breakage occurs in the crosslinked portion of the H-type crosslinking pattern in FIG. 10A(b), line-breakage does not occur in the crosslinked portion of the H-type crosslinking pattern in the conventional light intensity simulation estimation result (FIG. 10B(a) and FIG. 10B(b)). Actually, the film thickness is reduced in the resist top shape after the development, and line-breakage is likely to occur in the next etching process. Therefore, in the proximity effect correction by the conventional simulation, the actual size of the crosslinked portion of the exposed and developed resist in the H-type crosslinking pattern is not likely to sufficiently close to the design pattern (the design spec is not satisfied) regardless of focal depth or exposure amount.

Figure 11:
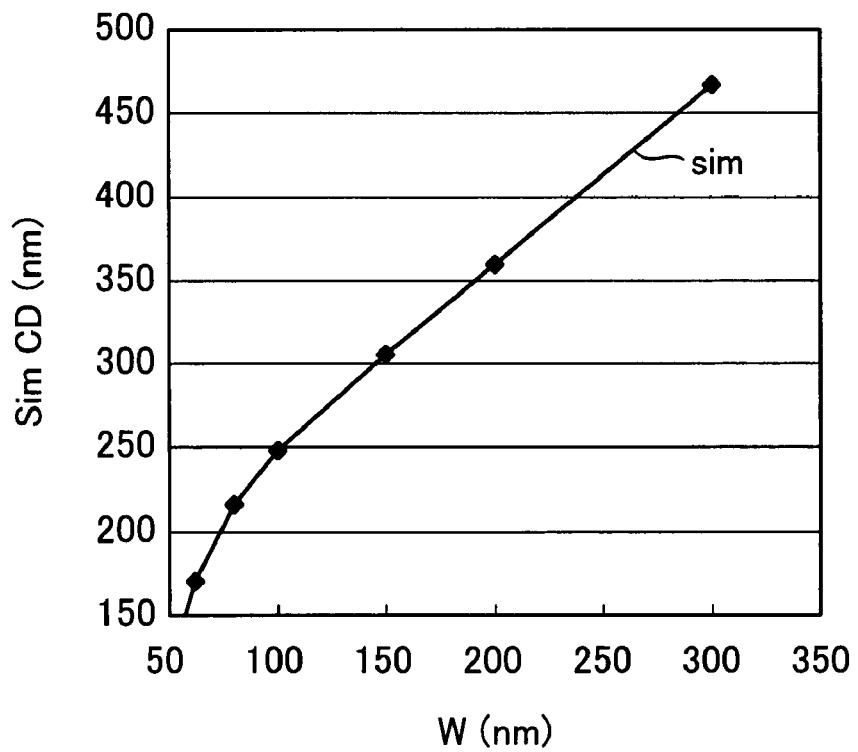
FIG. 11(a) and FIG. 11(b) show H-type crosslinking pattern L/W.
Figure 11:
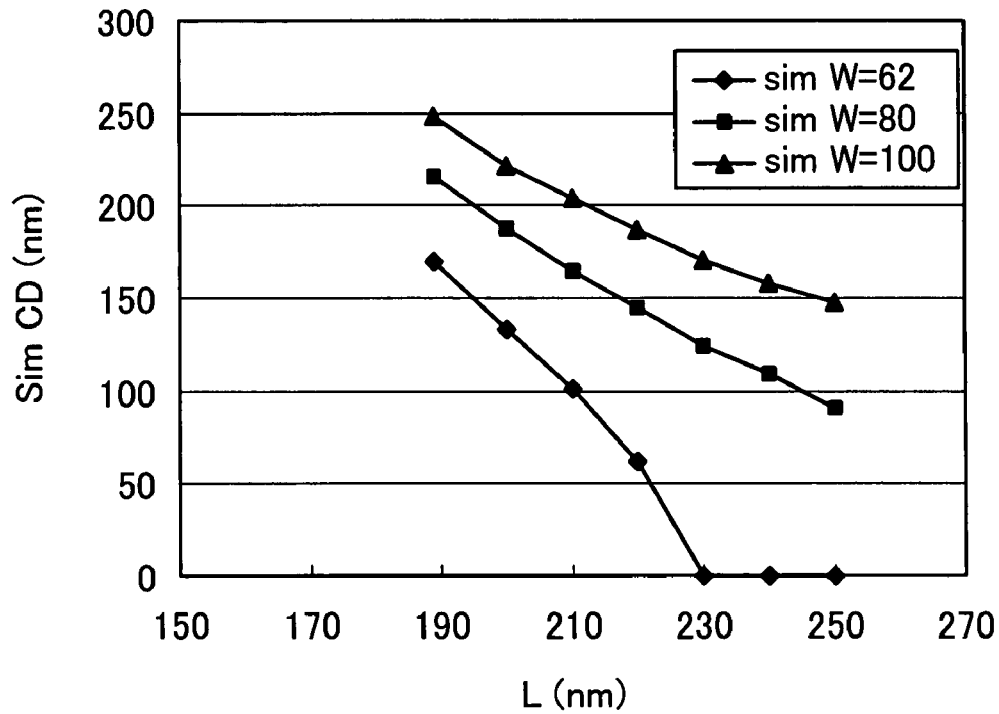
Figure 12:
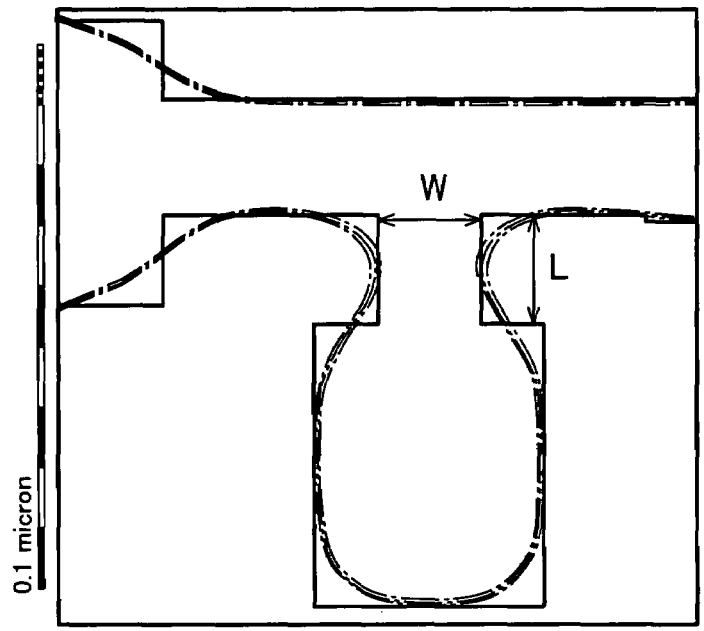
FIG. 12(a) to FIG. 12(c) show simulation results of micro projection pattern dependencies on 2 L/W.

FIG. 11(*a*) and FIG. 11(*b*) show L/W size dependency for the present H-type crosslinking pattern. FIG. 12(*a*) to FIG. 12(*c*) show 2L/W size dependency for the micro projection pattern. The vertical axes of the FIG. 11(*a*) and FIG. 11(*b*) each denote a simulation value of the line width W (w1) of the crosslinked portion after the photo in the H-type crosslinking pattern (see H-type crosslinking pattern in FIG. 7(*a*)). The simulation value is expressed as a Sim CD (nm). These figures show that if the width W of the crosslinked portion is too small, line breakage occurs depending on the length L (l1).

With these evaluation results, it is necessary to satisfy, as an additional rule for the h-type crosslinking pattern, "at least one of the conditions regarding the length l1 and width w1 of the crosslinked portion (the first rectangular section): (1) l1≧280 nm−2×ES(l1*j*) and (2) w1≧240 nm−2×ES(w1*j*)" in the flash MR layer having a line width of 130 nm. The results may be combined to the PPC process as an additional rule of pattern dependency. The addition to the design rule will make the future work far more efficient.

Figure 6:
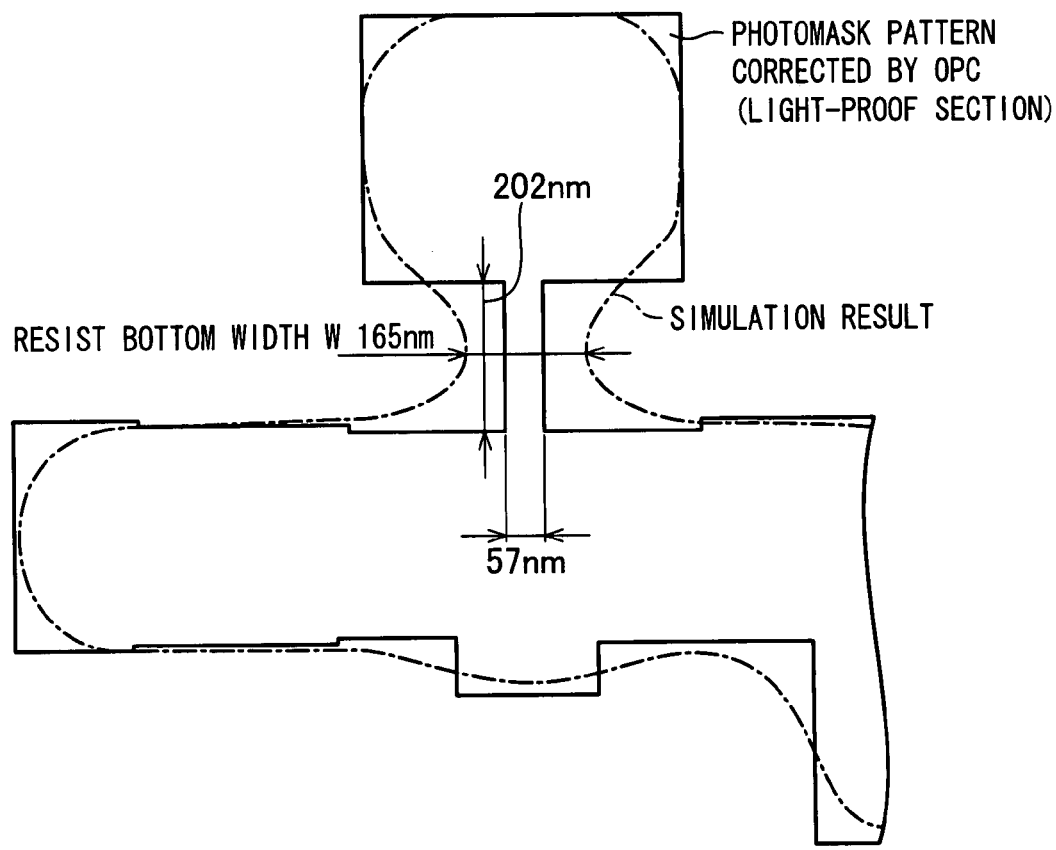
FIG. 6 is a drawing showing a simulation result (risk portions) of a critical pattern.
Figure 7:
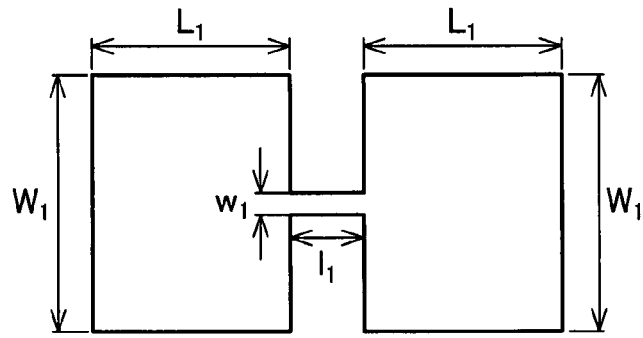
FIG. 7(a) to FIG. 7(e) show concrete examples of PPC model extraction TEG pattern (critical pattern in the present method).
Figure 7:
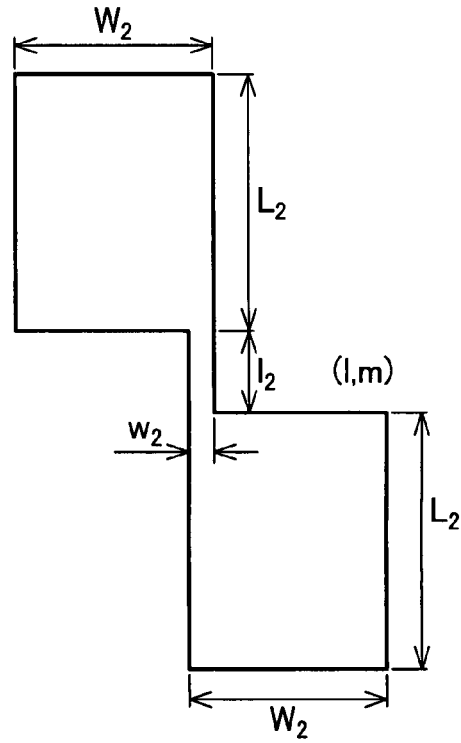
Figure 7:
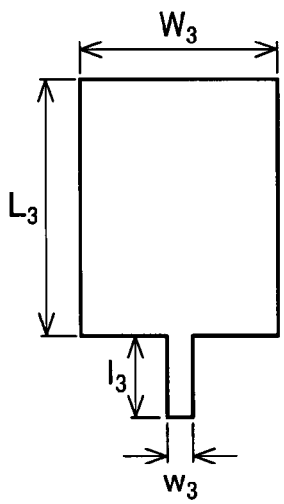
Figure 7:
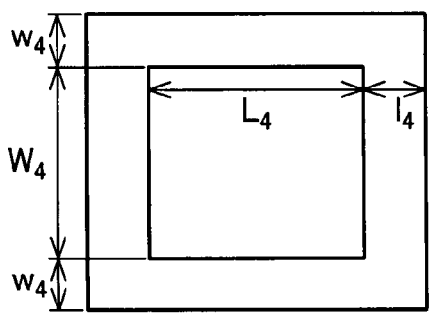
Figure 7:
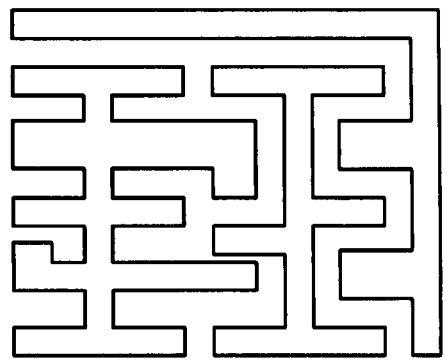

The following shows an examination result based on light intensity simulation in a (micro)projection-type pattern often seen in a line-type layer. This pattern is a kind of projection pattern shown in FIG. 6. FIG. 12(*a*) to FIG. 12(*c*) show L/W(l1/w1) dependency of the pattern. There is no great variation in DOF or EL, and this clears simulation check (within the photospec). The problem is not seen in the light intensity simulation.

Figure 23:
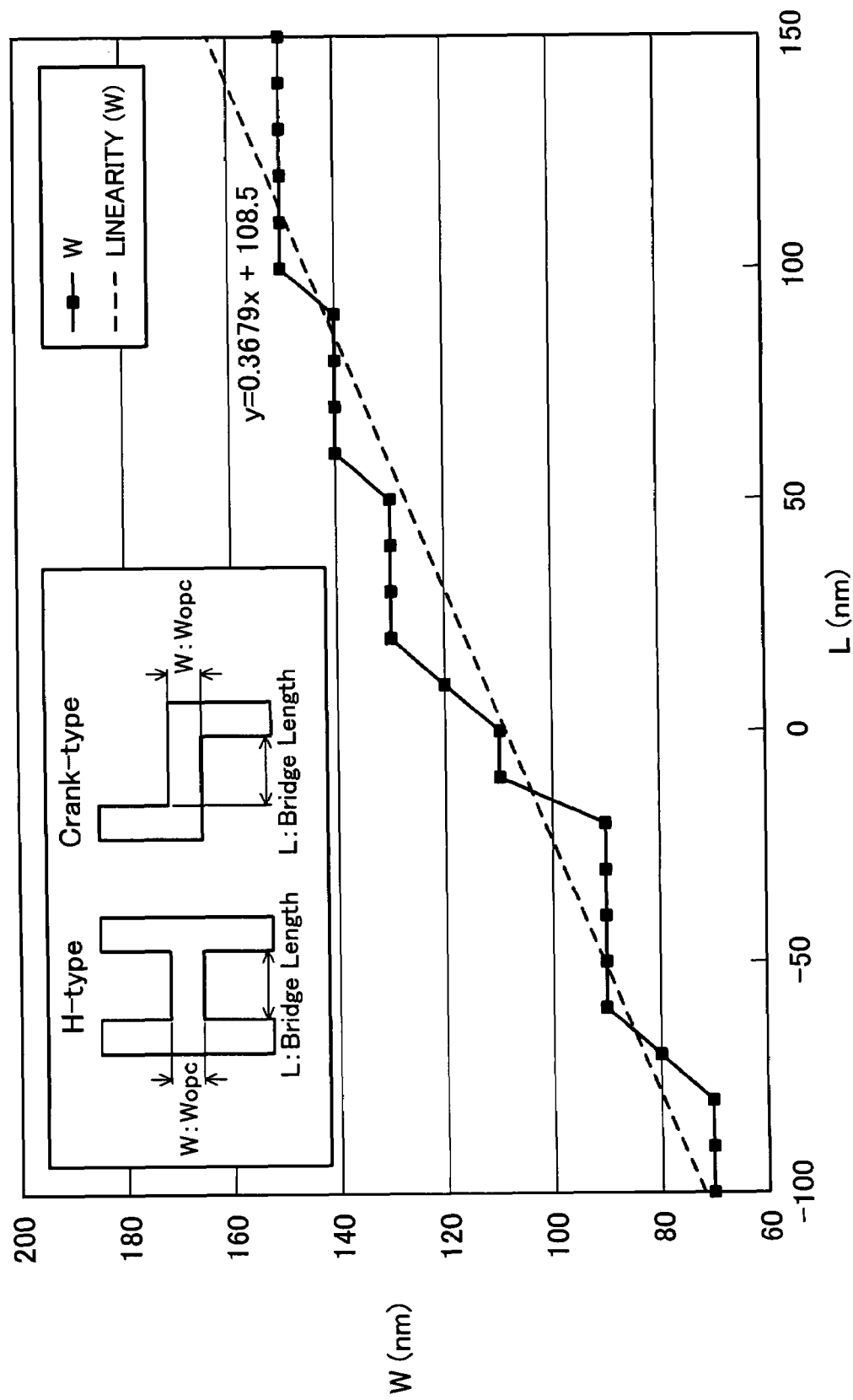
FIG. 23 (a) is a drawing showing a concrete example of lower-limit L/W value extraction table in a H-type crosslinking pattern.

FIG. 23(*a*) shows a concrete example of data table which was referred in the calculation of the foregoing condition (logic process Ml layer photo condition) regarding the size of crosslinked portion: satisfying at least one of (1) l1≧280 nm−2×ES(l1*j*) and (2) w1≧240 nm−2×ES(w1*j*), for preventing the H-type crosslinking pattern from being critical after the PPC. FIG. 23 (*a*) shows a combination (gray cells in the figure) of l1 and w1 with which the photo evaluation (measurement data) resulted in a defect (problem), and a combination (broken-line cells in the figure) of l1 and w1 with which the simulation result (simulation extraction data) and the photo evaluation resulted in defects, when the l1 is varied in a range of 160 to 400 nm and w1 is varied in a range of 180 to 300 nm for four L1 values (180 nm, 288 nm, 400 nm, and 1000 nm). Further, in FIG. 23(*a*), the solid white cells indicate l1 and w1 combinations with which the simulation result and the photo evaluation were both desirable (there were no problems). The cells with x are cells for which the simulation result and the photo evaluation were omitted. Note that, in FIG. 23(*a*), "the simulation result" indicates a result of simulation in which the photo evaluation result of FIG. 23(*a*) is applied.

In FIG. 23(*b*), the solid line denotes a minimum W value which provides the best photo evaluation result for the value L ranging from −100 nm to 100 nm in the H-type crosslinking pattern and in the crank-type pattern, which result is found by an experiment. Further, the broken line denotes an approximation of this result in the from of a straight line. According to the result of FIG. 23(b), it is found that the photo evaluation result becomes NG on condition that:

$$W<0.3679(nm)\times L+108.5(nm)$$

FIG. 23(a) shows that, in the H-type crosslinking pattern, the simulation result and the photo evaluation become desirable as long as the condition of "meeting at least one of l1≧280 nm−2×ES(l1j) and w1≧240 nm−2×ES(w1j)" is satisfied, regardless of the L1 value (line width of the part excluding the crosslinked portion; size of the first polygon section along the longitudinal direction of the first rectangular section).

This photo evaluation result of FIG. 23 shows that the 130 nm flash MR layer needs to satisfy the condition of "meeting at least one of l1≧280 nm−2×ES(l1j) and w1≧240 nm−2× ES(w1j)" as an additional rule for the H-type crosslinking pattern of FIG. 7(a). This result may be applied to a PPC process as an additional rule of pattern dependency. Further, by adding it to the design rule for the future manufacturing, the work efficiency will greatly improve.

Another similar critical pattern is a crank-type crosslinking pattern. A concrete example of the crank-type crosslinking pattern is shown in FIG. 7(b). This pattern also tends to have a narrow crosslinked portion, that is, Also for this pattern, according to the photo evaluation result not shown in the figure, it was found that the condition of "meeting at least one of l2≧280 nm−ES(l2j) and w2≧240 nm−2×ES(w2j), regarding the length l2 and the width w2 of the crosslinked portion (second rectangular section), needs to be met.

Another type of critical pattern is a micro projection pattern. A concrete example of the micro projection pattern is shown in FIG. 7(c). In this pattern, the line is narrow in the vicinity the middle of the projection section, and therefore line-breakage may occur if the portion contain a contact or the like. Also in this case, the conventional simulation check is not capable of the extraction. Also for this pattern, the TEG photo evaluation result not shown in the figure shows that the 130 nm flash MR layer is required to satisfy the condition of "meeting at least one of l3≧280 nm−ES(l3j) and w3≧240 nm−2×ES(w3j)", regarding the length l3 and the width w3 of the projection section.

Still another type of critical pattern is a ring pattern. A concrete example of the ring pattern is shown in FIG. 7(d). In this type of pattern, the corner section is narrowed (eg. a cross or a T-shape pattern), and the aperture space may be filled. Also in this case, the conventional simulation check is not capable of the extraction. Also for this pattern, the TEG photo evaluation result not shown in the figure shows that the 130 nm flash MR layer is required to satisfy the condition of "meeting at least one of l4≧280 nm−2×ES(l4j) and w4≧240 nm−2×ES(w4j), regarding the length l4 and the width w4 of the ring portion.

A final example is a pectinate L/S pattern used for a type of critical pattern for a short-check-type pattern. A concrete example of the pectinate L/S pattern is shown in FIG. 7(e). A pectinate L/S pattern similar to this has been used for yield evaluation patterns of other companies. One of the examples can be found in Patent Document 9 (Japanese PCT National Phase Unexamined Patent Publication "Tokuhyo 2004-505433").

After the TEG pattern evaluation is completed, the pattern is subjected to PPC correction based on the critical pattern restriction. The PPC correction more specifically includes extraction of the critical pattern, and a PPC process using rule base correction or a model base in which the correction lower limit value is restricted.

Figure 13:
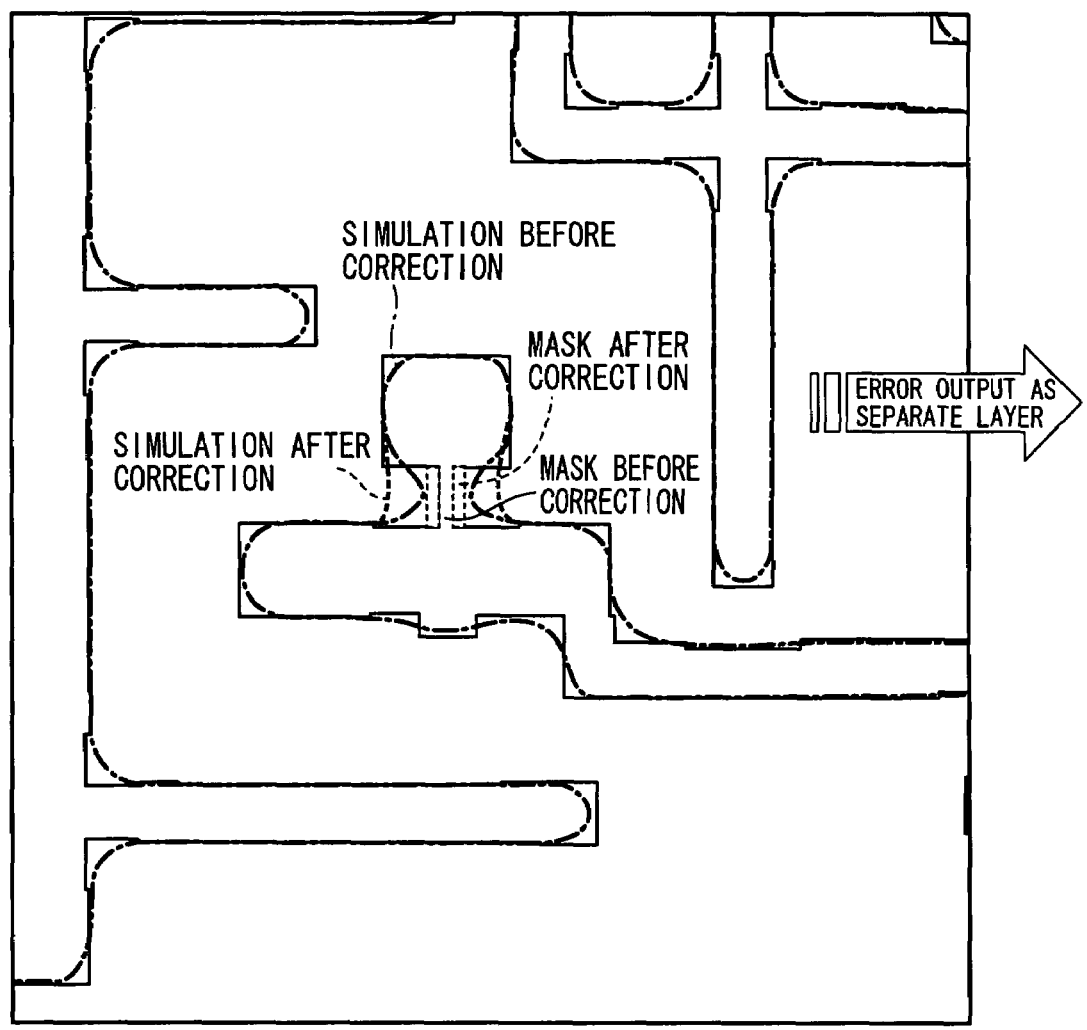
FIG. 13 is a drawing showing a concrete example of PPC pattern correction with lower-limit restriction.

FIG. 13 shows a concrete example. In this example, after the PPC is carried out without restriction of lower-limit value, a H-type crosslinked portion (narrow portion), which is a critical region, is extracted, and correction is carried out by increasing the line width of the H-type crosslinked portion from 57 nm to 90 nm. In this example, the lower-limit value of the line width of the H-type crosslinked portion is limited to 90 nm in view of mask processing accuracy.

According to this method, the lower limit value in an arbitrary narrow line portion is found in accordance with the TEG extraction result, and correction of the critical pattern is carried out. In this process, the line width of the narrow line portion is increased to a lower limit value. Further, the correction amount (error) of the line width is outputted as another layer (data of another layer) (output of another layer error). Since the line width of the narrow line portion tends to be larger than the target size by an amount corresponding to this difference, the security of this portion needs to be examined by validation. This is the reason why the correction amount (error) of line width is outputted as another layer.

In this manner, a line-breakage insecure portion or a short-circuit insecure portion which cannot be found by the conventional simulation check can be extracted from the mask pattern data without carrying out wafer evaluation using an actual trial mask. The insecure portion can be thus corrected appropriately.

A reverse condition of the condition for extracting the critical pattern (extraction rule of critical pattern), in other words, a condition of no-critical pattern may be added to the design rule. This greatly increases efficiency of the future process development. FIGS. 14 to 17 show specific design rules of restriction condition of the critical pattern in the 130 nm flash MR layer.

Note that, though this example is applied to a 130 nm process, the present invention is not limited to a 130 nm process, and is applicable also to a 90 nm process, or a process of after 65 nm.

[Process Proximity Effect Correction of an Empirical Fitting Model]

The following explains an example of process proximity effect correction method using an empirical fitting model which can be used in S6 of FIG. 1B.

This correction method comprising (i) a first measurement step for carrying out an exposure experiment for exposing and developing a resist using an evaluation mask (TEG), and measuring a shape of the developed resist; (ii) a second measurement step for etching a circuit material using the developed resist and measuring a pattern size of the material after the etching; (iii) a calculation step for calculating a shape of the developed resist by a calculation formula based on evaluation mask pattern data; (iv) an fitting step for changing a parameter (such as a coefficient of a function) of the calculation formula based on comparison between the resist shape measured by the measurement step and the resist shape calculated in the calculation step so as to fit the modified calculation formula to a measurement result; and (v) a proximity effect correction step for calculating a resist shape according to the calculation formula modified in the fitting step and carrying out process proximity effect correction of mask pattern data based on the calculated resist shape, wherein the evaluation mask includes a pattern which is assumed to be critical on the conventional proximity effect correction.

An example of a calculation formula used for resist shape calculation in the proximity effect correction step is the calculation formula of non-patent Document 4 (Toyo Koike and other authors "semiconductor element design simulator", Heisei Maruzen Co. Ltd. 1994/August, pp 147-174).

Figure 21:
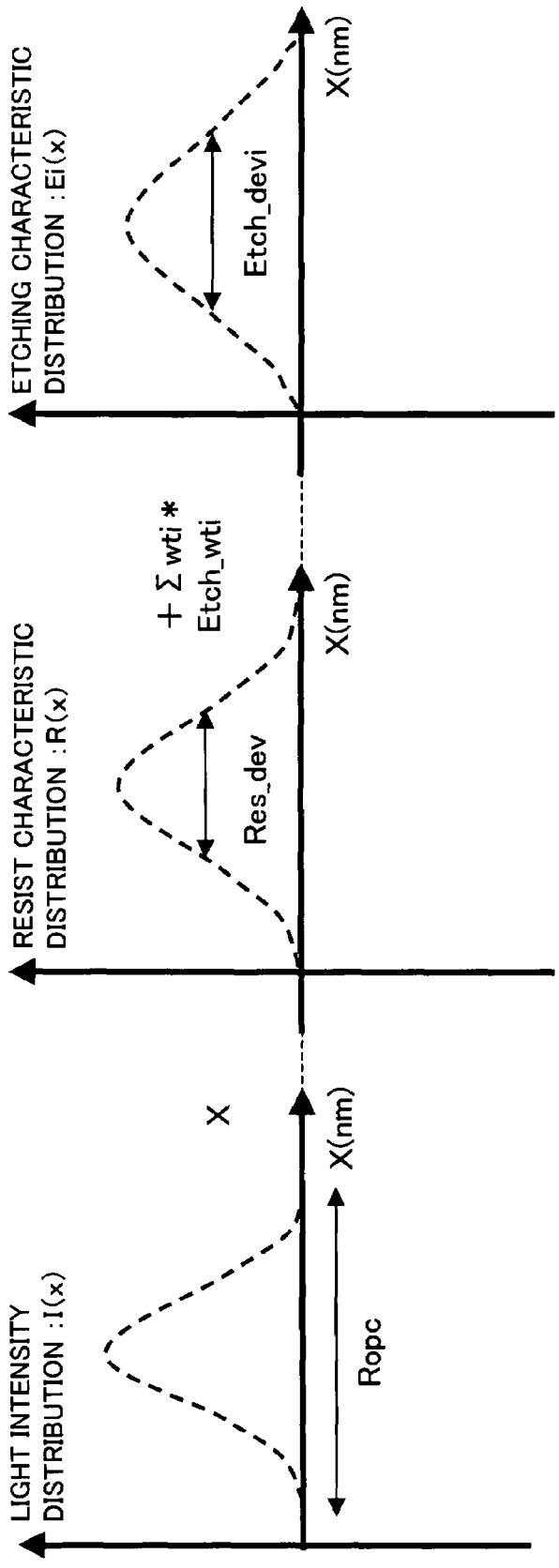
FIG. 21 is a drawing for explaining a fitting function.

FIG. 21 shows an example of a method in which a OPC calculation model (calculation formula for a projection optical image) is fitted to the experiment data in the foregoing fitting step. The figure shows a OPC calculation model and an fitting parameter. As shown in FIG. 21, this method uses an fitting function formula (1) including light intensity distribution I(x) dependent on a position (length) X on a wafer, and resist characteristic distribution R(x) dependent on a position (length) X on a wafer, and etching characteristic Ei (x) dependent on a position (length) X on a wafer.

[Production Method of Semiconductor Integrated Circuit]

Figure 19:
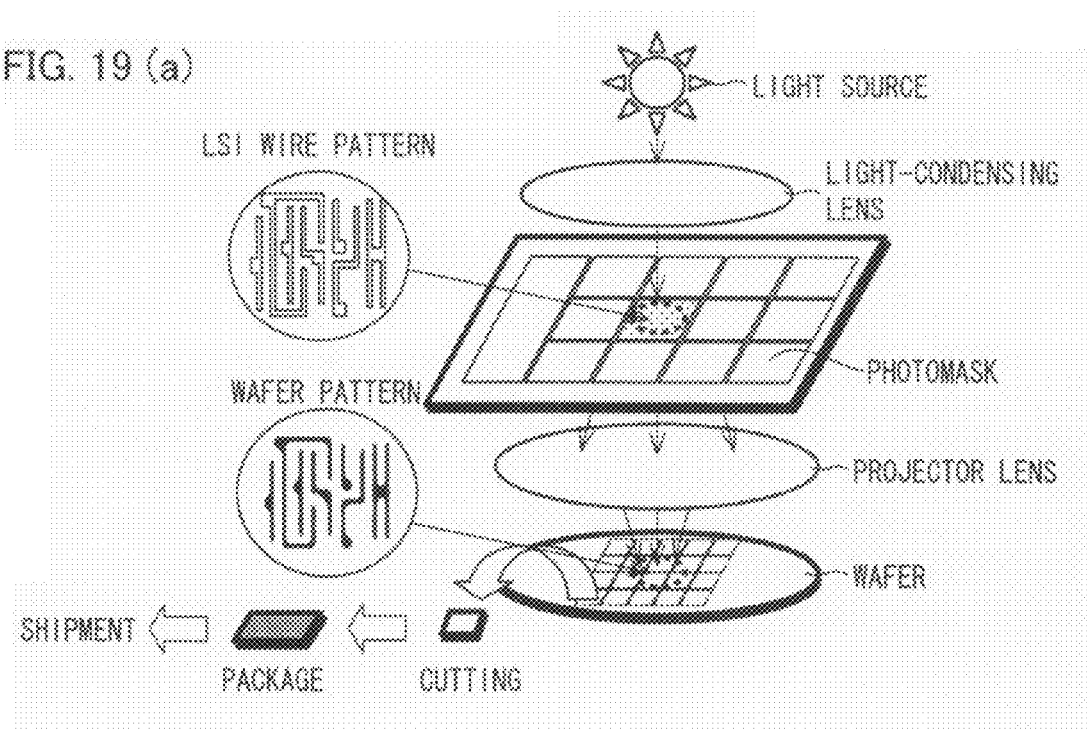
FIG. 19(a) and FIG. 19(b) are explanatory views showing an existing photolithography process and an existing semiconductor microfabrication process.
Figure 19:
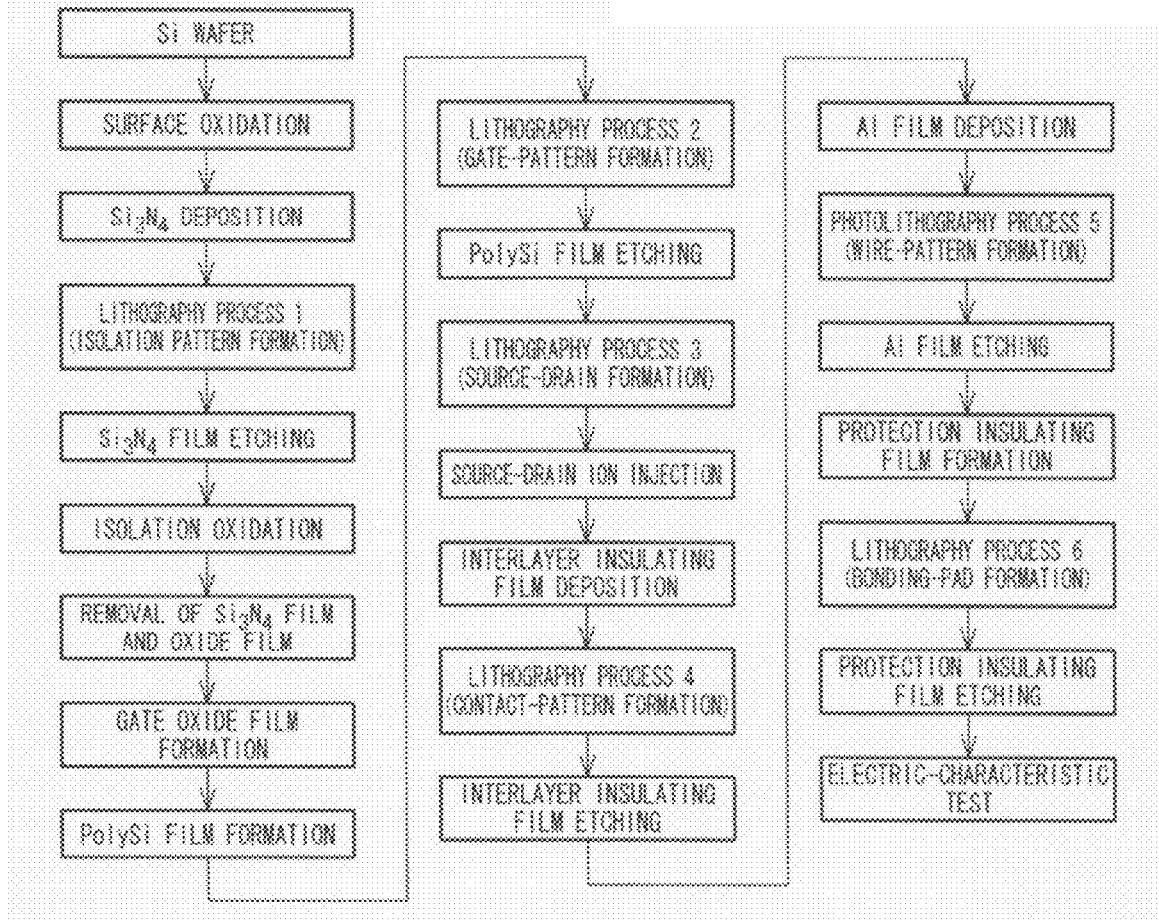

The present embodiment is also applicable to a semiconductor integrated circuit production method. FIG. 19(b) shows a typical production method (CMOS process manufacturing flow) of a semiconductor integrated circuit(LSI) using a CMOS process. The optical lithography processes 1 to 6 shown in FIG. 19(b) carry out transfer (print) of a hole pattern or a LSI wire pattern (not an actual LSI wire pattern but a light transmitting pattern or a light-proof pattern corresponding to a LSI wire pattern) from the mask to the resist on the wafer, so as to form the LSI wire pattern and the hole pattern on the resist on a wafer. That is, in these steps, light from a light source is condensed by a light-condensing lens and passes through the photomask, and the light is focused on the wafer as an image by a projector lens. A predetermined region of the resist on a wafer is exposed. Then, the resist is developed and patterned. After that, a circuit material layer (eg. a metal layer made of Cu or Al) beneath the photoresist is etched using the photoresist as an etching mask, and the circuit material layer is patterned. After the step of FIG. 19(b), cutting, packaging, and shipment are performed. Note that, FIG. 19(a) illustrates an optical lithography process 5 detailed in FIG. 19(b)

Figure 2:
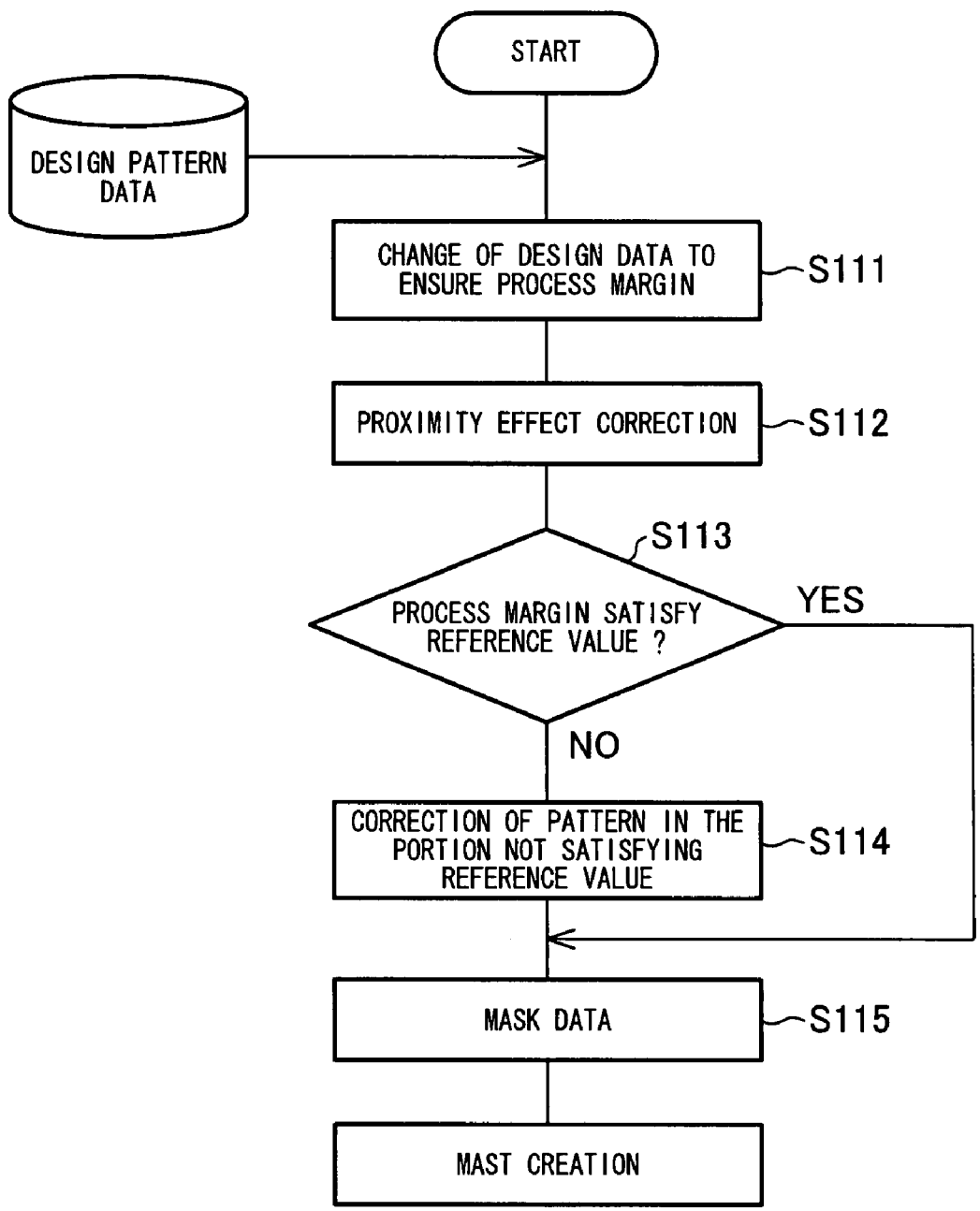
FIG. 2 is a flow chart showing a conventional mask pattern data creation method.
Figure 3:
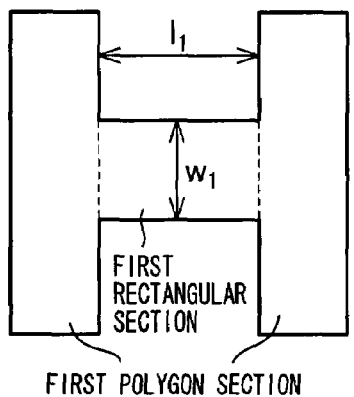
FIG. 3(a) to FIG. 3(e) are drawings showing a concrete example of a pattern which becomes critical after a PPC process.
Figure 3:
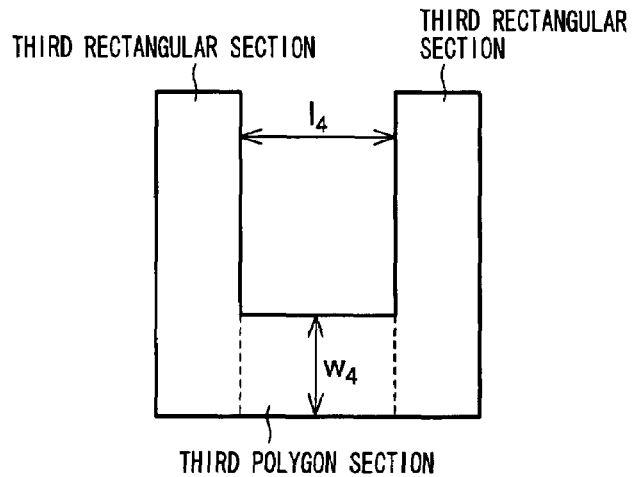
Figure 3:
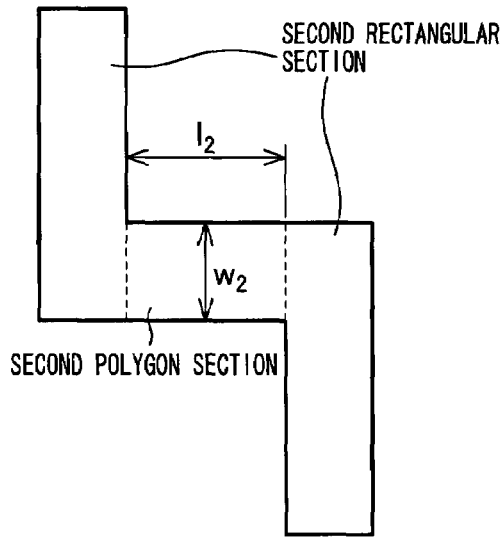
Figure 3:
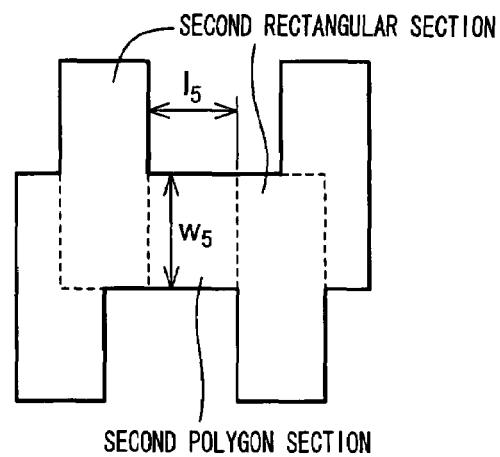
Figure 3:
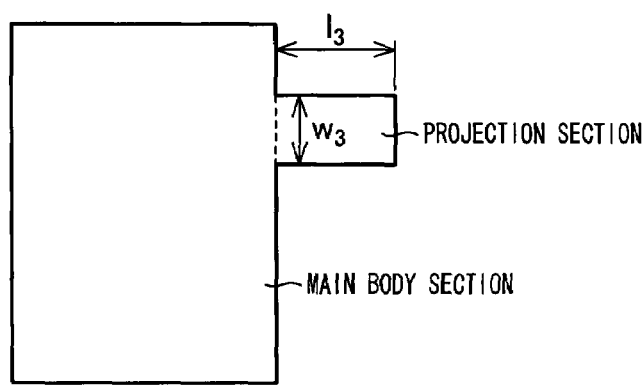
Figure 4:
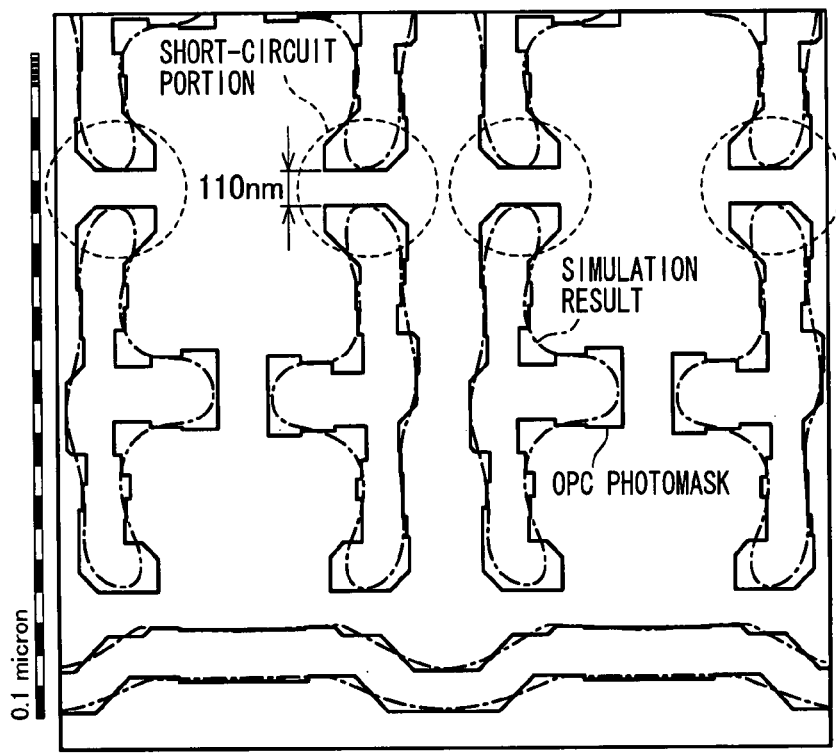
FIG. 4(a) and FIG. 4(b) are drawings showing examples of model base PPC pattern in a SRAM memory cell.
Figure 4:
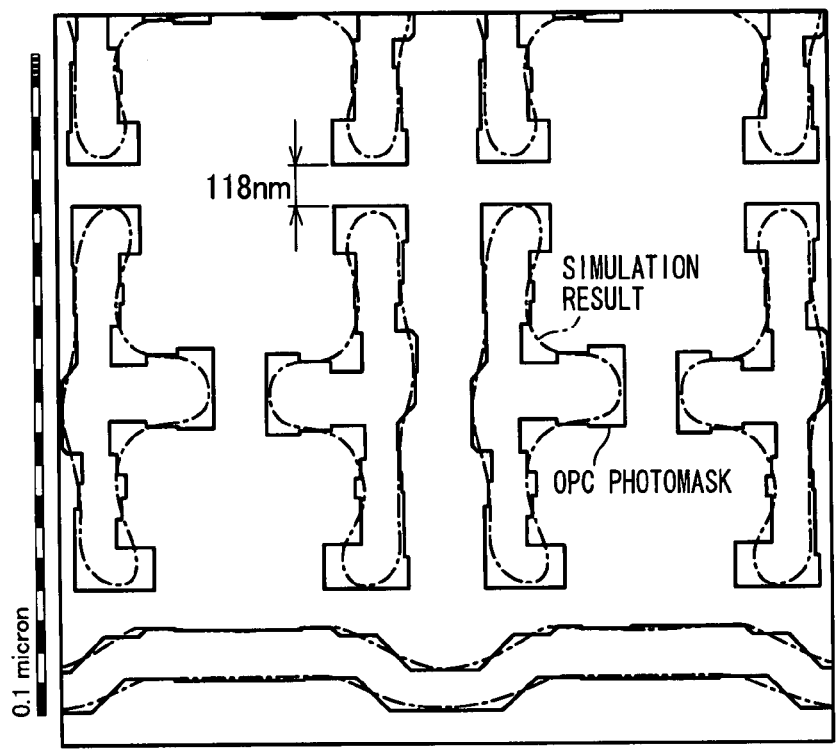

The CMOS layer structure and the production method shown in FIG. 19(a) and FIG. 19(b) are the same as those of publicly-known CMOS, and therefore the explanation of them is omitted here. This CMOS layer structure is disclosed in some publicly-known documents, such as FIGS. 1 and 2 of page 2 of "ULSI process technology" Hisashi Hara, Baifukan Co. Ltd.

[Mask Pattern Creation System]

With reference to FIG. 20, the following explains a mask pattern creation system (mask pattern correction system, mask pattern validation system) for carrying out the mask pattern creation method of FIG. 1A and FIG. 1B.

As shown in FIG. 20, the mask pattern creation system includes an exposure device 1, a CD measurement device (measurement device) 2, a parameter extraction/fitting section 3, a DRC section 12, an input section 14, a data processing section 15, and a display section (display device) 18.

The exposure device 1 and the CD measurement device 2 carry out evaluation (wafer evaluation) shown in S1 of FIG. 1B, such as photo or etching, when the critical pattern extraction TEG (mask) is transferred by the user to the exposure device 1.

More specifically, the exposure device 1 carries out exposure and development of the resist on a wafer using the critical pattern extraction TEG as a mask when the critical pattern extraction TEG (mask) is transferred by the user to the exposure device 1. The exposure device 1 may be realized by a KrF scanner or a ArF scanner, for example.

The CD measurement device 2 measures the size or shape of the exposed and developed resist pattern and a pattern size of the etched circuit material, and outputs the measurement result to the parameter extraction/fitting section 3 as measurement data. The CD measurement device 2 is realized by a CD-SEM (scanning electron microscope) or laser. Note that, the extraction TEG is created in advance by a mask creation device 20 outside the system, based on the critical pattern extraction TEG pattern data having been through pattern data process proximity effect correction (S1 of FIG. 1B). Further, the critical pattern extraction TEG pattern data having been through the process proximity effect correction is created in advance by processing critical pattern extraction TEG pattern data stored in a design data storage section 13 through such as process proximity effect correction by the data processing section 15. The processing of critical pattern extraction TEG pattern data is basically the same as the processing (the data processing until critical patterns are completely removed by the design rule) of design data (described later) except for the operation by the critical pattern extraction section 15a and the critical pattern correction section 15b. The explanation is therefore omitted here.

The parameter extraction/fitting section 3 is the second control section realized by a EWS (engineering work station), a PC (personal computer) or the like, and carries out data processing by reading out a lithography simulator program from a lithography simulator program storage section 4 and executing the program, or by reading out a CAD tool program from a CAD tool program storage section 5 and executing the program. For this operation, a major function of the parameter extraction/fitting section 3 is to carry out simulation of critical pattern extraction TEG pattern data stored in the design data storage section 13. The lithography simulator program is used for checking the CD size or for estimating the process margin by parameter-based simulation. The system of FIG. 20 uses a simulation program for fitting of PPC parameters.

The parameter extraction/fitting section 3 includes a rule extraction section (parameter condition determining section) 3a, a parameter extraction section 3b, and a fitting section 3c.

The fitting section 3c compares the actually measured data (data of size or shape) of critical pattern extraction TEG outputted from the CD measurement device 2 with a simulation result of the critical pattern extraction TEG pattern data stored in the design data storage section 13. According to this comparison, the fitting section 3c carries out fitting of a plurality of parameters, in other words, changes the plurality of parameters (fit the simulation to the actual measurement) so that the simulation fits to the actual measurement. Further, the fitting section 3c stores a number sequence constituted of the adjusted plural parameters as a PPC mode (simulation model improved by the fitting) or a PPC rule. By the simulation by the proximity effect correction section 15c using the PPC model or the PPC rule, it is possible to increase accuracy of simulation by the proximity effect correction section 15c.

The parameter extraction section 3b finds a reference parameter of PPC validation from the actually measured data of the critical pattern extraction TEG, stores the parameter having been found in a PPC validation file, outputs the parameters to the PPC validation file storage section 10, and stores the PPC validation file in the storage section 10. The validation file is supplied to the PPC validation section 15d, so as to validate PPC data in the PPC validation section 15d.

The rule extraction section 3a acquires a critical pattern extraction rule and a critical pattern correction rule based on the step S2 of FIG. 1B, that is a wafer evaluation result (measurement data) by the CD measurement device 2. The rule extraction section 3a stores the acquired critical pattern extraction rule and critical pattern correction rule to the critical pattern extraction rule storage section 7 and the critical pattern correction rule storage section 8, respectively. The rule extraction section 3a carries out extraction of a DFM rule based on a result (measurement data) of wafer evaluation by the CD measurement device 2. The rule extraction section 3a adds or replace the extracted DFM rule to the design rule stored in the design rule storage section 6.

The input section 14 supplies design data stored in the design data storage section 13 to the data processing section 15 in accordance with user's instruction. The DRC and LVS regarding the LSI layout are completed at this time of storing the design data into the design data storage section 13. That is, the layout data (design data) is stored in the design data storage section 13 after it has been through a design rule check by a DRC section 12 and LVS by a LVS section (not shown). The DRC section 12 carries out the design rule check based on the design rule stored in the design rule storage section 6.

The data processing section 15 carries out processing of the design data supplied by the input section 14. The data processing section 15 includes a critical pattern extraction section 15a, a critical pattern correction section (critical pattern correction section, correction portion output section) 15b, a proximity effect correction section 15c, a PPC validation section 15d, and a layout correction section 15e.

The critical pattern extraction section 15a extracts a critical pattern (a pattern which becomes critical after process proximity effect correction) from the design data based on the step S3 of FIG. 1B, that is, based on the critical pattern extraction rule stored in the critical pattern extraction rule storage section 7.

The critical pattern correction section 15b carries out correction of the critical pattern based on the steps S4 and S5 of FIG. 1B, that is, based on the critical pattern correction rule stored in the critical pattern correction rule storage section 8, in the case where the design data contains a critical pattern (a pattern which becomes critical after process proximity effect correction). Further, the critical pattern correction section 15b serves to include information indicating the correction portion into the mask pattern data before outputting the mask pattern data to the display section 18 so that the information of the corrected portion is displayed in the display section 18.

Note that, if a DFM rule for excluding the critical pattern is added to the design rule newly or as a replacement, the critical pattern is removed from the design pattern before it is supplied to the data processing section 15 (at the time of design rule check by the DRC section 12). In this case, the data processing section 15 directly sends the design data having been supplied to the data processing section 15 to the proximity effect correction section 15c without sending it to the critical pattern extraction section 15a and the critical pattern correction section 15b.

The proximity effect correction section 15c carries out the step S6 of FIG. 1B with respect to the design data. More specifically, the proximity effect correction section 15c carries out simulation-based process proximity effect correction using a PPC model stored in the PPC model storage section 9. The proximity effect correction section 15c is realized by reading out a PPC tool program from the storage section 16 and executing the program by a computer (EWS or PC). Therefore, the storage section 16 is a computer-readable storage medium storing a program (PPC tool program) for causing a computer to function as the proximity effect correction section 15c.

The PPC validation section 15d carries out the step S7 of FIG. 1B with respect to the design data. More specifically, the PPC validation section 15d carries out validation of the PPC data based on the PPC validation file stored in the validation file storage section 10. The PPC validation section 15d causes the display section 18 to display the validation result and sends the validation result to the layout correction section 15e. The PPC validation section 15d is realized by reading out a PPC validation tool program from the PPC validation tool program storage section 17 and executing the program by a computer (EWS or PC). Therefore, the PPC validation tool program storage section 17 is a computer-readable storage medium storing a program (PPC validation tool program) for causing a computer to function as the PPC validation section 15d.

The layout correction section 15e carries out the steps S8 and S9 of FIG. 1B. More specifically, the layout correction section 15e causes the display section 18 to display the corrected mask pattern data and sends the mask pattern data to the external mask creation device 20. The layout correction section 15e is realized by reading out a layout editor program from the layout editor program storage section 19 and executing the program by a computer (EWS or PC). Therefore, the layout editor program storage section 19 is a computer-readable storage medium storing a program (layout editor program) for causing a computer to function as the layout correction section 15e.

The corrected mask pattern data outputted to the external mask creation device 20 is then used for lithography. First of all, a mask is created by the mask creation device 20 using the corrected mask pattern data (S10 of FIG. 1B). Next, the wafer (on which a resist is formed) is exposed and developed using the mask by the exposure device 1. The exposed and developed resist is evaluated by the CD measurement device 2. After that, the wafer thereon having the exposed and developed resist, and also the data thereof are sent to an etching device (not shown), and the layer (circuit material layer) beneath the resist is etched by the etching device. The size of the layer beneath the resist having been through the etching is also measured by the CD measurement device 2. As a result, a pattern, such as a LSI pattern, is formed.

Note that, the DFM database 11 includes such as a DFM rule extracted by the parameter extraction/fitting section 3, and serves to construct a database. The DFM database 11 adopts a soft computing technology such as a neutral network or a fuzzy computer, which allows accumulation, development of the database, as well as efficient and rapid prediction or estimation.

Note that, in the flow of FIG. 1B, the steps S0 to S2, S4, and S8 generally require user instruction or number input. Further, in the mask pattern creation system show in FIG. 20, user instruction or number input are generally required in the part of the step of determining necessity of correction of the critical pattern in the exposure device 1, the CD measurement device 2, the rule extraction section 3a, and the critical pattern correction section 15b, and in the part of the step of determining necessity of correction in the layout correction section 15e. Further, the determination of necessity of correction in the step S4 or S8 may be performed by a user, or by the critical pattern correction section 15b or the layout correction section 15e.

Note that, the mask pattern creation system shown in FIG. 20 does not necessary have to be a system with components physically connected, but may be a system with components connected via a network (a system the entire part of which is constructed on a network).

The system in FIG. 20 is used not only for the correction of a mask pattern used for manufacturing semiconductor elements or liquid crystal display elements, but also for a mask pattern validation system. When used as a mask pattern validation system, the system shown in FIG. 20 may omit the section regarding mask pattern correction, including the critical pattern correction rule storage section 8, the storage section 9, the critical pattern correction section 15b, the proximity effect correction section 15c, the layout correction section 15e, the PPC tool program storage section 16, and the layout editor program storage section 19.

Figure 18:
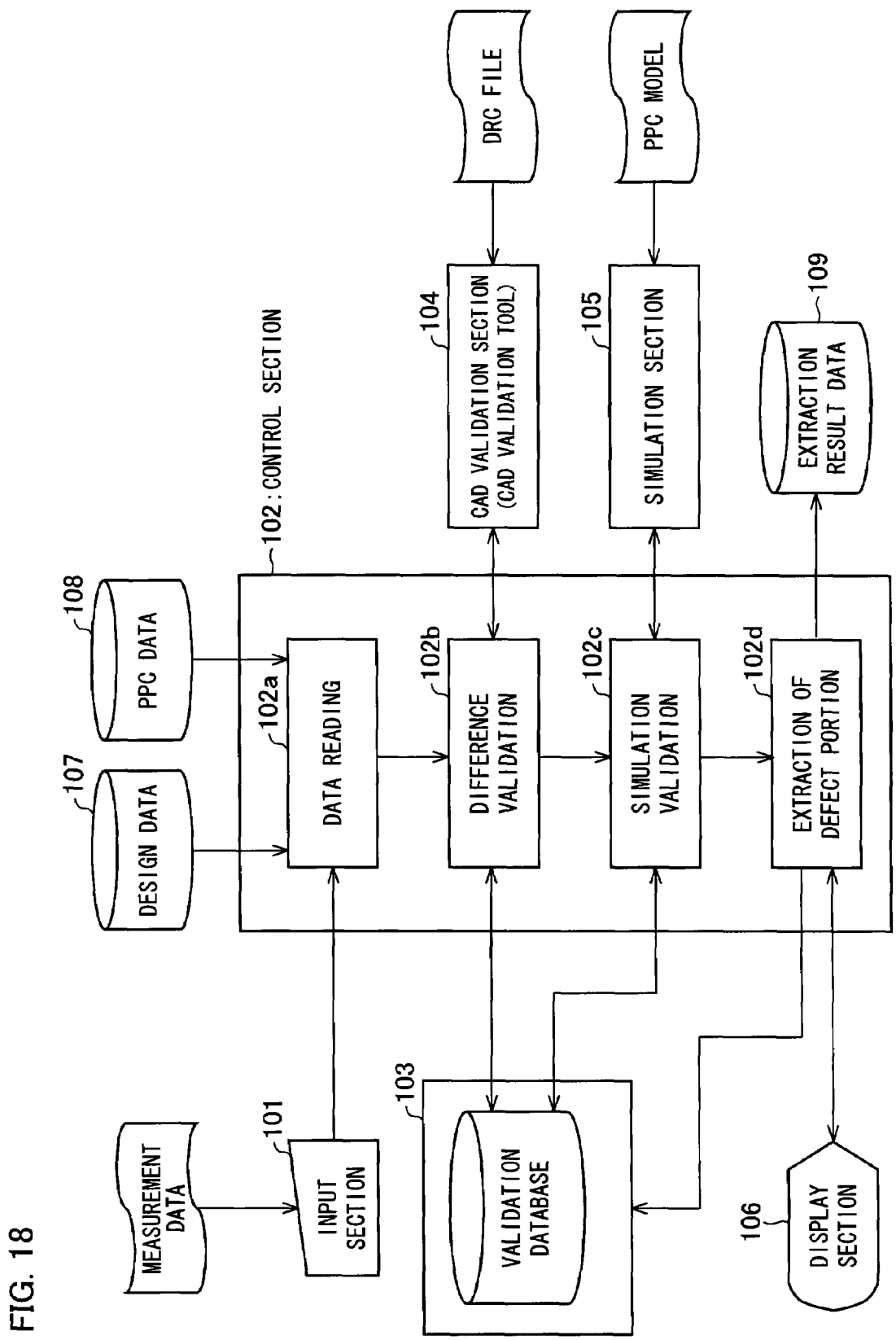
FIG. 18 is a block diagram showing a structure of a conventional mask pattern validation system.

As a comparative example, the following explains a conventional validation system and validation method with reference to FIG. 18. FIG. 18 is a block diagram showing a structure of a conventional mask pattern validation system.

As shown in FIG. 18, the conventional mask pattern validation system includes an input section 101 for externally supplying measurement data to a control section 102 (described later); a control section 102 for carrying out validation and extraction of a defect portion based on the measurement data, the design data, PPC data or the like; a validation database 103 for storing a PPC validation database used for validation; a CAD validation section 104 for carrying out CAD (Computer-Aided Design) validation using a DRC (design rule check) file (realized by a CAD validation tool); a simulation section 105 for carrying out simulation using a PPC model; a display section 106 for displaying a defect portion extracted by the control section 102; a design data storage section 107 for storing design data used in the control section 102; a storage section 108 for storing PPC data used in the control section 102; and an extraction result data storage section 109 for storing data of a defect portion (extraction result data) extracted by the control section 102.

Further, the control section 102 is realized by a EWS, a PC or the like. The control section 102 includes a data reading section 102a for reading out measurement data, design data, and PPC data respectively from the input section 101, the design data storage section 107, and the data storage section 108, and supplying them to a difference validation section 102b (described later); a difference validation section 102b for carrying out difference validation of the design data or the PPC data using a validation result given by the CAD validation section 104 or a PPC validation database in the validation database 103; a simulation validation section 102c for carrying out simulation validation of the design data and the PPC data using a simulation result given by the lithography-simulation section 105 and a PPC validation database in the validation database 103; and a defect portion extraction section 102d for extracting a defect portion of the design data or the PPC data using validation results in the difference validation section 102b and the simulation validation section 102c, including the information of the defect portion into a PPC validation database in the validation database 103, and displaying the information of the defect portion in the display section 106.

Note that, the blocks of the conventional validation system shown in FIG. 18, namely the validation database 103, the difference validation section 102b, the simulation validation section 102c, the defect portion extraction section 102d, and the extraction result data storage section 109 have specs prior to the system of the present invention. More specifically, the validation database 103 is a predecessor of the (integrated) database (DFM database 11) of FIG. 20. The difference validation section 102b is an old-fashioned validation method used in the rule base OPC. The simulation validation section 102c has a structure of a predecessor of the PPC validation section 15d in the system of the present invention. Operations of the defect portion extraction section 102d and the extraction result data storage section 109 are based on conventional optical-image simulation. The accuracy of this simulation was not ensured.

As described, the present embodiment achieves the process spec (including process margin) after the PPC process, and therefore, correction of the design data of a mask after the microfabrication process, creation of a new mask, and another wafer evaluation for the new mask can be omitted. This prevents wastes in cost and development period.

Finally, the respective blocks of the system shown in FIG. 20, particularly the parameter extraction/fitting section 3 or the data processing section 15, may be constituted of a hardware logic, or may be realized by software with a CPU.

Specifically, the system includes, for example, a CPU (Central Processing Unit) for enforcing instructions of a control program for executing the respective functions; a ROM (Read Only Memory) for storing the program; a RAM (Random Access Memory) for developing the program; and a storage device (storage medium) such as a memory for storing the program and the various data. Further, the objective of the present invention may also be achieved by reading out and executing by the computer (or, by CPU, MPU) the program code (execute form program, intermediate code program, source program) of the control program of the system for executing the respective functions, which is stored in a program medium readable by a computer, which medium is provided to the system.

Examples of the program medium include one fixedly holds the program code, which can be (a) a tape system such as a magnetic tape, a cassette tape or the like, (b) a disk system which includes a magnetic disk such as a floppy® disk, a hard disk or the like and an optical disk such as a CD-ROM, an MO, an MD, a DVD or the like, (c) a card system such as an IC card (inclusive of a memory card), an optical card or the like, and (d) a semiconductor memory such as a mask ROM, an EPROM, an EEPROM, a flash ROM.

Further, the system may be constituted to be connectable to a communication network, so as to allow provision of the program code via a communication network. The communication network is not particularly limited, and it may be: the Internet, Intranet, Extranet, LAN, ISDN, VAN, CATV communication network, virtual private network, telecommunication network, mobile body communication network, satellite communication network etc. Further, a transmission medium for constituting the communication network is not particularly limited, and it may be wired based, such as IEEE1394, USB, power-line carrier, cable TV line, telephone line, ADSL line, or radio based, such as infrared medium such as IrDA, remote control, Bluetooth®, 802.11 radio, HDR, mobile phone network, satellite communication line, ground wave digital network. Note that, the present invention may be realized in the form of a carrier wave, or a data signal line that realizes the program code by electronic transmission.

The present embodiment is applicable to a validation method for design data or mask data used in a microfabrication process for forming circuit patterns of a LSI (large-scale integrated circuit), liquid crystal device, a MEMS (a lithography process, and etching process etc. for exposing a resist, developing the exposed resist, and etching a circuit material using the developed resist as a mask). Based on this method, the present embodiment also provides a correction method for design data or mask data, a yield estimation method for semiconductor integrated circuit, and a method of improving design rule. Further, the present embodiment is applicable to a validation system and a correction system for design data or mask data using the same. The present embodiment is still further applicable to a mask production method and a semiconductor integrated circuit production method using the correction method for design data or mask data.

The embodiments and concrete examples of implementation discussed in the foregoing detailed explanation serve solely to illustrate the technical details, which should not be narrowly interpreted within the limits of such embodiments and concrete examples, but rather may be applied in many variations within the spirit of the present embodiment, provided such variations do not exceed the scope of the patent claims set forth below.

What claimed is:

1. A correction method for design data or mask data, said method correcting design (layout) data or lithography mask data so that a resulting lithography mask forms a desired size of circuit pattern through a microfabrication process, the method comprising the steps of:
   (i) carrying out proximity effect correction at least including etching proximity effect correction with respect to design data or mask data;
   (ii) a first measurement step for exposing a resist using an evaluation mask including plural patterns varied in parameter value, a part of which is a critical pattern which becomes critical on process proximity effect correction, developing the resist exposed, and measuring a pattern size of the resist developed;
   (iii) a second measurement step for etching a circuit material using the resist having been developed, and measuring a pattern size of the circuit material after the etching;
   (iv) determining parameter numerical condition for preventing the design data or the mask data from being critical on process proximity effect correction, based on the pattern size of the resist and the circuit material measured in the first and second measurement steps;
   (v) extracting a pattern with a parameter not satisfying the foregoing numerical condition from the design data or the mask data as a critical pattern which becomes critical on process proximity effect correction; and
   (vi) correcting the design data or the mask data so that the critical pattern extracted have a parameter satisfying the foregoing numerical condition.

2. The correction method for design data or mask data as set forth in claim 1, wherein the evaluation mask includes, as the critical pattern, at least one of:
   (i) a H-type crosslinking pattern at least constituted of a first rectangular section, and two first polygon sections between which the first rectangular section is caught, the two first polygon sections respectively being in contact with two short-length sides of the first rectangular section, two ends of the respective sides of the first polygon section in contact with the short-length sides of the first rectangular section each extending outward the short-length sides of the first rectangular section;
   (ii) a crank-type rectangular pattern at least constituted of a second rectangular section and two second polygon sections between which the second rectangular section is caught, one side of the two second polygon sections being in contact with respective two short-length sides of the second rectangular section, one end of respective sides of the second polygon sections in contact with the short-length sides of the second rectangular section each extending outward the short-length sides of the second rectangular section, to be opposite to each other with respect to the second rectangular section;
   (iii) a projection pattern at least constituted of a rectangular projection section and a polygon main body in contact with one of short-length sides of the projection section, two ends of side of the polygon main body in contact with the short-length side of the projection section each extending outward the short-length side of the projection section;
   (iv) a ring pattern having a rectangular opening; and
   (v) a pectinate pattern constituted of a pair of opposed pectinate sections in which two comb-teeth of one of the pectinate sections therebetween have a comb-tooth of the other pectinate section.

3. The correction method for design data or mask data as set forth in claim 2, wherein the evaluation mask includes at least one kind of a pattern selected from a group consisting of:
   (1) a plurality of H-shape crosslinking patterns; (2) a plurality of crank-type crosslinking patterns; (3) a plurality of projection pattern; and (4) a plurality of ring patterns,
   in each of the H-shape crosslinking patterns, at least one of values of $L1, w1, l1$, and $w1$ is varied within a range including a boundary value so that at least one of boundary values of $L1, w1, l1$, and $w1$ can be found as the numerical parameter condition, where $L1$ expresses a size of the first polygon section along a longitudinal direction of the first rectangular section, $w1$ expresses a size of the first polygon section along a width of the first rectangular section, $l1$ expresses a length of the first rectangular section, and $w1$ expresses a width of the first rectangular section,
   in each of the crank-type crosslinking patterns, at least one of values of $L2, W2, l2$, and $w2$ is varied in a range including a boundary value so that at least one of boundary values of $L2, W2, l2$, and $w2$ can be found as the numerical parameter condition, where $L2$ expresses a size of the second polygon section along a longitudinal direction of the second rectangular section, $W2$ expresses a size of the second polygon section along a width of the second rectangular section, $l2$ expresses a length of the second rectangular section, and $w2$ expresses a width of the second rectangular section,
   in each of the projection patterns, at least one of values of $L3, W3, l3$, and $w3$ is varied in a range including a boundary value so that at least one of boundary values of $L3, W3, l3$, and $w3$ can be found as the numerical parameter condition, where $L3$ expresses a size of a main body of the projection section along the longitudinal direction, $W3$ expresses a size of the main body along a width of the projection section, $l3$ expresses a length of the projection section, and $w3$ expresses a width of the projection section, and
   in each of the ring patterns, each of a width of a portion extending along a first direction of the ring portion and a width of a portion extending along a second direction of the ring portion orthogonal to the first direction is constant, and at least one of values of $L4, W4, l4$, and $w4$ is varied in a range including a boundary value so that at least one of boundary values of $L4, W4, l4$, and $w4$ can be found as the numerical parameter condition, where a long width $l4$ expresses the longer one of the width of the portion extending along the first direction of the ring portion and the width of the portion extending along the second direction of the ring portion orthogonal to the first direction, a short width $w4$ expresses the shorter one of the width of the portion extending along the first direction of the ring portion and the width of the portion extending along the second direction of the ring portion orthogonal to the first direction, $L4$ expresses a size of the opening along the long width, and $W4$ expresses a size of the opening along the short width.

4. The correction method for design data or mask data as set forth in claim 2, wherein the numerical parameter condition includes at least one of: numerical line-width condition such that "a line-width is not less than a lower limit of the line-width" and numerical space condition such that "a space is not less than a lower limit of the space", and the plurality of patterns of the evaluation mask includes at least one of a pattern group constituted of patterns of varied line-widths in a numerical range including the lower limit of the line-width and a pattern group constituted of patterns of varied spaces in a numerical range including the lower limit of the space.

5. The correction method for design data or mask data as set forth in claim 1 wherein, at or after the step (1), the design data or the mask data having been through the process proximity effect correction are corrected so as to satisfy at least one of: numerical line-width condition such that "a line-width is not less than a lower limit of the line-width" and numerical space condition such that "a space is not less than a lower limit of the space".

6. The correction method for design data or mask data as set forth in claim 1 wherein, before the step (1), the design data or the mask data having been through the process proximity effect correction are corrected so as to satisfy at least one of: numerical line-width condition such that "a line-width is not less than a lower limit of the line-width" and numerical space condition such that "a space is not less than a lower limit of the space".

7. A lithography mask production method comprising the steps of:
   correcting design data and lithography mask data according to steps (i), (ii), (iii), (iv), (v) and (vi) as set forth in claim 1; and
   creating a lithography mask according to the design data or the mask data having been corrected.

8. A semiconductor integrated circuit production method comprising the steps of:
   correcting design data or lithography mask data by performing the steps (i), (ii), (iii), (iv), (v) and (vi) as set forth in claim 1;
   creating a lithography mask according to the design data or the mask data having been corrected;
   forming a circuit material layer for constructing a circuit;
   forming a resist on the circuit material layer;
   exposing the resist using the lithography mask;
   developing the resist exposed; and
   etching the circuit material layer using a mask resulted from development of the resist.

9. A validation method for design data or mask data for carrying out validation as to whether the design data or the mask data includes a critical pattern, which becomes critical on process proximity effect correction, in a microfabrication process for carrying out process proximity effect correction at least including etching proximity effect correction with respect to design (layout) data or data of a lithography mask, said validation being performed before and after the process proximity effect correction,
   the method comprising the steps of:
   (i) a first measurement step for exposing a resist using an evaluation mask including plural patterns varied in parameter value, a part of which is a critical pattern which becomes critical when the design data or the mask data is subjected to process proximity effect correction, developing the resist exposed, and measuring a pattern size of the resist developed;
   (ii) a second measurement step for etching a circuit material using the resist having been developed, and measuring a pattern size of the circuit material after the etching;
   (iii) determining parameter numerical condition for preventing the pattern data from being critical when the design data or the mask data is subjected to process proximity effect correction, based on the pattern size of the resist and the circuit material measured in the first and second measurement steps; and
   (iv) extracting a pattern with a parameter not satisfying the foregoing numerical condition from the design data or the mask data as a critical pattern which becomes critical on process proximity effect correction.

10. A method of estimating a yield of a semiconductor integrated circuit in a manufacturing method for a semiconductor integrated circuit by a microfabrication process including a proximity effect correction step for carrying out process proximity effect correction with respect to design (layout) data or lithography mask data,
    the method comprising the steps of:
    extracting a critical pattern using the steps (i), (ii), (iii) and (iv) as set forth in claim 9; and
    estimating a yield of a semiconductor integrated circuit based on at least one of: (a) whether or not a critical pattern is extracted, (b) density of the extracted critical pattern, (c) a degree of error of a parameter of the extracted critical pattern with respect to a boundary value of the foregoing parameter numerical condition.

11. The method of estimating a yield of a semiconductor integrated circuit as set forth in claim 10, further comprising the steps of:
    extracting a circuit critical path by circuit simulation including timing validation from design data of the semiconductor integrated circuit; and
    estimating a yield of the semiconductor integrated circuit based on at least one of: (a) whether or not a critical pattern is extracted, (b) density of the extracted critical pattern, (c) a degree of error of a parameter of the extracted critical pattern with respect to a boundary value of the foregoing parameter numerical condition, for a mask pattern corresponding to an arbitrary mask pattern including a part or an entire of a critical path having been extracted.

12. A method of improving a design rule in a microfabrication process which includes the steps of laying out a pattern of a semiconductor integrated circuit according to a design rule; and carrying out process proximity effect correction with respect to design data or mask data of a semiconductor integrated circuit having been designed,
    the method comprising the steps of:
    extracting a critical pattern using the steps (i), (ii), (iii) and (iv) as set forth in claim 9; and
    when a critical pattern is extracted, including a rule "satisfy the numerical parameter condition" into the design rule.

13. A system for correcting design data or mask data for correcting design (layout) data or lithography mask data so that a resulting lithography mask forms a desired size of circuit pattern through a microfabrication process, the system comprising:
    a proximity effect correction section for carrying out proximity effect correction with respect to the design data or the lithography mask data;
    an exposure device for exposing a resist using a evaluation mask and developing the resist exposed;
    a first measurement device for measuring a pattern size of the resist developed;
    a second measurement device for measuring a pattern size of a circuit material having been etched using the resist developed;
    a parameter numerical condition determining section for determining parameter numerical condition based on the pattern sizes of the resist and the circuit material measured by the first and second measurement devices so as to prevent the design data or the mask data from being critical on process proximity effect correction;

a critical pattern extraction section for extracting a pattern with a parameter not satisfying the foregoing numerical condition from the design data or the lithography mask data as a critical pattern which becomes critical on process proximity effect correction; and a critical pattern correction section for correcting the design data or the mask data so that the critical pattern extracted have a parameter satisfying the foregoing numerical condition, wherein the evaluation mask is created in advance according to an evaluation mask including plural patterns varied in parameter value, a part of which is a critical pattern which becomes critical on process proximity effect correction.

14. The correction system for design data or mask data as set forth in claim 13 further comprising a correction portion output section for adding, to the design data or the lithography mask data, information of a portion corrected by the critical pattern correction section and outputting resulting lithography mask pattern data to a display device.

15. A correction program stored in a computer readable medium for causing a computer to function as the mask pattern data correction system as set forth in claim 13 so that the computer serves as the respective sections of the mask pattern data correction system.

16. A computer-readable storage medium storing the correction program as set forth in claim 15.

17. A validation system for design data or mask data, for carrying out validation as to whether design (layout) data or lithography mask data includes a critical pattern which becomes critical on process proximity effect correction, in a microfabrication process including a proximity effect correction step for carrying out process proximity effect correction with respect to the design data or the lithography mask data at least including etching proximity effect correction, the validation being carried out before or after the proximity effect correction step, the system comprising:
a proximity effect correction section for carrying out proximity effect correction with respect to the design data or the lithography mask data;
an exposure device for exposing a resist using a evaluation mask and developing the resist exposed;
a first measurement device for measuring a pattern size of the resist developed;
a second measurement device for measuring a pattern size of a circuit material having been etched using the resist developed;
a parameter numerical condition determining section for determining parameter numerical condition based on the pattern sizes of the resist and the circuit material measured by the first and second measurement devices so as to prevent the design data or the mask data from being critical on process proximity effect correction; and a critical pattern extraction section for extracting a pattern with a parameter not satisfying the foregoing numerical condition from the design data or the lithography mask data as a critical pattern which becomes critical on process proximity effect correction, wherein the evaluation mask is created in advance according to evaluation mask pattern data including plural patterns varied in parameter value, a part of which is a critical pattern which becomes critical on process proximity effect correction.

18. A validation program stored in a computer readable medium for causing a computer to function as the mask pattern data validation system as set forth in claim 17 so that the computer serves as the respective sections of the mask pattern data validation system.

19. A computer-readable storage medium storing the correction program as set forth in claim 18.

20. A correction method for design data or mask data comprising the steps of:
(i) a first measurement step for carrying out an exposure experiment for exposing and developing a resist using an evaluation mask, and measuring a shape of the resist developed;
(ii) a second measurement step for etching a circuit material using the resist developed and measuring a pattern size of the circuit material after the etching;
(iii) a first estimation step for estimating a shape of the resist developed according to data of the evaluation mask by a calculation formula or by simulation;
(iv) a second estimation step for estimating a shape of the circuit material etched according to data of the evaluation mask by a calculation formula or by simulation;
(v) an fitting step for changing a parameter of the calculation formula or a parameter for the simulation based on comparison between the shapes of the resist and the circuit material measured by the first and second measurement steps and the shapes of the resist and the circuit material calculated in the first and second estimation steps so as to fit the calculation formula or the simulation to measurement results of the first and second measurement steps; and
(vi) a proximity effect correction step for carrying out another estimation of a shape of the resist and a shape of the circuit material according to the calculation formula or the simulation having been modified in the step (v) and carrying out process proximity effect correction of the design (layout) data or the mask data based on the shape of the resist and the shape of the circuit material estimated in said another estimation,
wherein the evaluation mask includes a pattern which is assumed to be critical on the process proximity effect correction based on the shape of the resist and the shape of the circuit material having been estimated in the steps (iii) and (iv).

* * * * *